(12) United States Patent
Ikenaga

(10) Patent No.: US 11,217,750 B2
(45) Date of Patent: Jan. 4, 2022

(54) METAL PLATE, METHOD OF MANUFACTURING METAL PLATE, AND METHOD OF MANUFACTURING MASK BY USING METAL PLATE

(71) Applicant: Dai Nippon Printing Co., Ltd., Tokyo (JP)

(72) Inventor: Chikao Ikenaga, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 16/790,031

(22) Filed: Feb. 13, 2020

(65) Prior Publication Data

US 2020/0185607 A1    Jun. 11, 2020

Related U.S. Application Data

(63) Continuation of application No. 15/309,468, filed as application No. PCT/JP2015/062782 on Apr. 28, 2015, now Pat. No. 10,600,963.

(30) Foreign Application Priority Data

May 13, 2014    (JP) ................................ 2014-099811

(51) Int. Cl.
    *B21B 1/40*        (2006.01)
    *B21B 3/02*        (2006.01)
    (Continued)

(52) U.S. Cl.
    CPC ............ *H01L 51/0011* (2013.01); *B21B 1/40* (2013.01); *B21B 3/02* (2013.01); *B21B 15/0007* (2013.01);
    (Continued)

(58) Field of Classification Search
    CPC ........ H01L 51/0011; H01L 51/50; C23F 1/02; C23F 1/04; H05B 33/10; C23C 14/04;
    (Continued)

(56) References Cited

U.S. PATENT DOCUMENTS 1,517,633 A    12/1924    Junkers
4,494,205 A    1/1985     Dairiki et al.
(Continued)

FOREIGN PATENT DOCUMENTS

CN    1255168        5/2000
CN    1295334 A      5/2001
(Continued)

OTHER PUBLICATIONS

Chinese Office Action (Application No. 201711267436.7) dated May 8, 2020 (with English translation).
(Continued)

*Primary Examiner* — Jacob J Cigna
(74) *Attorney, Agent, or Firm* — Burr & Brown, PLLC

(57) ABSTRACT

A method of inspecting an elongated metal plate is provided, including measuring longitudinal direction metal plate thicknesses, measuring width direction metal plate thicknesses, and selecting the metal plate that satisfies condition (1), (B/A)×100 (%) is 5% or less, A being an average value of the longitudinal direction metal plate thicknesses, and B being obtained by multiplying a standard deviation of the longitudinal direction metal plate thicknesses by 3, and that satisfies condition (2), (C/X)×100 (%) is 3% or less, C being a value obtained by multiplying a standard deviation of the width direction metal plate thicknesses by 3, and X being a central portion width direction metal plate thickness obtained when the width direction metal plate thicknesses are measured to calculate the standard deviation of the metal plate thicknesses in the width direction.

5 Claims, 30 Drawing Sheets

(51) Int. Cl.
  *H05B 33/10* (2006.01)
  *B21B 15/00* (2006.01)
  *H01L 51/00* (2006.01)
  *C23F 1/02* (2006.01)
  *H01L 51/50* (2006.01)
  *C23C 14/04* (2006.01)

(52) U.S. Cl.
  CPC ............ *C23C 14/04* (2013.01); *C23C 14/042* (2013.01); *C23F 1/02* (2013.01); *H01L 51/50* (2013.01); *H05B 33/10* (2013.01); *B21B 15/00* (2013.01); *B21B 2015/0014* (2013.01)

(58) Field of Classification Search
  CPC ..... C23C 14/042; B21B 15/0007; B21B 1/40; B21B 3/02; B21B 15/00; B21B 2015/0014; B21B 38/04; B21B 2205/02
  See application file for complete search history.

(56) References Cited

U.S. PATENT DOCUMENTS

| | | | |
|---|---|---|---|
| 4,528,246 | A | 7/1985 | Higashinakagawa et al. |
| 4,596,943 | A | 6/1986 | Akiyoshi et al. |
| 5,200,025 | A | 4/1993 | Toei et al. |
| 6,042,952 | A | 3/2000 | Aratani et al. |
| 6,316,869 | B1 | 11/2001 | Kim et al. |
| 6,423,160 | B1 | 7/2002 | Arimoto et al. |
| 6,559,583 | B1 | 5/2003 | Kanayama et al. |
| 6,875,542 | B2 | 4/2005 | Yotsuya |
| 7,648,729 | B2 | 1/2010 | Nakadate |
| 8,313,806 | B2 | 11/2012 | Matsuura |
| 8,545,631 | B2 | 10/2013 | Kim et al. |
| 2001/0047839 | A1 | 12/2001 | Hatano et al. |
| 2002/0117241 | A1 | 8/2002 | Etoh |
| 2003/0228417 | A1 | 12/2003 | Nishikawa et al. |
| 2004/0135498 | A1 | 7/2004 | Takanosu et al. |
| 2004/0142202 | A1 | 7/2004 | Kinoshita et al. |
| 2005/0034810 | A1 | 2/2005 | Yamazaki et al. |
| 2005/0170075 | A1 | 8/2005 | Chung |
| 2006/0103289 | A1 | 5/2006 | Kim et al. |
| 2007/0001577 | A1 | 1/2007 | Yoo et al. |
| 2007/0017895 | A1 | 1/2007 | Yotsuya et al. |
| 2007/0051439 | A1 | 3/2007 | Van Der Winden |
| 2007/0072337 | A1 | 3/2007 | Matsuzaki et al. |
| 2011/0131792 | A1 | 6/2011 | Kwak et al. |
| 2011/0220493 | A1 | 9/2011 | Aratake |
| 2012/0060756 | A1 | 3/2012 | Ookawara et al. |
| 2015/0037928 | A1 | 2/2015 | Hirobe et al. |
| 2016/0208392 | A1 | 7/2016 | Ikenaga et al. |
| 2016/0237546 | A1 | 8/2016 | Ikenaga et al. |
| 2016/0293472 | A1 | 10/2016 | Chang et al. |
| 2017/0141315 | A1 | 5/2017 | Ikenaga |
| 2018/0277799 | A1 | 9/2018 | Ikenaga et al. |
| 2021/0102268 | A1* | 4/2021 | Oka ........................ H01L 51/56 |

FOREIGN PATENT DOCUMENTS

| | | |
|---|---|---|
| CN | 1316016 A | 10/2001 |
| CN | 103205701 A | 7/2003 |
| CN | 1514675 A | 7/2004 |
| CN | 1526850 A | 9/2004 |
| CN | 1578547 A | 2/2005 |
| CN | 1621555 A | 6/2005 |
| CN | 1754968 A | 4/2006 |
| CN | 1776525 A | 5/2006 |
| CN | 1828410 A | 9/2006 |
| CN | 1901138 A | 1/2007 |
| CN | 1965420 A | 5/2007 |
| CN | 200989993 Y | 12/2007 |
| CN | 101210307 A | 7/2008 |
| CN | 102162082 A | 8/2011 |
| CN | 202576545 U | 12/2012 |
| CN | 202786401 U | 3/2013 |
| CN | 103031578 A | 4/2013 |
| EP | 0 055 587 A2 | 7/1982 |
| JP | S56-041331 A1 | 4/1981 |
| JP | H05-00975 5 A1 | 1/1993 |
| JP | H05-208206 A1 | 8/1993 |
| JP | H06-238384 A1 | 8/1994 |
| JP | H07-227620 A1 | 8/1995 |
| JP | H08-067914 A1 | 3/1996 |
| JP | H09-087741 A1 | 3/1997 |
| JP | H09-095740 A1 | 4/1997 |
| JP | H09-324285 A1 | 12/1997 |
| JP | H10-053858 A1 | 2/1998 |
| JP | H10-060525 A1 | 3/1998 |
| JP | H10-214562 A1 | 8/1998 |
| JP | H11-057812 A1 | 3/1999 |
| JP | H11-229040 A1 | 8/1999 |
| JP | 2000-256800 A1 | 9/2000 |
| JP | 2000-319728 A1 | 11/2000 |
| JP | 2000-345242 A1 | 12/2000 |
| JP | 2001-226718 A1 | 8/2001 |
| JP | 2001-234385 A1 | 8/2001 |
| JP | 2001-247939 A1 | 9/2001 |
| JP | 2001-325881 A1 | 11/2001 |
| JP | 2002-237254 A1 | 8/2002 |
| JP | 2003-100460 A1 | 4/2003 |
| JP | 2003-272838 A1 | 9/2003 |
| JP | 2003-272839 A1 | 9/2003 |
| JP | 2003-286527 A1 | 10/2003 |
| JP | 2004-039319 A1 | 2/2004 |
| JP | 2004-063375 A1 | 2/2004 |
| JP | 2004-185890 A1 | 7/2004 |
| JP | 2004-362908 A1 | 12/2004 |
| JP | 2005-105406 A1 | 4/2005 |
| JP | 2005-154879 A1 | 6/2005 |
| JP | 2005-183153 A1 | 7/2005 |
| JP | 2005-340138 A1 | 12/2005 |
| JP | 2006-247721 A1 | 9/2006 |
| JP | 2007-095324 A1 | 4/2007 |
| JP | 2008-041553 A1 | 2/2008 |
| JP | 2008-255449 A1 | 10/2008 |
| JP | 2009-019243 A1 | 1/2009 |
| JP | 2009-074160 A1 | 4/2009 |
| JP | 2009-120919 A1 | 6/2009 |
| JP | 2010-214447 A1 | 9/2010 |
| JP | 2010-216012 A1 | 9/2010 |
| JP | 2011-190509 A1 | 9/2011 |
| JP | 2012-111195 A1 | 6/2012 |
| JP | 2013-016491 A1 | 1/2013 |
| JP | 5382257 B1 | 1/2014 |
| JP | 5382259 B1 | 1/2014 |
| JP | 5455099 B1 | 3/2014 |
| JP | 2014-065928 A1 | 4/2014 |
| JP | 5459632 B1 | 4/2014 |
| JP | 5516816 B1 | 6/2014 |
| JP | 5626491 B1 | 11/2014 |
| JP | 5641462 B1 | 12/2014 |
| JP | 2015-017308 A1 | 1/2015 |
| KR | 1999-0014807 A | 2/1999 |
| KR | 10-2005-0100701 A | 10/2005 |
| KR | 10-2006-0021343 A | 3/2006 |
| KR | 10-0623419 B1 | 9/2006 |
| KR | 10-0796617 B1 | 1/2008 |
| KR | 10-2009-0021094 A | 2/2009 |
| KR | 10-2010-0105421 A | 9/2010 |
| TW | 201435111 A | 9/2014 |
| WO | 98/51833 | 11/1998 |
| WO | 2014/038510 A1 | 3/2014 |

OTHER PUBLICATIONS

U.S. Appl. No. 15/912,644, filed Mar. 6, 2018, Chikao Ikenaga.
U.S. Appl. No. 15/703,101, filed Sep. 13, 2017, Chikao Ikenaga.
U.S. Appl. No. 15/548,897, filed Aug. 4, 2017, Chikao Ikenaga.
U.S. Appl. No. 16/250,246, filed Jan. 17, 2019, Chikao Ikenaga.
International Search Report and Written Opinion (Application No. PCT/JP2015/062782) dated Aug. 4, 2015.
English translation of International Preliminary Report on Patentability (Chapter I) (Application No. PCT/JP2015/062782) dated Nov. 24, 2016.

(56) References Cited

OTHER PUBLICATIONS

Korean Office Action (Application No. 10-2016-7031159) dated Nov. 14, 2017 (with English translation).
"Method for Measuring Radius of Curvature of Arc," *Curriculum of Investigation into Dynamics of Traffic Accidents*, Oct. 31, 2002, pp. 378-379 (with English translation).
Hiromu Suzuki, "Shape Control Technology in the Rolling of Metal Strip," *Journal of the Japan Society of Mechanical Engineers*, Jun. 1984, vol. 87, Issue 787, pp. 13-18 (with English translation).
Japanese Office Action (Application No. 2016-021255) dated Apr. 22, 2016 (with English translation).
Japanese Office Action (Application No. 2016-021255) dated Aug. 19, 2016 (with English translation).
Japanese Office Action (Application No. 2013-190881) dated Nov. 1, 2013 (with English translation).
Japanese Office Action (Application No. 2013-215061) dated Dec. 10, 2013 (with English translation).
Chinese Office Action (Application No. 201480048190.2) dated Feb. 9, 2017 (with English translation).
Chinese Office Action (Application No. 201480056293.3) dated Dec. 21, 2016 (with English translation).
Chinese Office Action (Application No. 201480003438.3) dated Oct. 11, 2016 (with English translation).
Chinese Office Action (Application No. 201480003445.3) dated Oct. 8, 2016 (with English translation).
Korean Office Action (Application No. 10-2015-7009819) dated Oct. 17, 2016 (with English translation).
Korean Office Action (Application No. 10-2015-7009821) dated Oct. 17, 2016 (with English translation).
Korean Office Action (Application No. 10-2016-7006016) dated Nov. 25, 2016 (with English translation).
Korean Office Action (Application No. 10-2016-7009298) dated Oct. 17, 2016 (with English translation).
English translation of International Preliminary Report on Patentability (Application No. PCT/JP2014/050345) dated Jul. 23, 2015.
English translation of International Preliminary Report on Patentability (Application No. PCT/JP2014/050346) dated Jul. 23, 2015.
English translation of International Preliminary Report on Patentability (Application No. PCT/JP2014/074255) dated Mar. 24, 2016.
English translation of International Preliminary Report on Patentability (Application No. PCT/JP2014/075168) dated Apr. 28, 2016.
English translation of International Preliminary Report on Patentability (Application No. PCT/JP2016/053580) dated Aug. 24, 2017.
U.S. Office Action (U.S. Appl. No. 15/026,009) dated Mar. 31, 2017.
Taiwanese Office Action (Application No. 105104155) dated Apr. 20, 2018.
Extended European Search Report (Application No. 15792096.8) dated May 4, 2018.
"Selection of Optimum Process of Manufacturing a Nickel Foil by Electrolysis" (Beijing Colored Metal Research Paper), Dec. 31, 1993, pp. 23-26.
Chinese Office Action (Application No. 201680001423.2) dated May 2, 2018 (with English translation).
Chinese Office Action (Application No. 201580024875.8) dated May 24, 2018 (with English translation).
H. Tohma, "Actual Background Treatment," *Journal of Surface Analysis*, 2001, vol. 8, pp. 49-54.
Japanese Office Action (Application No. 2016-199397) dated Jun. 29, 2018 (with English translation).
Extended European Search Report (Application No. 16749177.8) dated Jul. 19, 2018.
Chinese Office Action (Application No. 201711267429.7) dated May 7, 2019 (with English translation).
Chinese Office Action (Application No. 201711428597.X) dated Jul. 3, 2019 (with English translation).
Philippe Marcus, et al. "XPS Study of the Passive Films Formed on Nitrogen-Implanted Austenitic Stainless Steels," *Applied Surface Science*, Elsevier, Amsterdam, NL, vol. 59, No. 1, Jan. 1, 1992, pp. 7-21.
Extended European Search Report (Application No. 19200746.6) dated Nov. 29, 2019.
Adams D W et al.: "High Resolution Solid State Sensor for Strip Edge Drop and Thickness Profile," *AISE Steel Technology*, vol. 75, No. 9, Sep. 1, 1998, pp. 33-36.
Adams D W: "Thickness, Coating Weight and Width Instrumentation," *Steel Times, Fuel & Metallurgical Journals Ltd.*, London, GB, vol. 220, No. 1, Jan. 1, 1992, pp. 10 and 12.
Extended European Search Report (Application No. 19196714.0) dated Dec. 13, 2019.
U.S. Office Action (U.S. Appl. No. 15/703,101) dated Dec. 12, 2019.
Korean Office Action (Application No. 10-2019-7029100) dated Dec. 7, 2020 (with English translation).
I-Chun Cheng, et al., "Stress Control for Overlay Registration in a-Si:H TFTs on Flexible Organic-Polymer-Foil Substrates," *Journal of the SID*, 13/7, 2005, pp. 563-568.
Chinese Office Action (Application No. 201710624050.0) dated Dec. 16, 2020 (with English translation).
Korean Office Action (Application No. 10-2017-7020095) dated Dec. 29, 2020 (with English translation).
Chinese Office Action (Application No. 201910715831.X) dated Jan. 11, 2021 (with English translation).
Step Capability Index (cpk, ppk) [online], Jul. 31, 2012 (retrieved on Feb. 18, 2021, Internet: <URL: https://blog.daum.net/pldworld/2> (with Google translation).
Korean Office Action (Application No. 10-2021-7001294) dated Feb. 18, 2021 (with English translation).
U.S. Office Action (U.S. Appl. No. 15/703,101) dated May 7, 2021.
Nakamura ("The Invar Problem" IEEE Transactions on Magnetics 12.4 (1976): 278-291.) (Year: 1976).
Ei Ma Long, et al., "Analysis and Examination on Factors Affecting Copper Foil Quality," "Colored Smelting," Feb. 28, 1994, pp. 34-38.
Chinese Office Action (Application No. 201911322407.5) dated Jun. 1, 2021 (with English translation).
Korean Notification of Reason for Revocation (Patent No. 2123317) dated Oct. 29, 2021.

* cited by examiner

| | AVERAGE PLATE THICKNESS (A) (μm) | PLATE THICKNESS VARIATION IN D1 (B) (μm) | B/A | JUDGMENT |
|---|---|---|---|---|
| 11th WINDING BODY | 20.0 | 0.2 | 1.0% | ○ |
| 12th WINDING BODY | 20.1 | 0.5 | 2.5% | ○ |
| 13th WINDING BODY | 19.9 | 0.6 | 3.0% | ○ |
| 14th WINDING BODY | 19.9 | 0.8 | 4.0% | ○ |
| 15th WINDING BODY | 20.0 | 1.0 | 5.0% | ○ |
| 16th WINDING BODY | 20.1 | 1.2 | 6.0% | × |
| 17th WINDING BODY | 19.9 | 1.3 | 6.5% | × |

FIG.24(a)

| | AVERAGE PLATE THICKNESS (A) (μm) | PLATE THICKNESS VARIATION IN D1 (B) (μm) | B/A | JUDGMENT |
|---|---|---|---|---|
| 21st WINDING BODY | 25.1 | 0.3 | 1.2% | ○ |
| 22nd WINDING BODY | 25.0 | 0.6 | 2.4% | ○ |
| 23rd WINDING BODY | 24.9 | 0.8 | 3.0% | ○ |
| 24th WINDING BODY | 24.9 | 1.0 | 4.0% | ○ |
| 25th WINDING BODY | 24.8 | 1.2 | 4.8% | ○ |
| 26th WINDING BODY | 24.9 | 1.4 | 5.6% | × |
| 27th WINDING BODY | 24.8 | 1.6 | 6.5% | × |

FIG.24(b)

| | AVERAGE PLATE THICKNESS (A) (μm) | PLATE THICKNESS VARIATION IN D1 (B) (μm) | B/A | JUDGMENT |
|---|---|---|---|---|
| 31st WINDING BODY | 39.9 | 0.5 | 1.3% | ○ |
| 32nd WINDING BODY | 39.9 | 0.8 | 2.0% | ○ |
| 33rd WINDING BODY | 39.9 | 1.3 | 3.3% | ○ |
| 34th WINDING BODY | 40.0 | 1.7 | 4.3% | ○ |
| 35th WINDING BODY | 40.1 | 2.0 | 5.0% | ○ |
| 36th WINDING BODY | 39.9 | 3.4 | 8.5% | × |
| 37th WINDING BODY | 40.0 | 3.9 | 9.8% | × |

FIG.24(c)

|  | HOLE DIMENSION VARIATION (μm) |
|---|---|
| 11th MASK | 1.5 |
| 12th MASK | 1.6 |
| 13th MASK | 1.4 |
| 14th MASK | 1.6 |
| 15th MASK | 1.7 |
| 16th MASK | 2.3 |
| 17th MASK | 3.1 |

FIG.25(a)

|  | HOLE DIMENSION VARIATION (μm) |
|---|---|
| 21st MASK | 1.5 |
| 22nd MASK | 1.6 |
| 23rd MASK | 1.6 |
| 24th MASK | 1.7 |
| 25th MASK | 1.8 |
| 26th MASK | 2.6 |
| 27th MASK | 3.2 |

FIG.25(b)

|  | HOLE DIMENSION VARIATION (μm) |
|---|---|
| 31st MASK | 1.6 |
| 32nd MASK | 1.5 |
| 33rd MASK | 1.5 |
| 34th MASK | 1.6 |
| 35th MASK | 1.9 |
| 36th MASK | 2.6 |
| 37th MASK | 3.9 |

FIG.25(c)

|  | AVERAGE PLATE THICKNESS (A) (μm) | (A-20)/ 20 | PLATE THICKNESS VARIATION IN D1 (B) (μm) | B/A |
|---|---|---|---|---|
| 41st WINDING BODY | 19.3 | -3.6 % | 0.9 | 4.9 % |
| 42nd WINDING BODY | 19.5 | -2.6 % | 1.0 | 5.0 % |
| 43rd WINDING BODY | 19.8 | -1.0 % | 1.0 | 4.8 % |
| 44th WINDING BODY | 20.0 | 0.0 % | 1.0 | 4.9 % |
| 45th WINDING BODY | 20.3 | 1.5 % | 1.0 | 5.0 % |
| 46th WINDING BODY | 20.6 | 2.9 % | 1.0 | 4.9 % |
| 47th WINDING BODY | 20.9 | 4.3 % | 1.0 | 4.9 % |

FIG.26(a)

|  | AVERAGE PLATE THICKNESS (A) (μm) | (A-25)/ 25 | PLATE THICKNESS VARIATION IN D1 (B) (μm) | B/A |
|---|---|---|---|---|
| 51st WINDING BODY | 23.9 | -4.6 % | 1.2 | 4.9 % |
| 52nd WINDING BODY | 24.3 | -2.9 % | 1.2 | 5.0 % |
| 53rd WINDING BODY | 24.7 | -1.2 % | 1.2 | 4.8 % |
| 54th WINDING BODY | 25.1 | 0.4 % | 1.2 | 4.9 % |
| 55th WINDING BODY | 25.7 | 2.7 % | 1.3 | 5.0 % |
| 56th WINDING BODY | 25.9 | 3.5 % | 1.3 | 5.0 % |
| 57th WINDING BODY | 26.1 | 4.2 % | 1.3 | 4.9 % |

FIG.26(b)

|  | AVERAGE PLATE THICKNESS (A) (μm) | (A-40)/ 40 | PLATE THICKNESS VARIATION IN D1 (B) (μm) | B/A |
|---|---|---|---|---|
| 61st WINDING BODY | 38.1 | -5.0 % | 1.9 | 4.9 % |
| 62nd WINDING BODY | 38.9 | -2.8 % | 1.9 | 4.9 % |
| 63rd WINDING BODY | 39.2 | -2.0 % | 2.0 | 5.0 % |
| 64th WINDING BODY | 39.9 | -0.3 % | 1.9 | 4.8 % |
| 65th WINDING BODY | 41.1 | 2.7 % | 2.0 | 4.9 % |
| 66th WINDING BODY | 41.5 | 3.6 % | 2.1 | 5.0 % |
| 67th WINDING BODY | 41.9 | 4.5 % | 2.1 | 5.0 % |

FIG.26(c)

|  | HOLE DIMENSION VARIATION (μm) | MAXIMUM DIMENSION OF TOP PORTION (μm) |
|---|---|---|
| 41st MASK | 1.6 | 2.2 |
| 42nd MASK | 1.7 | 1.4 |
| 43rd MASK | 1.6 | 0.6 |
| 44th MASK | 1.7 | 0 |
| 45th MASK | 1.8 | 0 |
| 46th MASK | 1.9 | 0 |
| 47th MASK | 2.6 | 0 |

FIG.27(a)

|  | HOLE DIMENSION VARIATION (μm) | MAXIMUM DIMENSION OF TOP PORTION (μm) |
|---|---|---|
| 51st MASK | 1.7 | 2.1 |
| 52nd MASK | 1.6 | 1.5 |
| 53rd MASK | 1.7 | 0.7 |
| 54th MASK | 1.6 | 0.1 |
| 55th MASK | 1.8 | 0 |
| 56th MASK | 2.6 | 0 |
| 57th MASK | 3.1 | 0 |

FIG.27(b)

|  | HOLE DIMENSION VARIATION (μm) | MAXIMUM DIMENSION OF TOP PORTION (μm) |
|---|---|---|
| 61st MASK | 1.7 | 2.1 |
| 62nd MASK | 1.7 | 1.4 |
| 63rd MASK | 1.6 | 0.8 |
| 64th MASK | 1.7 | 0.1 |
| 65th MASK | 1.9 | 0 |
| 66th MASK | 2.8 | 0 |
| 67th MASK | 3.2 | 0 |

FIG.27(c)

| | AVERAGE PLATE THICKNESS (A) (μm) | PLATE THICKNESS VARIATION IN D1 (B) (μm) | B/A | PLATE THICKNESS AT CENTRAL PORTION IN D2 (X) (μm) | PLATE THICKNESS VARIATION IN D2 (C) (μm) | C/X | JUDGMENT |
|---|---|---|---|---|---|---|---|
| 71st WINDING BODY | 20.6 | 1.0 | 4.9 % | 19.7 | 0.2 | 1.0 % | ○ |
| 72nd WINDING BODY | 20.5 | 1.0 | 5.0 % | 19.8 | 0.5 | 2.7 % | ○ |
| 73rd WINDING BODY | 20.6 | 1.0 | 4.8 % | 19.9 | 0.6 | 3.2 % | × |
| 74th WINDING BODY | 20.6 | 1.0 | 5.0 % | 20.5 | 0.2 | 1.1 % | ○ |
| 75th WINDING BODY | 20.6 | 1.0 | 4.9 % | 20.8 | 0.6 | 2.8 % | ○ |
| 76th WINDING BODY | 20.5 | 1.0 | 4.9 % | 20.3 | 0.7 | 3.3 % | × |
| 77th WINDING BODY | 20.5 | 1.0 | 4.9 % | 21.3 | 0.3 | 1.3 % | ○ |
| 78th WINDING BODY | 20.6 | 1.0 | 5.0 % | 21.3 | 0.6 | 2.9 % | ○ |
| 79th WINDING BODY | 20.6 | 1.0 | 4.8 % | 21.5 | 1.5 | 3.2 % | × |

FIG.29(a)

| | AVERAGE PLATE THICKNESS (A) (μm) | PLATE THICKNESS VARIATION IN D1 (B) (μm) | B/A | PLATE THICKNESS AT CENTRAL PORTION IN D2 (X) (μm) | PLATE THICKNESS VARIATION IN D2 (C) (μm) | C/X | JUDGMENT |
|---|---|---|---|---|---|---|---|
| 81st WINDING BODY | 25.7 | 1.3 | 5.0% | 24.5 | 0.3 | 1.4% | ○ |
| 82nd WINDING BODY | 25.7 | 1.3 | 4.9% | 24.5 | 0.6 | 2.5% | ○ |
| 83rd WINDING BODY | 25.6 | 1.3 | 4.9% | 24.6 | 0.8 | 3.2% | × |
| 84th WINDING BODY | 25.6 | 1.3 | 5.0% | 25.5 | 0.4 | 1.5% | ○ |
| 85th WINDING BODY | 25.7 | 1.2 | 4.8% | 25.6 | 0.7 | 2.6% | ○ |
| 86th WINDING BODY | 25.6 | 1.2 | 4.8% | 25.7 | 0.8 | 3.3% | × |
| 87th WINDING BODY | 25.7 | 1.3 | 4.9% | 26.7 | 0.4 | 1.6% | ○ |
| 88th WINDING BODY | 25.6 | 1.3 | 4.9% | 26.5 | 0.8 | 2.9% | ○ |
| 89th WINDING BODY | 25.7 | 1.3 | 4.9% | 26.6 | 1.5 | 3.3% | × |

FIG.29(b)

| | AVERAGE PLATE THICKNESS (A) (μm) | PLATE THICKNESS VARIATION IN D1 (B) (μm) | B/A | PLATE THICKNESS AT CENTRAL PORTION IN D2 (X) (μm) | PLATE THICKNESS VARIATION IN D2 (C) (μm) | C/X | JUDGMENT |
|---|---|---|---|---|---|---|---|
| 91st WINDING BODY | 41.1 | 2.1 | 5.0 % | 42.9 | 0.8 | 1.8 % | ○ |
| 92nd WINDING BODY | 41.2 | 2.1 | 5.0 % | 42.8 | 1.2 | 2.7 % | ○ |
| 93rd WINDING BODY | 41.1 | 2.0 | 4.9 % | 42.6 | 1.4 | 3.3 % | × |
| 94th WINDING BODY | 41.1 | 2.0 | 4.9 % | 41.0 | 0.7 | 1.7 % | ○ |
| 95th WINDING BODY | 41.1 | 2.0 | 4.9 % | 41.1 | 1.2 | 2.9 % | ○ |
| 96th WINDING BODY | 41.2 | 2.0 | 4.9 % | 41.3 | 1.4 | 3.3 % | × |
| 97th WINDING BODY | 41.1 | 2.1 | 5.0 % | 42.8 | 0.7 | 1.6 % | ○ |
| 98th WINDING BODY | 41.2 | 2.0 | 4.9 % | 42.7 | 1.2 | 2.8 % | ○ |
| 99th WINDING BODY | 41.2 | 2.1 | 5.0 % | 42.3 | 1.5 | 3.1 % | × |

| | HOLE DIMENSION VARIATION (μm) |
|---|---|
| 71st MASK | 1.5 |
| 72nd MASK | 1.6 |
| 73rd MASK | 2.2 |
| 74th MASK | 1.4 |
| 75th MASK | 1.7 |
| 76th MASK | 2.3 |
| 77th MASK | 1.6 |
| 78th MASK | 1.8 |
| 79th MASK | 2.6 |

FIG.30(b)

| | HOLE DIMENSION VARIATION (μm) |
|---|---|
| 81st MASK | 1.7 |
| 82nd MASK | 1.8 |
| 83rd MASK | 2.1 |
| 84th MASK | 1.6 |
| 85th MASK | 1.7 |
| 86th MASK | 2.3 |
| 87th MASK | 1.7 |
| 88th MASK | 1.8 |
| 89th MASK | 2.5 |

FIG.30(c)

| | HOLE DIMENSION VARIATION (μm) |
|---|---|
| 91st MASK | 1.7 |
| 92nd MASK | 1.6 |
| 93rd MASK | 2.2 |
| 94th MASK | 1.8 |
| 95th MASK | 1.7 |
| 96th MASK | 2.3 |
| 97th MASK | 1.8 |
| 98th MASK | 1.8 |
| 99th MASK | 2.6 |

|  | AVERAGE PLATE THICKNESS (A) (μm) | PLATE THICKNESS VARIATION IN D1 (B) (μm) | B/A | JUDGMENT |
|---|---|---|---|---|
| 101st WINDING BODY | 13.1 | 0.3 | 2.3 % | ○ |
| 102nd WINDING BODY | 13.0 | 0.4 | 3.1 % | ○ |
| 103rd WINDING BODY | 13.1 | 0.5 | 3.8 % | ○ |
| 104th WINDING BODY | 12.9 | 0.6 | 4.7 % | ○ |
| 105th WINDING BODY | 13.0 | 0.6 | 4.6 % | ○ |
| 106th WINDING BODY | 13.0 | 0.7 | 5.4 % | × |
| 107th WINDING BODY | 13.0 | 0.9 | 6.9 % | × |

FIG.31(a)

|  | AVERAGE PLATE THICKNESS (A) (μm) | PLATE THICKNESS VARIATION IN D1 (B) (μm) | B/A | JUDGMENT |
|---|---|---|---|---|
| 111th WINDING BODY | 20.1 | 0.5 | 2.5 % | ○ |
| 112th WINDING BODY | 20.0 | 0.6 | 3.0 % | ○ |
| 113th WINDING BODY | 19.9 | 0.7 | 3.5 % | ○ |
| 114th WINDING BODY | 20.1 | 0.9 | 4.5 % | ○ |
| 115th WINDING BODY | 20.1 | 1.0 | 5.0 % | ○ |
| 116th WINDING BODY | 20.1 | 1.1 | 5.5 % | × |
| 117th WINDING BODY | 20.0 | 1.3 | 6.5 % | × |

FIG.31(b)

|  | AVERAGE PLATE THICKNESS (A) (μm) | PLATE THICKNESS VARIATION IN D1 (B) (μm) | B/A | JUDGMENT |
|---|---|---|---|---|
| 121st WINDING BODY | 25.2 | 0.7 | 2.8 % | ○ |
| 122nd WINDING BODY | 25.0 | 0.8 | 3.2 % | ○ |
| 123rd WINDING BODY | 25.1 | 0.8 | 3.2 % | ○ |
| 124th WINDING BODY | 24.8 | 1.0 | 4.0 % | ○ |
| 125th WINDING BODY | 24.9 | 1.2 | 4.8 % | ○ |
| 126th WINDING BODY | 25.0 | 1.3 | 5.2 % | × |
| 127th WINDING BODY | 24.8 | 1.5 | 6.0 % | × |

|  | HOLE DIMENSION VARIATION (μm) |
|---|---|
| 101st MASK | 1.0 |
| 102nd MASK | 1.1 |
| 103rd MASK | 1.3 |
| 104th MASK | 1.2 |
| 105th MASK | 1.5 |
| 106th MASK | 1.9 |
| 107th MASK | 2.2 |

FIG.32(b)

|  | HOLE DIMENSION VARIATION (μm) |
|---|---|
| 111th MASK | 1.5 |
| 112th MASK | 1.4 |
| 113th MASK | 1.4 |
| 114th MASK | 1.6 |
| 115th MASK | 1.8 |
| 116th MASK | 2.1 |
| 117th MASK | 2.8 |

FIG.32(c)

|  | HOLE DIMENSION VARIATION (μm) |
|---|---|
| 121st MASK | 1.7 |
| 122nd MASK | 1.6 |
| 123rd MASK | 1.7 |
| 124th MASK | 1.7 |
| 125th MASK | 1.8 |
| 126th MASK | 2.4 |
| 127th MASK | 3.1 |

|  | AVERAGE PLATE THICKNESS (A) (μm) | (A-13)/13 | PLATE THICKNESS VARIATION IN D1 (B) (μm) | B/A |
|---|---|---|---|---|
| 131st WINDING BODY | 12.2 | -6.2 % | 0.6 | 4.9 % |
| 132nd WINDING BODY | 12.6 | -3.1 % | 0.6 | 4.8 % |
| 133rd WINDING BODY | 12.7 | -2.3 % | 0.6 | 4.7 % |
| 134th WINDING BODY | 13.1 | 0.8 % | 0.5 | 3.8 % |
| 135th WINDING BODY | 13.3 | 2.3 % | 0.6 | 4.5 % |
| 136th WINDING BODY | 13.5 | 3.8 % | 0.5 | 3.7 % |
| 137th WINDING BODY | 13.8 | 6.2 % | 0.6 | 4.3 % |

FIG.33(a)

|  | AVERAGE PLATE THICKNESS (A) (μm) | (A-20)/20 | PLATE THICKNESS VARIATION IN D1 (B) (μm) | B/A |
|---|---|---|---|---|
| 141st WINDING BODY | 19.2 | -4.0 % | 0.9 | 4.7 % |
| 142nd WINDING BODY | 19.4 | -3.0 % | 0.9 | 4.6 % |
| 143rd WINDING BODY | 19.7 | -1.5 % | 0.9 | 4.6 % |
| 144th WINDING BODY | 20.0 | 0.0 % | 1.0 | 5.0 % |
| 145th WINDING BODY | 20.2 | 1.0 % | 1.0 | 5.0 % |
| 146th WINDING BODY | 20.5 | 2.5 % | 0.9 | 4.4 % |
| 147th WINDING BODY | 20.7 | 3.5 % | 1.0 | 4.8 % |

FIG.33(b)

|  | AVERAGE PLATE THICKNESS (A) (μm) | (A-25)/25 | PLATE THICKNESS VARIATION IN D1 (B) (μm) | B/A |
|---|---|---|---|---|
| 151st WINDING BODY | 23.8 | -4.8 % | 1.0 | 4.2 % |
| 152nd WINDING BODY | 24.2 | -3.2 % | 1.2 | 5.0 % |
| 153rd WINDING BODY | 24.6 | -1.6 % | 1.2 | 4.9 % |
| 154th WINDING BODY | 25.0 | 0.0 % | 1.1 | 4.4 % |
| 155th WINDING BODY | 25.3 | 1.2 % | 1.2 | 4.7 % |
| 156th WINDING BODY | 25.7 | 2.8 % | 1.2 | 4.7 % |
| 157th WINDING BODY | 26.0 | 4.0 % | 1.3 | 5.0 % |

FIG.33(c)

|  | HOLE DIMENSION VARIATION (μm) | MAXIMUM DIMENSION OF TOP PORTION (μm) |
|---|---|---|
| 131st MASK | 1.0 | 2.6 |
| 132nd MASK | 1.1 | 2.2 |
| 133rd MASK | 1.1 | 1.7 |
| 134th MASK | 1.1 | 0.8 |
| 135th MASK | 1.2 | 0.6 |
| 136th MASK | 1.6 | 0 |
| 137th MASK | 1.7 | 0 |

FIG.34(a)

|  | HOLE DIMENSION VARIATION (μm) | MAXIMUM DIMENSION OF TOP PORTION (μm) |
|---|---|---|
| 141st MASK | 1.5 | 2.2 |
| 142nd MASK | 1.6 | 1.3 |
| 143rd MASK | 1.6 | 0.4 |
| 144th MASK | 1.7 | 0 |
| 145th MASK | 1.8 | 0 |
| 146th MASK | 1.9 | 0 |
| 147th MASK | 2.3 | 0 |

FIG.34(b)

|  | HOLE DIMENSION VARIATION (μm) | MAXIMUM DIMENSION OF TOP PORTION (μm) |
|---|---|---|
| 151st MASK | 1.7 | 3.8 |
| 152nd MASK | 1.7 | 2.6 |
| 153rd MASK | 1.6 | 1.2 |
| 154th MASK | 1.7 | 0.6 |
| 155th MASK | 1.8 | 0 |
| 156th MASK | 1.9 | 0 |
| 157th MASK | 2.5 | 0 |

FIG.34(c)

| | AVERAGE PLATE THICKNESS (A) (μm) | PLATE THICKNESS VARIATION IN D1 (B) (μm) | B/A | PLATE THICKNESS AT CENTRAL PORTION IN D2 (X) (μm) | PLATE THICKNESS VARIATION IN D2 (C) (μm) | C/X | JUDGMENT |
|---|---|---|---|---|---|---|---|
| 161st WINDING BODY | 13.4 | 0.6 | 4.5% | 12.4 | 0.2 | 1.6% | ○ |
| 162nd WINDING BODY | 13.3 | 0.6 | 4.5% | 12.6 | 0.3 | 2.4% | ○ |
| 163rd WINDING BODY | 13.3 | 0.6 | 4.5% | 12.6 | 0.5 | 4.0% | × |
| 164th WINDING BODY | 13.3 | 0.5 | 3.8% | 13.3 | 0.3 | 2.3% | ○ |
| 165th WINDING BODY | 13.3 | 0.6 | 4.5% | 13.3 | 0.3 | 2.3% | ○ |
| 166th WINDING BODY | 13.4 | 0.6 | 4.5% | 13.4 | 0.5 | 3.7% | × |
| 167th WINDING BODY | 13.3 | 0.5 | 3.8% | 14.1 | 0.2 | 1.4% | ○ |
| 168th WINDING BODY | 13.4 | 0.6 | 4.5% | 14.1 | 0.4 | 2.8% | ○ |
| 169th WINDING BODY | 13.3 | 0.6 | 4.5% | 14.2 | 0.7 | 4.9% | × |

FIG.35(a)

| | AVERAGE PLATE THICKNESS (A) (μm) | PLATE THICKNESS VARIATION IN D1 (B) (μm) | B/A | PLATE THICKNESS AT CENTRAL PORTION IN D2 (X) (μm) | PLATE THICKNESS VARIATION IN D2 (C) (μm) | C/X | JUDGMENT |
|---|---|---|---|---|---|---|---|
| 171st WINDING BODY | 20.5 | 1.0 | 4.9% | 19.6 | 0.3 | 1.5% | ○ |
| 172nd WINDING BODY | 20.6 | 1.0 | 4.9% | 19.7 | 0.5 | 2.5% | ○ |
| 173rd WINDING BODY | 20.5 | 1.0 | 4.9% | 19.9 | 0.7 | 3.5% | × |
| 174th WINDING BODY | 20.4 | 1.0 | 4.9% | 20.4 | 0.3 | 1.5% | ○ |
| 175th WINDING BODY | 20.6 | 1.0 | 4.9% | 20.7 | 0.6 | 2.9% | ○ |
| 176th WINDING BODY | 20.5 | 1.0 | 4.9% | 20.2 | 0.8 | 4.0% | × |
| 177th WINDING BODY | 20.6 | 1.0 | 4.9% | 21.4 | 0.4 | 1.9% | ○ |
| 178th WINDING BODY | 20.6 | 1.0 | 4.9% | 21.5 | 0.6 | 2.8% | ○ |
| 179th WINDING BODY | 20.5 | 1.0 | 4.9% | 21.5 | 1.2 | 5.6% | × |

FIG.35(b)

| | AVERAGE PLATE THICKNESS (A) (μm) | PLATE THICKNESS VARIATION IN D1 (B) (μm) | B/A | PLATE THICKNESS AT CENTRAL PORTION IN D2 (X) (μm) | PLATE THICKNESS VARIATION IN D2 (C) (μm) | C/X | JUDGMENT |
|---|---|---|---|---|---|---|---|
| 181st WINDING BODY | 25.8 | 1.2 | 4.7% | 24.3 | 0.4 | 1.6% | ○ |
| 182nd WINDING BODY | 25.7 | 1.2 | 4.7% | 24.5 | 0.5 | 2.0% | ○ |
| 183rd WINDING BODY | 25.8 | 1.2 | 4.7% | 24.6 | 0.8 | 3.3% | × |
| 184th WINDING BODY | 25.7 | 1.2 | 4.7% | 25.6 | 0.3 | 1.2% | ○ |
| 185th WINDING BODY | 25.8 | 1.2 | 4.7% | 25.6 | 0.6 | 2.3% | ○ |
| 186th WINDING BODY | 25.9 | 1.2 | 4.6% | 25.7 | 0.8 | 3.1% | × |
| 187th WINDING BODY | 26.0 | 1.3 | 5.0% | 26.7 | 0.4 | 1.5% | ○ |
| 188th WINDING BODY | 25.6 | 1.2 | 4.7% | 26.7 | 0.7 | 2.6% | ○ |
| 189th WINDING BODY | 25.8 | 1.2 | 4.7% | 26.8 | 0.9 | 3.4% | × |

|  | HOLE DIMENSION VARIATION (μm) |
|---|---|
| 161st MASK | 0.9 |
| 162nd MASK | 1.2 |
| 163rd MASK | 1.6 |
| 164th MASK | 1.1 |
| 165th MASK | 1.3 |
| 166th MASK | 1.7 |
| 167th MASK | 0.8 |
| 168th MASK | 1.0 |
| 169th MASK | 1.9 |

FIG.36(b)

|  | HOLE DIMENSION VARIATION (μm) |
|---|---|
| 171st MASK | 1.4 |
| 172nd MASK | 1.7 |
| 173rd MASK | 2.2 |
| 174th MASK | 1.5 |
| 175th MASK | 1.6 |
| 176th MASK | 2.1 |
| 177th MASK | 1.6 |
| 178th MASK | 1.7 |
| 179th MASK | 2.6 |

FIG.36(c)

|  | HOLE DIMENSION VARIATION (μm) |
|---|---|
| 181st MASK | 1.6 |
| 182nd MASK | 1.8 |
| 183rd MASK | 2.3 |
| 184th MASK | 1.7 |
| 185th MASK | 1.9 |
| 186th MASK | 2.2 |
| 187th MASK | 1.7 |
| 188th MASK | 1.8 |
| 189th MASK | 2.6 |

METAL PLATE, METHOD OF MANUFACTURING METAL PLATE, AND METHOD OF MANUFACTURING MASK BY USING METAL PLATE

CROSS REFERENCE TO RELATED APPLICATIONS

This application is a continuation of U.S. application Ser. No. 15/309,468, filed Nov. 8, 2016, which in turn is the National Stage entry of International Application No. PCT/JP2015/062782, filed Apr. 28, 2015, which designated the United States, the entireties of which are incorporated herein by reference.

FIELD OF THE INVENTION

The present invention relates to a metal plate for use in manufacturing a deposition mask with a plurality of through-holes formed therein. In addition, the present invention relates to a method of manufacturing the metal plate. In addition, the present invention relates to a method of manufacturing a deposition mask with a plurality of through-holes formed therein, by using the metal plate.

BACKGROUND OF THE INVENTION

A display device used in a portable device such as a smart phone and a tablet PC is required to have high fineness, e.g., a pixel density of 300 ppi or more. In addition, there is increasing demand that the portable device is applicable in the full high-definitions standard. In this case, the pixel density of the display device needs to be 450 ppi or more, for example.

An organic EL display device draws attention because of its excellent responsibility and low power consumption. A known method of forming pixels of an organic EL display device is a method which uses a deposition mask including through-holes that are arranged in a desired pattern, and forms pixels in the desired pattern. To be specific, a deposition mask is firstly brought into tight contact with a substrate for organic EL display device, and then the substrate and the deposition mask in tight contact therewith are put into a deposition apparatus so as to deposit an organic material and so on. In general, a deposition mask can be manufactured by forming through-holes in a metal plate by means of an etching process using photolithographic technique (for example, Patent Document 1). For example, a resist film is firstly formed on the metal plate. Then, the resist film, with which an exposure mask is in tight contact, is exposed to form a resist pattern. Thereafter, through-holes are formed by etching areas of the metal plate, which are not covered with the resist pattern.

Patent Document 1: JP2004-039319A

SUMMARY OF THE INVENTION

When a layer of a deposition material is formed on a substrate with the use of a deposition mask, the deposition material adheres not only to the substrate but also to the deposition mask. For example, some of the deposition material moves toward the substrate along a direction largely inclined with respect to a normal direction of the deposition mask. Such a deposition material reaches a wall surface of a through-hole of the deposition mask and adheres thereto, before it reaches the substrate. In this case, the deposition material is not likely to adhere to an area of the substrate, which is located near the wall surface of the through-hole of the deposition mask, so that a thickness of the deposition material adhered to this area may be smaller than a thickness of another portion and/or there may be a portion to which no deposition material adheres. Namely, the deposition near the wall surface of the through-hole of the deposition mask may become unstable. Thus, when this deposition mask is used for forming pixels of an organic EL display device, dimensional precision of each pixel and positional precision thereof lower, which lowers luminous efficiency of the organic EL display device.

One of possible solutions to this problem is to reduce a thickness of a metal plate used for manufacturing a deposition mask. This is because, since the thickness of the metal plate is reduced, a height of a wall surface of a through-hole of a deposition mask can be reduced, whereby a rate of a deposition material, which adheres to the wall surface of the through-hole, can be lowered. In order to obtain a metal plate with a reduced thickness, it is necessary to increase a reduction ratio upon manufacture of the metal plate by rolling a base metal. However, the larger the reduction ratio is, the larger the non-uniformity degree of deformation caused by the rolling process becomes. For example, it is known that, if an elongation percentage of a metal plate differs depending on a position in a width direction (direction perpendicular to a transport direction of the base metal), the metal plate has a corrugation (corrugated shape). Thus, there are limitations in reducing the thickness of the metal plate. As a result, in order to reduce the height of the wall surface in the through-hole of the deposition mask, not only the method of reducing the thickness of the metal plate but also another method is required to be employed.

As described above, the through-holes in the deposition mask are formed by etching. Thus, the height of the wall surface of the through-hole in the deposition mask can be precisely controlled, by adjusting etching conditions such as an etching period of time, an etchant type and so on. Namely, the height of the wall surface of the through-hole in the deposition mask can be sufficiently reduced by dissolving the metal plate by etching in a thickness direction thereof, in addition to the reduction in thickness of the metal plate. When a metal plate is etched by injecting an etchant to the metal plate at a predetermined pressure, the injection pressure is one of the etching conditions.

On the other hand, a plate thickness of the metal plate is not uniform, and the plate thickness more or less varies. Thus, when a metal plate is etched under the same etching conditions, a shape of a through-hole to be formed varies depending on the plate thickness of the metal plate. When the shape of the through-hole varies depending on a position, a dimension of the deposition material adhering to the substrate also varies depending on a location.

The present invention has been made in view of the above problems. The object of the present invention is to provide a metal plate that can be used for manufacturing a deposition mask with through-holes formed therein with a high degree of dimensional precision. In addition, the object of the present invention is to provide a method of manufacturing the metal plate and a method of manufacturing the mask.

The present invention is a method of manufacturing an elongated metal plate used for manufacturing a deposition mask having a plurality of through-holes formed therein, the method comprising:

a rolling step in which a base metal is rolled so as to obtain the metal plate having an average value of plate thicknesses in a longitudinal direction is within a ±3% range around a predetermined value; and a cutting step in which one end and the other end of the metal plate in a width direction are cut off over a predetermined range;

wherein the following two conditions (1) and (2) are satisfied as to a variation in plate thickness of the metal plate:
(1) when an average value of the plate thicknesses of the metal plate in the longitudinal direction is represented as A, and a value obtained by multiplying a standard deviation of the plate thicknesses of the metal plate in the longitudinal direction by 3 is represented as B, (B/A)×100(%) is 5% or less; and
(2) when a value obtained by multiplying a standard deviation of the plate thicknesses of the metal plate in the width direction is represented as C, and a value of a plate thickness of the metal plate at a central portion in the width direction, which is obtained when plate thicknesses of the metal plate are measured along the width direction in order to calculate the standard deviation of the plate thicknesses of the metal plate in the width direction, is represented as X, (C/X)×100(%) is 3% or less.

The through-holes in the deposition mask manufactured of the metal plate may be formed by etching the elongated metal plate which is being transported.

The present invention is a method of manufacturing an elongated metal plate used for manufacturing a deposition mask having a plurality of through-holes formed therein, the method comprising:

a film manufacturing step in which the metal plate is obtained by a plating process, wherein an average value of plate thicknesses of the metal plate in a longitudinal direction is within a ±3% range around a predetermined value; and a cutting step in which one end and the other end of the metal plate in a width direction are cut off over a predetermined range;

wherein the following two conditions (1) and (2) are satisfied as to a variation in plate thickness of the metal plate:
(1) when an average value of the plate thicknesses of the metal plate in the longitudinal direction is represented as A, and a value obtained by multiplying a standard deviation of the plate thicknesses of the metal plate in the longitudinal direction by 3 is represented as B, (B/A)×100(%) is 5% or less; and
(2) when a value obtained by multiplying a standard deviation of the plate thicknesses of the metal plate in the width direction is represented as C, and a value of a plate thickness of the metal plate at a central portion in the width direction, which is obtained when plate thicknesses of the metal plate are measured along the width direction in order to calculate the standard deviation of the plate thicknesses of the metal plate in the width direction, is represented as X, (C/X)×100(%) is 3% or less.

The through-holes in the deposition mask manufactured of the metal plate may be formed by etching the elongated metal plate which is being transported.

In the method of manufacturing a metal plate according to the present invention, the plate thickness of the metal plate is preferably 80 μm or less.

In the method of manufacturing a metal plate according to the present invention, the standard deviation of the plate thicknesses in the width direction of the metal plate may be calculated based on the plate thicknesses of the metal plate, the plate thicknesses being measured at intersections between imaginary lines the number of which is m (m is a natural number of 2 or more), each extending on the metal plate in the longitudinal direction, and an imaginary line(s) the number of which is n (n is a natural number of 1 or more), each extending on the elongated metal plate in the width direction. In this case, m>n.

In the method of manufacturing a metal plate according to the present invention, the base metal may be made of an iron alloy containing nickel.

The present invention is an elongated metal plate used for manufacturing a deposition mask having a plurality of through-holes formed therein,
wherein:
an average value of plate thicknesses in a longitudinal direction of the metal plate is within a ±3% range around a predetermined value; and
the following two conditions (1) and (2) are satisfied as to a variation in plate thickness of the metal plate:
(1) when an average value of the plate thicknesses of the metal plate in the longitudinal direction is represented as A, and a value obtained by multiplying a standard deviation of the plate thicknesses of the metal plate in the longitudinal direction by 3 is represented as B, (B/A)×100(%) is 5% or less; and
(2) when a value obtained by multiplying a standard deviation of the plate thicknesses of the metal plate in the width direction is represented as C, and a value of the plate thickness of the metal plate in a central portion in the width direction, which is obtained when the plate thickness of the metal plate is measured along the width direction in order to calculate the standard deviation of the plate thicknesses of the metal plates in the width direction is represented as C, (C/X)×100(%) is 3% or less.

In the metal plate according to the present invention, the plate thickness of the metal plate is preferably 80 μm or less.

In the metal plate according to the present invention, the standard deviation of the plate thicknesses in the width direction of the metal plate may be calculated based on the plate thicknesses of the metal plate, the plate thicknesses being measured at intersections between imaginary lines the number of which is m (m is a natural number of 2 or more), each extending on the metal plate in the longitudinal direction, and an imaginary line(s) the number of which is n (n is a natural number of 1 or more), each extending on the elongated metal plate in the width direction. In this case, m>n.

In the metal plate according to the present invention, the base metal may be made of an iron alloy containing nickel.

The present invention is a method of manufacturing a deposition mask having a plurality of through-holes formed therein, the method comprising:

a step of preparing an elongated metal plate having an average value of plate thicknesses in a longitudinal direction is within a ±3% range around a predetermined value;

a resist-pattern forming step in which a resist pattern is formed on the metal plate; and an etching step in which an area of the metal plate, which is not covered with the resist pattern, is etched to form a recess which becomes a through-hole in the metal plate;

wherein the following two conditions (1) and (2) are satisfied as to a variation in plate thickness of the metal plate:
(1) when an average value of the plate thicknesses of the metal plate in the longitudinal direction is represented as A, and a value obtained by multiplying a standard deviation of the plate thicknesses of the metal plate in the longitudinal direction by 3 is represented as B, (B/A)×100(%) is 5% or less; and (2) when a value obtained by multiplying a standard deviation of the plate thicknesses of the metal plate in the width direction is represented as C, and a value of a plate thickness of the metal plate at a central portion in the width direction, which is obtained when plate thicknesses of the metal plate are measured along the width direction in order to calculate the standard deviation of the plate thicknesses of the metal plate in the width direction, is represented as X, (C/X)×100(%) is 3% or less.

In the method of manufacturing a deposition mask according to the present invention, the plate thickness of the metal plate is preferably 80 μm or less.

In the method of manufacturing a deposition mask according to the present invention, the standard deviation of the plate thicknesses in the width direction of the metal plate may be calculated based on the plate thicknesses of the metal plate, the plate thicknesses being measured at intersections between imaginary lines the number of which is m (m is a natural number of 2 or more), each extending on the metal plate in the longitudinal direction, and an imaginary line(s) the number of which is n (n is a natural number of 1 or more), each extending on the elongated metal plate in the width direction. In this case, m>n.

In the method of manufacturing a deposition mask according to the present invention, the base metal may be made of an iron alloy containing nickel.

In the method of manufacturing a deposition mask according to the present invention, the deposition mask may have a first surface and a second surface, the first surface facing a deposition material and the second surface facing a substrate when the deposition material is deposited onto the substrate using the deposition mask;

the resist pattern formed by the resist-pattern forming step may include a first resist pattern formed on a first surface of the metal plate, which corresponds to the first surface of the deposition mask, and a second resist pattern formed on a second surface of the metal plate, which corresponds to the second surface of the deposition mask;

the recess formed by the etching step may include a plurality of first recesses formed by etching an area of the first surface of the metal plate, which is not covered with the first resist pattern, and a plurality of second recesses formed by etching an area of the second surface of the metal plate, which is not covered with the second resist pattern; and the etching step may be performed such that the first recess and the second recess corresponding to the first recess are connected to each other.

In this case, a distance from the second surface of the deposition mask to a connection portion where the first recess and the second recess are connected, in a direction along a normal direction of the metal plate is preferably 6 μm or less.

In the method of manufacturing a deposition mask according to the present invention, the deposition mask may be divided into an effective area in which the plurality of through-holes is formed, and a peripheral area located around the effective area; and the etching step may be performed such that the first surface of the metal plate is etched over all the effective area.

In the method of manufacturing a deposition mask according to the present invention, the deposition mask may be divided into an effective area in which the plurality of through-holes is formed, and a peripheral area located around the effective area; and the etching step may be performed such that the first surface of the metal plate is not etched over all the effective area, so that a portion that is not etched remains as a top portion.

According to the present invention, it is possible to obtain a deposition mask in which a variation in dimension of through-holes dimension is restrained.

BRIEF DESCRIPTION OF THE DRAWINGS

FIGS. 24(a) to 24(c) are views showing calculation results of a variation in plate thickness in the longitudinal direction of elongated metal plates of $11^{th}$ to $17^{th}$ winding bodies, $21^{st}$ to $27^{th}$ winding bodies, and $31^{st}$ to $37^{th}$ winding bodies.

FIGS. 25(a) to 25(c) are views showing calculation results of a variation in dimension of through-holes in deposition masks manufactured from the elongated metal plates of the $11^{th}$ to $17^{th}$ winding bodies, the $21^{st}$ to the $27^{th}$ winding bodies, and the $31^{st}$ to the $37^{th}$ winding bodies.

FIGS. 26(a) to 26(c) are views showing calculation results of an average value of plate thicknesses and a variation in plate thickness in the longitudinal direction of elongated metal plates of $41^{st}$ to $47^{th}$ winding bodies, $51^{st}$ to $57^{th}$ winding bodies, and $61^{st}$ to $67^{th}$ winding bodies.

FIGS. 27(a) to 27(c) are views showing calculation results of a variation in dimension of through-holes and a maximum dimension of a top portion of deposition masks manufactured from the elongated metal plates of the $41^{st}$ to the $47^{th}$ winding bodies, the $51^{st}$ to the $57^{th}$ winding bodies, and the $61^{st}$ to the $67^{th}$ winding bodies.

FIGS. 29(a) to (c) are views showing calculation results of a variation in plate thickness in the width direction of elongated metal plates of $71^{st}$ to $77^{th}$ winding bodies, $81^{st}$ to $87^{th}$ winding bodies, and $91^{st}$ to $97^{th}$ winding bodies.

FIGS. 30(a) to 30(c) are views showing calculation results of a variation in dimension of through-holes in deposition masks manufactured from the elongated metal plates of the $71^{st}$ to the $77^{th}$ winding bodies, the $81^{st}$ to the $87^{th}$ winding bodies, and the $91^{st}$ to the $97^{th}$ winding bodies.

FIGS. 31(a) to 31(c) are views showing calculation results of a variation in plate thickness in the longitudinal direction of elongated metal plates of $101^{st}$ to $107^{th}$ winding bodies, $111^{th}$ to $117^{th}$ winding bodies and $121^{st}$ to $127^{th}$ winding bodies.

FIGS. 32(a) to 32(c) are views showing calculation results of a variation in dimension of through-holes in deposition masks manufactured from the elongated metal plates of the $101^{st}$ to the $107^{th}$ winding bodies, the $111^{th}$ to the $117^{th}$ winding bodies, and the $121^{st}$ to the $127^{th}$ winding bodies.

FIGS. 33(a) to 33(c) are views showing calculation results of an average value of plate thicknesses and a variation in plate thickness in the longitudinal direction of elongated metal plates of $131^{st}$ to $137^{th}$ winding bodies, $141^{st}$ to $147^{th}$ winding bodies, and $151^{st}$ to $157^{th}$ winding bodies.

FIGS. 34(a) to 34(c) are views showing calculation results of a variation in dimension of through-holes and a maximum dimension of a top portion of deposition masks manufactured from the elongated metal plates of the $131^{st}$ to the $137^{th}$ winding bodies, the $141^{st}$ to the $147^{th}$ winding bodies, and the $151^{st}$ to the $157^{th}$ winding bodies.

FIGS. 35(a) to 35(c) are views showing calculation results of a deviation in plate thickness in the width direction of elongated metal plates of $161^{st}$ to $167^{th}$ winding bodies, $171^{st}$ to $177^{th}$ winding bodies, and $181^{st}$ to $187^{th}$ winding bodies.

FIGS. 36(a) to 36(c) are views showing calculation results of a variation in dimension of through-holes in deposition masks manufactured from the elongated metal plates of the $161^{st}$ to the $167^{th}$ winding bodies, the $171^{st}$ to the $177^{th}$ winding bodies, and the $181^{st}$ to the $187^{th}$ winding bodies.

DETAILED DESCRIPTION OF THE INVENTION

Figure 1:
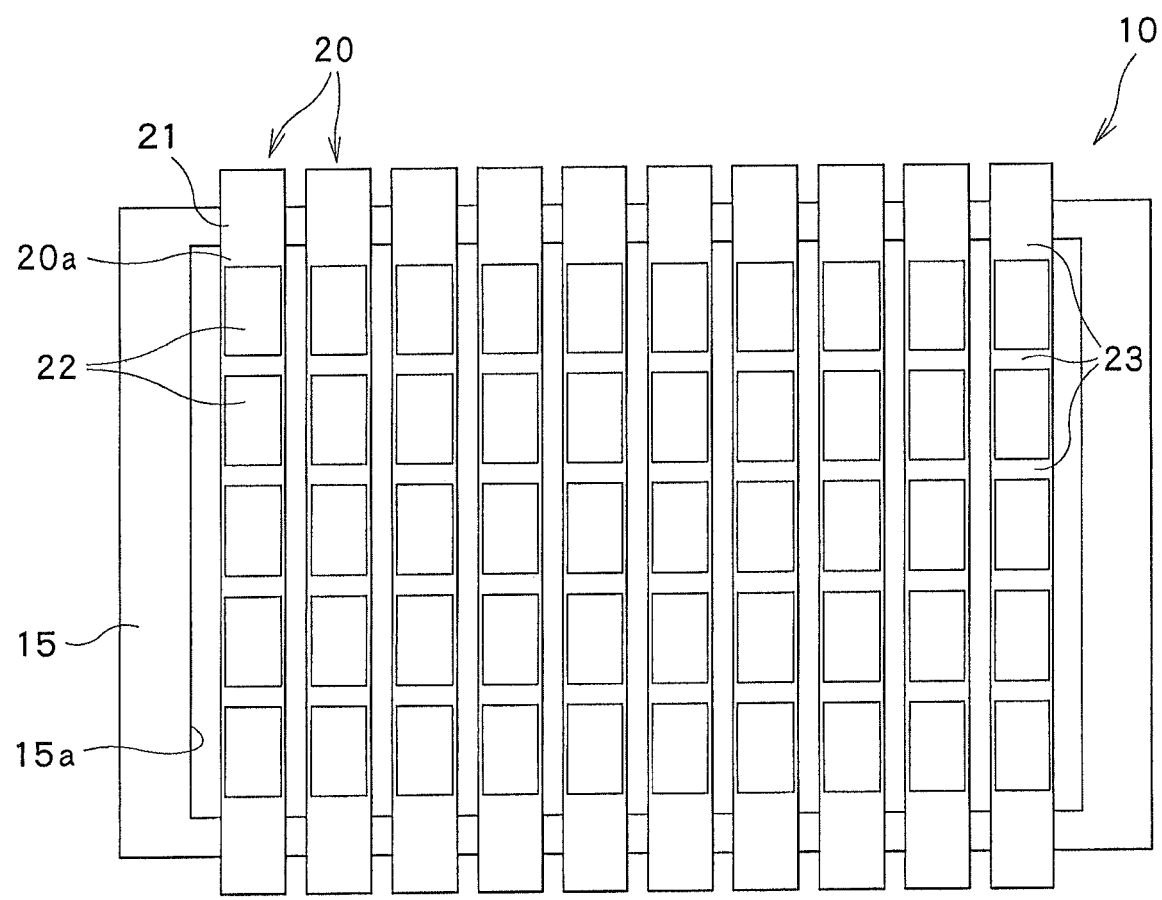
FIG. 1 is a view for explaining an embodiment of the present invention, which is a schematic plan view showing an example of a deposition mask apparatus including a deposition mask.

An embodiment of the present invention will be described herebelow with reference to the drawings. In the drawings attached to the specification, a scale dimension, an aspect ratio and so on are changed and exaggerated from the actual ones, for the convenience of easiness in illustration and understanding.

FIGS. 1 to 21 are views for explaining an embodiment of the present invention. In the below embodiment and its modification examples, a method of manufacturing a deposition mask, which is used for patterning an organic material in a desired pattern on a substrate when an organic EL display device is manufactured, is described by way of example. However, not limited to this application, the present invention can be applied to a method of manufacturing a deposition mask to be used in various applications.

In this specification, the terms "plate", "sheet" and "film" are not differentiated from one another based only on the difference of terms. For example, the "plate" is a concept including a member that can be referred to as sheet or film. Thus, for example, "metal plate" is not differentiated from a member that is referred to as "metal sheet" or "metal film" based only on the difference of terms.

In addition, the term "plate plane (sheet plane, film plane)" means a plane corresponding to a plane direction of a plate-like (sheet-like, film-like) member as a target, when the plate-like (sheet-like, film-like) member as a target is seen as a whole in general. A normal direction used to the plate-like (sheet-like, film-like) member means a normal direction with respect to a plate plane (sheet surface, film surface) of the member.

Further, in this specification, terms specifying shapes, geometric conditions and their degrees, e.g., "parallel", "perpendicular", "same", "similar" etc., are not limited to their strict definitions, but construed to include a range capable of exerting a similar function.

(Deposition Mask Apparatus)

Figure 2:
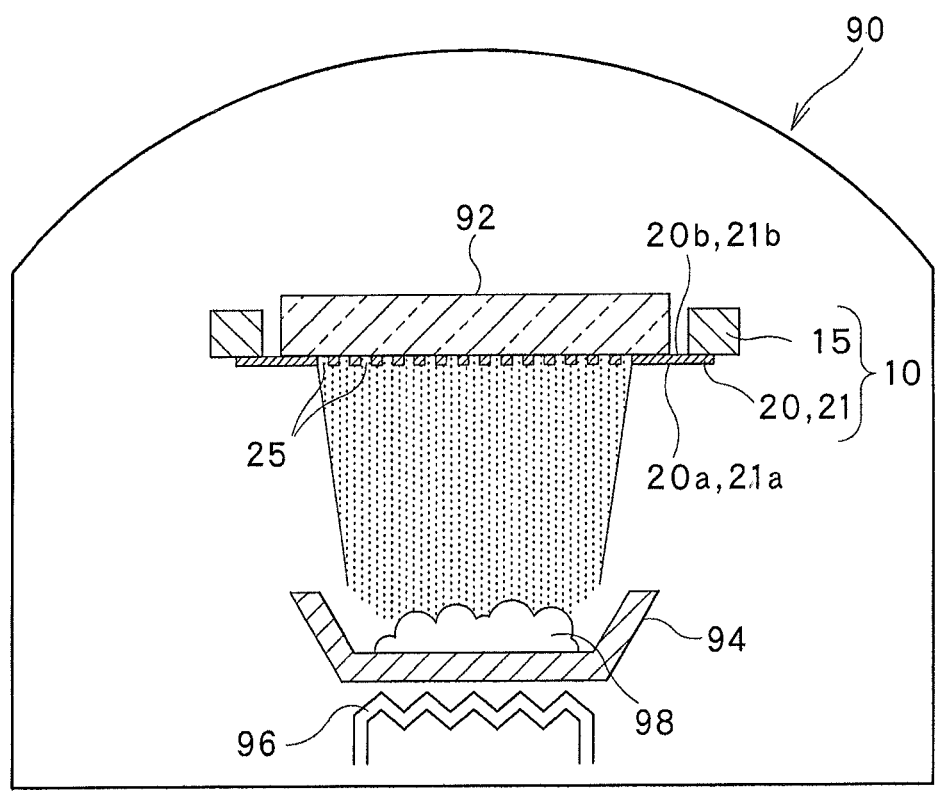
FIG. 2 is a view for explaining a deposition method by using the deposition mask apparatus shown in FIG. 1.
Figure 3:
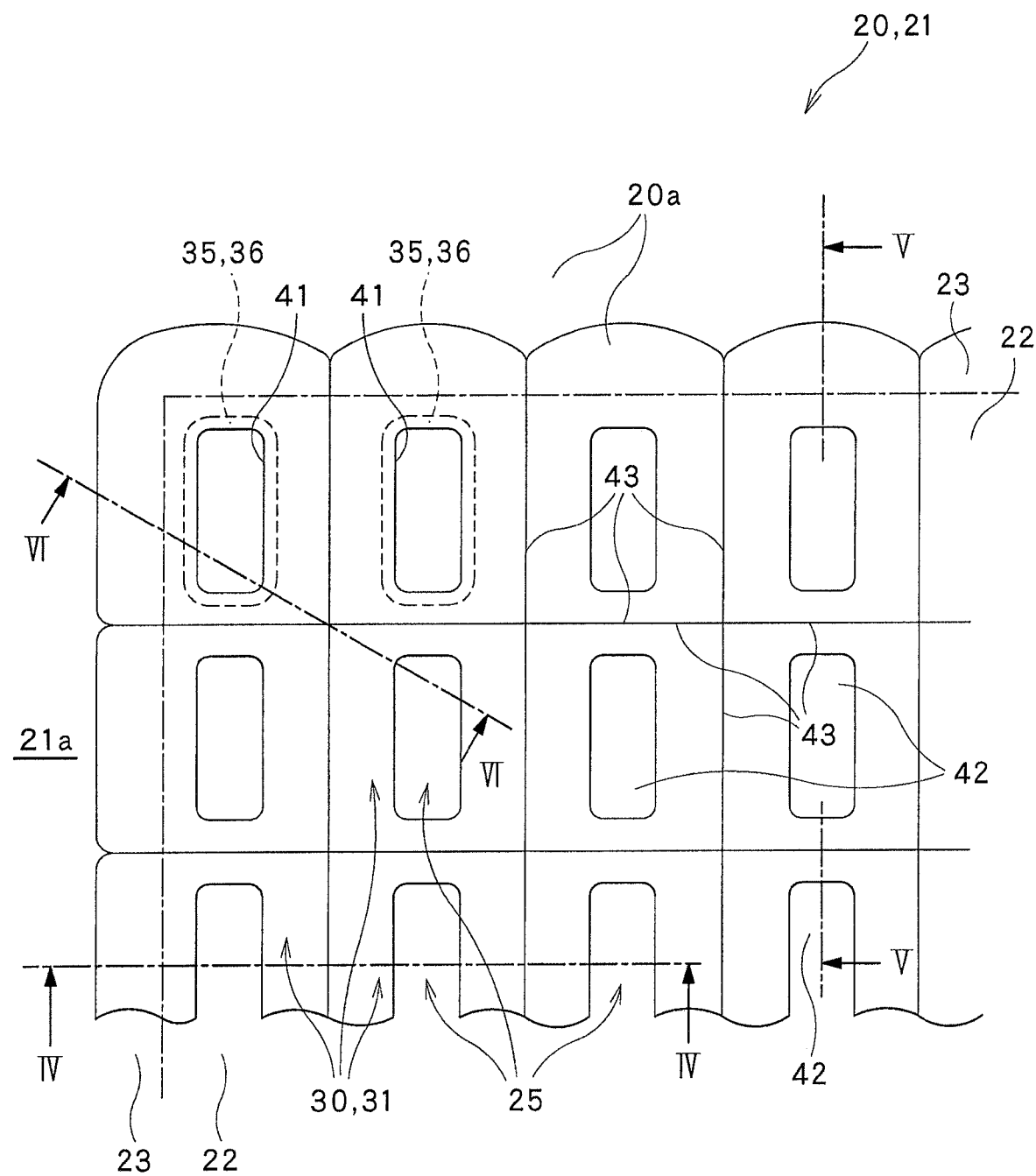
FIG. 3 is a partial plan view showing the deposition mask shown in FIG. 1.
Figure 4:
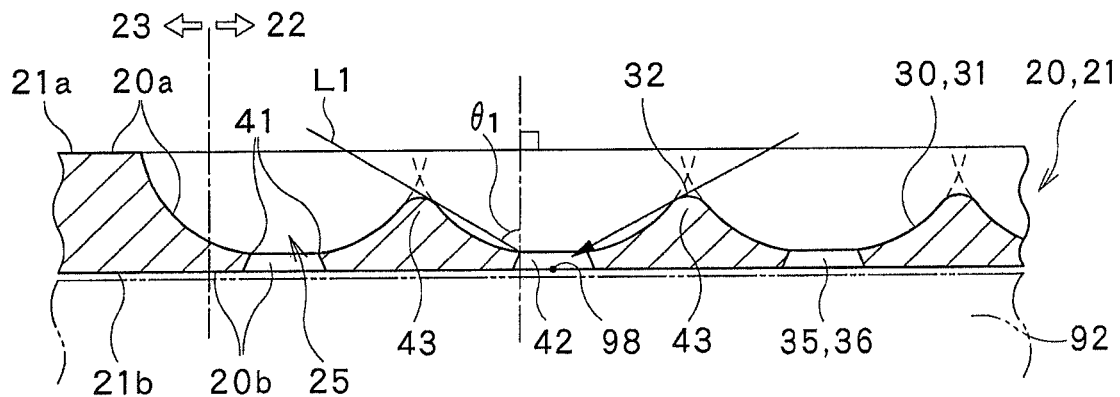
FIG. 4 is a sectional view along the IV-IV line of FIG. 3.
Figure 5:
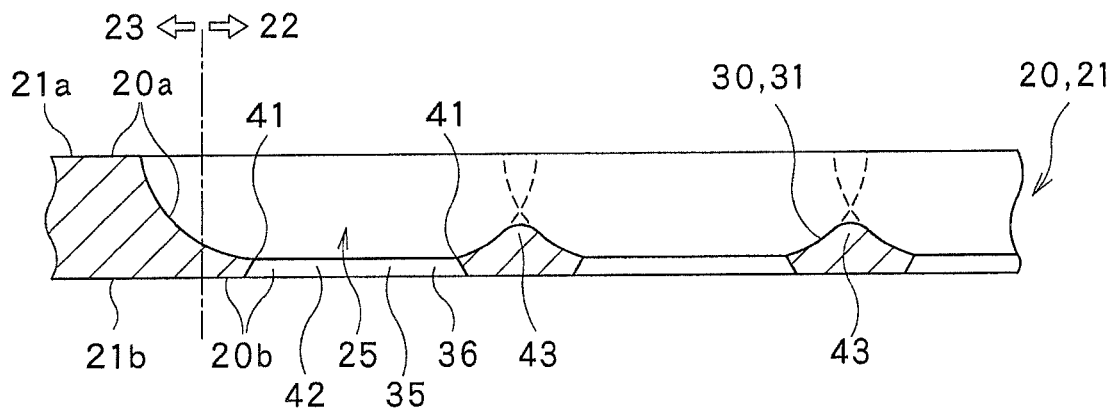
FIG. 5 is a sectional view along the V-V line of FIG. 3.
Figure 6:
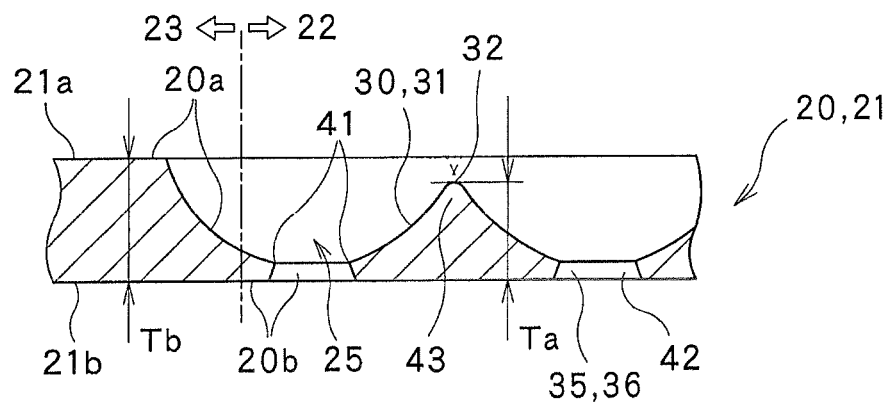
FIG. 6 is a sectional view showing VI-VI line of FIG. 3.

Firstly, an example of a deposition mask apparatus including deposition masks to be manufactured is described with reference mainly to FIGS. 1 to 6. FIG. 1 a plan view showing an example of the deposition mask apparatus including the deposition masks. FIG. 2 is a view for explaining a method of using the deposition mask apparatus shown in FIG. 1. FIG. 3 is a plan view showing the deposition mask seen from a first surface side. FIGS. 4 to 6 are sectional views seen from respective positions of FIG. 3.

The deposition mask apparatus 10 shown in FIGS. 1 and 2 includes a plurality of deposition masks 20 each of which is formed of a metal plate 21 of substantially a rectangular shape, and a frame 15 attached to peripheries of the deposition masks 20. Each deposition mask 20 has a number of through-holes 25 formed by etching the metal plate 21, which has a first surface 21a and a second surface 21b opposed to each other, at least from the first surface 21a. As shown in FIG. 2, the deposition mask apparatus 10 is used for depositing a deposition material to a substrate. The deposition mask apparatus 10 is supported in a deposition apparatus 90 such that the deposition mask 20 faces a lower surface of the substrate such as a glass substrate 92, onto which the deposition material is to be deposited.

In the deposition apparatus 90, the deposition mask 20 and the glass substrate 92 are brought into tight contact with each other by a magnetic force of magnets, not shown. In the deposition apparatus 90, there are disposed below the deposition mask apparatus 10 a crucible 94 storing a deposition material (e.g., organic luminescent material) 98 and a heater 96 for heating the crucible 94. The deposition material 98 in the crucible 94 is evaporated or sublimated by heat applied from the heater 96 so as to adhere to the surface of the glass substrate 92. As described above, since the deposition mask 20 has a lot of through-holes 25, the deposition material 98 adheres to the glass substrate 92 through the through-holes 25. As a result, a film of the deposition material 98 is formed on the surface of the glass substrate 92 in a desired pattern corresponding to the positions of the through-holes 25 of the deposition mask 20.

As described above, in this embodiment, the through-holes 25 are arranged in each effective area 22 in a predetermined pattern. When a color display is desired, an organic luminescent material for red color, an organic luminescent material for green color and an organic luminescent material for blue color may be sequentially deposited, while the deposition mask 20 (deposition mask apparatus 10) and the glass substrate 92 are relatively moved little by little along the arrangement direction of the through-holes 25 (aforementioned one direction).

The frame 15 of the deposition mask apparatus 10 is attached to the peripheries of the rectangular deposition masks 20. The frame 15 is configured to hold each deposition mask in a taut state in order to prevent the deposition mask 20 from warping. The deposition masks 20 and the frame 15 are fixed with respect to each other by spot welding, for example.

The deposition process is performed inside the deposition apparatus 90 in a high-temperature atmosphere. Thus, during the deposition process, the deposition masks 20, the frame 15 and the substrate 92, which are held inside the deposition apparatus 90, are also heated. At this time, each of deposition masks 20, the frame 15 and the substrate 92 develop dimensional change behaviors based on their respective thermal expansion coefficients. In this case, when the thermal expansion coefficients of the deposition mask 20, the frame 15 and the substrate 92 largely differ from one another, positioning displacement occurs because of the difference in dimensional change. As a result, the dimensional precision and the positional precision of the deposition material to be adhered to the substrate 92 lower. In order to avoid this problem, the thermal expansion coefficient of the deposition mask 20 and the frame 15 is preferably equivalent to the thermal expansion coefficient of the substrate 92. For example, when a glass substrate 92 is used as the substrate 92, it is possible to use an iron alloy containing nickel. To be specific, an iron alloy such as an invar material containing 34-38% by weight of nickel, or a super invar material containing cobalt in addition to nickel can be used. In this specification, a numerical range expressed by the symbol "-" includes numerical values sandwiching the symbol "-". For example, a numerical range defined by the expression "34-38% by weight" is identical to a numerical range defined by an expression "not less than 34% by weight and not more than 38% by weight".

(Deposition Mask)

Next, the deposition mask 20 is described in detail. As shown in FIG. 1, in this embodiment, each deposition mask 20 is formed of the metal plate 21, and has an outline of a substantially quadrangular shape in plan view, more precisely, a substantially rectangular shape in plan view. The metal plate 21 of the deposition mask 20 includes the effective area 22 in which the through-holes 25 are formed in a regular arrangement, and a peripheral area 23 surrounding the effective area 22. The peripheral area 23 is an area for supporting the effective area 22, and is not an area through which the deposition material intended to be deposited on the substrate passes. For example, in the deposition mask 20 for use in depositing an organic luminescent material for organic EL display device, the effective area 22 is an area in the deposition mask 20, which faces a section on the substrate (glass substrate 92) to which the organic luminescent material is deposited to form pixels, i.e., a section on the substrate which provides a display surface of the manufactured substrate for organic EL display device. However, for various reasons, the peripheral area 23 may have a through-hole and/or a recess. In the example shown in FIG. 1, each effective area 22 has an outline of a substantially quadrangular shape in plan view, more precisely, a substantially rectangular shape in plan view.

In the illustrated example, the effective areas 22 of the deposition mask 20 are aligned, at predetermined intervals therebetween, along one direction in parallel with a longitudinal direction of the deposition mask 20. In the illustrated example, one effective area 22 corresponds to one organic EL display device. Namely, the deposition mask apparatus 10 (deposition masks 20) shown in FIG. 1 enables a multifaceted deposition.

As shown in FIG. 3, in the illustrate example, a plurality of the through-holes 25 formed in each effective area 22 are arranged at predetermined pitches along two directions perpendicular to each other. An example of the through-hole 25 formed in the metal plate 21 is described in more detail with reference mainly to FIGS. 3 to 6.

As shown in FIGS. 4 to 6, a plurality of the through-holes 25 extend between the first surface 20a, which is one side along a normal direction of the deposition mask 20, and the second surface 20b, which is the other side along the normal direction of the deposition mask 20, to pass through the deposition mask 20. In the illustrated example, as described in more detail later, a first recess 30 is formed in the metal plate 21 by an etching process from the side of the first surface 21a of the metal plate 21, which is the one side in the normal direction of the deposition mask, and a second recess 35 is formed in the metal plate 21 from the side of the second surface 21b, which is the other side in the normal direction of the metal plate 21. The through-hole 25 is composed of the first recess 30 and the second recess 35.

As shown in FIGS. 3 to 6, a cross-sectional area of each first recess 30, in a cross section along a plate plane of the deposition mask 20 at each position along the normal direction of the deposition mask 20, gradually decreases from the side of the first surface 20a of the deposition mask 20 toward the side of the second surface 20b. As shown in FIG. 3, a wall surface 31 of the first recess 30 extends in its all area in a direction intersecting with the normal direction of the deposition mask 20, and is exposed to the one side along the normal direction of the deposition mask 20. Similarly, a cross-sectional area of each second recess 35, in a cross section along the plate plane of the deposition mask 20 at each position along the normal direction of the deposition mask 20, may gradually decrease from the side of the second surface 20b of the deposition mask 20 toward the side of the first surface 20a. A wall surface 36 of the second recess 35 extends in its all area in a direction intersecting with the normal direction of the deposition mask 20, and is exposed to the other side along the normal direction of the deposition mask 20.

As shown in FIGS. 4 to 6, the wall surface 31 of the first recess 30 and the wall surface 36 of the second recess 35 are connected via a circumferential connection portion 41. The connection portion 41 is defined by a ridge line of a bulging part where the wall surface 31 of the first recess 30, which inclined with respect to the normal direction of the deposition mask 20, and the wall surface 36 of the second recess 35, which is inclined with respect to the normal direction of the deposition mask 20, are merged with each other. The connection portion 41 defines a through-portion 42 where an area of the through-hole 25 is minimum in plan view of the deposition mask 20.

As shown in FIGS. 4 to 6, the adjacent two through-holes 25 in the other side surface along the normal direction of the deposition mask, i.e., in the second surface 20b of the deposition mask 20, are spaced from each other along the plate plane of the deposition mask. Namely, as in the below-described manufacturing method, when the second recesses 35 are made by etching the metal plate 21 from the side of the second surface 21b of the metal plate 21, which will correspond to the second surface 20b of the deposition mask 20, the second surface 21b of the metal plate 21 remains between the adjacent two recesses 35.

On the other hand, as shown in FIGS. 4 to 6, the adjacent two first recesses 30 are connected to each other on the one side along the normal direction of the deposition mask, i.e., on the side of the first surface 20a of the deposition mask 20. Namely, as in the below-described manufacturing method, when the first recesses 30 are made by etching the metal plate 21 from the side of the first surface 21a of the metal plate 21, which will correspond to the first surface 20a of the deposition mask 20, no first surface 21a of the metal plate 21 remains between the adjacent two first recesses 30. Namely, the first surface 21a of the metal plate 21 is etched as a whole over the effective area 22. According to the first surface 20a of the deposition mask 20 formed by these first recesses 30, when the deposition mask 20 is used such that the first surface 20a of the deposition mask 20 faces the deposition material 98 as shown in FIG. 2, a utilization efficiency of the deposition material 98 can be effectively improved.

As described later, depending on an etching period of time, the etching step terminates, with the first surface 21a of the metal plate 21 partially remaining. In this case, a part of the first surface 21a of the metal plate 21, which was not etched, remains as a top portion described below. Also in this case, by suitably controlling a width of the top portion, the deposition material 98 can be utilized efficiently, and occurrence of shadow can be restrained.

As shown in FIG. 2, the deposition mask apparatus 10 is received in the deposition apparatus 90. In this case, as shown by the two-dot chain lines in FIG. 4, the first surface 20a of the deposition mask 20 is located on the side of the crucible 94 holding the deposition material 98, and the second surface 20b of the deposition mask 20 faces the glass substrate 92. Thus, the deposition material 98 adheres to the glass substrate 92 through the first recess 30 whose cross-sectional area gradually decreases. As shown by the arrow in FIG. 4 the deposition material 98 not only moves from the crucible 94 toward the glass substrate 92 along the normal direction of the glass substrate 92, but also sometimes moves along a direction largely inclined with respect to the normal direction of the glass substrate 92. At this time, when the thickness of the deposition mask 20 is large, most of the diagonally moving deposition material 98 reaches the wall surface 31 of the first recess 30, before the deposition material 98 passes through the through-hole 25 to reach the glass substrate 92. In this case, the area of the glass substrate 92 facing the through-hole 25 has an area where the deposition material 98 is likely to reach, and an area where the deposition material 98 is unlikely to reach. Thus, in order that the utilization efficiency (a film-deposition efficiency: a rate of the deposition material adhering to the glass substrate 92) of the deposition material can be enhanced to save the expensive deposition material, and that a film of the expensive deposition material can be stably and uniformly formed in the desired area, it is important to constitute the deposition mask 20 such that the diagonally moving deposition material 98 is made to reach the glass substrate 92 as much as possible. Namely, it is advantageous to sufficiently increase a minimum angle θ1 (see FIG. 4) that is formed by a line L1, which passes, in the cross sections of FIGS. 4 to 6 perpendicular to the sheet plane of the deposition mask 20, the connection portion 41 having the minimum cross-sectional area of the through-hole 25 and another given position of the wall surface 31 of the first recess 30, with respect to the normal direction of the deposition mask 20.

One of possible methods of increasing the angle θ1 is that the thickness of the deposition mask 20 is reduced so that the height of the wall surface 31 of the first recess 30 and the height of the wall surface 36 of the second recess 35 are reduced. Namely, it can be said that the metal plate 21, which has a thickness as small as possible as long as the strength of the deposition mask 20 is ensured, is preferably used as the metal plate 21 constituting the deposition mask 20.

As another possible method of increasing the angle θ1 is that the outline of the first recess 30 is made optimum. For example, according to this embodiment, since the wall surfaces 31 of the adjacent two first recesses 30 are merged with each other, the angle θ1 is allowed to be significantly large (see FIG. 4), as compared with a recess that does not merge with another recess, whose wall surfaces (outlines) are shown by the dotted lines. A reason therefor is described below.

As described in detail later, the first recess 30 is formed by etching the first surface 21a of the metal plate 21. In general, a wall surface of the recess formed by etching has a curved shape projecting toward the erosion direction. Thus, the wall surface 31 of the recess formed by etching is steep in an area where the etching starts, and is relatively largely inclined in an area opposed to the area where the etching starts, i.e., the at the deepest point of the recess. On the other hand, in the illustrated deposition mask 20, since the wall surfaces 31 of the adjacent two first recesses 30 merge on the side where the etching starts, an outline of a portion 43 where distal edges 32 of the wall surfaces 31 of the two first recesses 30 are merged with each other has a chamfered shape instead of a steep shape. Thus, the wall surface 31 of the first recess 30 forming a large part of the through-hole 25 can be effectively inclined with respect to the normal direction of the deposition mask. That is to say, the angle θ1 can be made large. Thus, the deposition in a desired pattern can be precisely and stably performed, while the utilization efficiency of the deposition material 98 can be effectively improved.

According to the deposition mask 20 in the present invention, the inclination angle θ1 formed by the wall surface 31 of the first recess 30 with respect to the normal direction of the deposition mask can be effectively increased, in the whole effective area 22. Thus, the deposition in a desired pattern can be precisely and stably performed, while the utilization efficiency of the deposition material 98 can be effectively improved.

Figure 7:
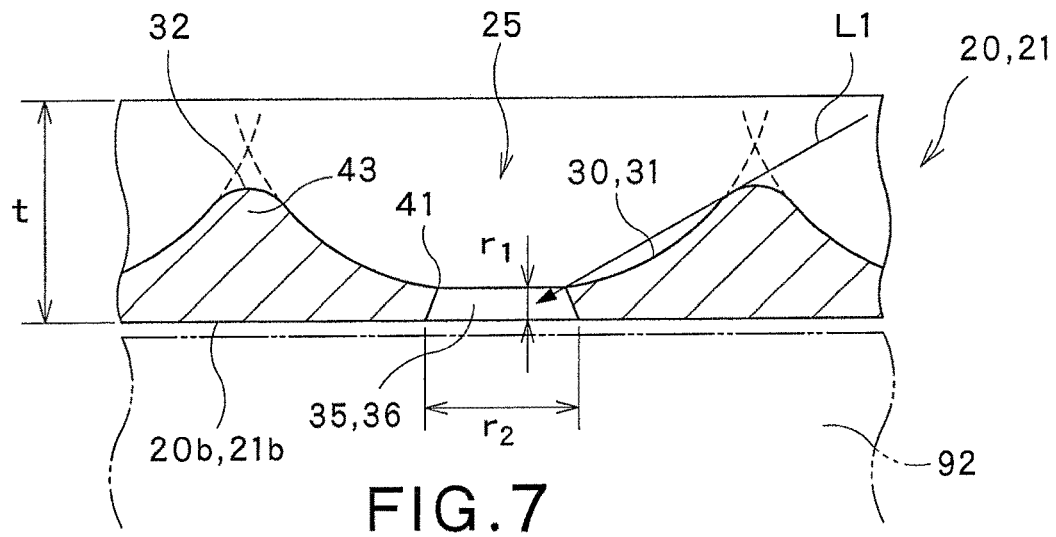
FIG. 7 is an enlarged sectional view showing the through-hole shown in FIG. 4 and an area near the through-hole.

Although not limited, the deposition mask 20 in this embodiment is particularly effective when an organic EL display device having a pixel density of 450 ppi or more. Herebelow, an example of dimensions of the deposition mask 20 required for manufacturing an organic EL display device having such a high pixel density is described, with reference to FIG. 7. FIG. 7 is an enlarged sectional view showing the through-hole 25 shown in FIG. 4 and an area near the through-hole.

In FIG. 7, a thickness of the deposition mask 20 is represented by a symbol t. The thickness t is a thickness of the deposition mask 20, with a part etched by the adjacent two first recesses 30 merging with each other being neglected. Thus, it can be said that the thickness t is a thickness of the metal plate 21. In addition, in FIG. 7, as one of parameters related to the shape of the through-hole 25, a distance from the second surface 20b of the deposition mask 20 up to the connection portion 41 in a direction along the normal direction of the deposition mask 20 is represented by a symbol $r_1$. Further, a dimension of the second recess 35 on the second surface 20b of the deposition mask 20 is represented by a symbol $r_2$. The dimension r2 is a size of the second recess 35 in a direction along the longitudinal direction of the deposition mask 20. When an organic EL display device having a pixel density of 450 ppi or more is manufactured, the dimension $r_2$ of the second recess is set between 20-60 μm, for example. In this embodiment, in order for coping with an organic EL display device having a high pixel density, the dimension $r_2$ of the second recess 35 is set smaller than that of a conventional deposition mask.

As described above, in order that a rate of the deposition material adhering to the wall surface of the through-hole so as to improve the deposition precision, it is effective to reduce the thickness t of the deposition mask. In consideration of this point, in this embodiment, the thickness of the deposition mask 20 (i.e., the plate thickness of the metal plate 21) t is preferably set to be 80 μm or less, for example, within a range between 10-80 μm or within a range between 20-80 μm. In order to further improve the deposition precision, the thickness t of the deposition mask 20 may be set to be 40 μm or less, for example within a range between 10-40 μm or within a range between 20-40 μm.

In addition, as described above, the dimension $r_2$ of the second recess 35 in this embodiment is smaller than a conventional one. Thus, when the distance $r_1$ from the second surface 20b of the deposition mask 20 up to the connection portion 41 is relatively larger than the dimension $r_2$, a rate of the deposition material adhering to the wall surface of the second recess 35 is considered to increase. In consideration of this point, in this embodiment, the distance $r_1$ from the second surface 20b of the deposition mask 20 up to the connection portion 41 is preferably set within a range between 0-6 μm, i.e., 6 μm or less. The fact that the distance $r_1$ is 0 μm means that the wall surface 36 of the second recess 35 does not exist, namely, the wall surface 31 of the first recess 30 reaches the second surface 21b of the metal plate 21.

The plate thickness t of the metal plate 21 for manufacturing the deposition mask 20 is not uniform and more or less varies. Thus, when the deposition mask 20 is manufactured by etching the metal plate 21 under the same etching conditions, a shape of the through-hole 25 to be formed varies depending on the variation in plate thickness of the metal plate 21.

Figure 8A:
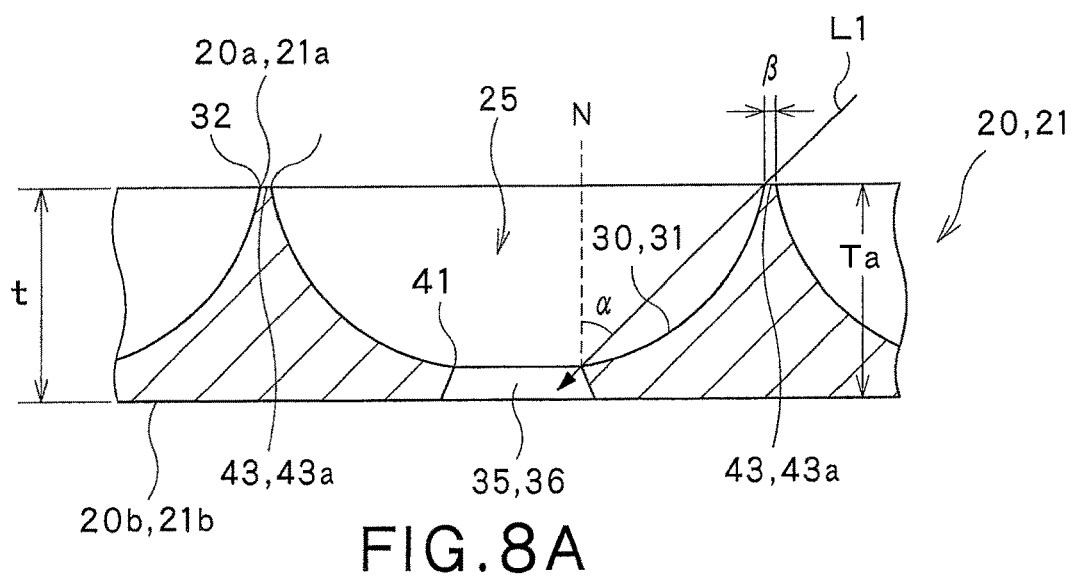
FIG. 8A is a sectional view showing an example of a through-hole that is formed when a plate thickness of a metal plate is smaller than a target specification value.

For example, when the plate thickness t of the metal plate 21 is smaller than a target specification value, in the etching step, the first recess 30 to be formed on the side of the first surface 21a of the metal plate 21 more promptly connects to the second recess 35 formed on the side of the second surface 21b of the metal plate 21. In this case, in a direction where a distance between the through-portions 42 of the adjacent two through-holes 25 is relatively larger, the etching step may terminate before the adjacent two first recesses 30 are connected to each other in the direction. For example, as shown in FIG. 3, a distance between the through-portions 42 of the two through-holes 25 that are adjacent in a direction along the VI-VI line, i.e., in a direction deviated from the arrangement direction of the through-holes 25, is larger than a distance between the through-portions 42 of the two through-holes 25 that are adjacent in a direction along the IV-IV line or the V-V line, i.e., in the arrangement direction of the through-holes 25. Thus, there is a possibility that, in the direction along the IV-IV line or the V-V line, the adjacent two first recesses 30 are connected to each other upon termination of the etching step, but in the direction along the VI-VI line, the adjacent two first recesses 30 are not connected to each other upon termination of the etching step. For example, FIG. 8A shows a sectional view of the deposition mask 20 along the VI-VI line of FIG. 3 in which the two first recesses 30 that are adjacent in the direction along the VI-VI line are not connected to each other. As shown in FIG. 8A, in this case, a portion 43 having a steep shape remains between the distal edges 32 of the wall surfaces 31 of the adjacent two first recesses 30. In the description below, the portion 43 having a steep shape is also referred to a "top portion 43a".

The fact that there is the aforementioned top portion 43a means that the height of the wall surface 31 of the first recess 30 of the through-hole 25 is large. Thus, in the example shown in FIG. 8A, an angle formed by the line L1, which passes through the connection portion 41 and the distal edge 32 of the wall surface 31 of the first recess 30, with respect to the normal direction of the deposition mask 20, is small. This means that the deposition material to be adhered to the substrate 92 is blocked by the wall surface 31 of the first recess 30 of the through-hole 25, i.e., shadow frequently occurs. Thus, the utilization efficiency of the deposition material lowers. In addition, a dimensional precision of the deposition material to be adhered to the substrate is considered to be insufficient. Thus, it is preferable that the through-holes 25 are formed such that there exists no aforementioned top portion 43a, or otherwise that a width of the top portion 43a is a predetermined value or less (e.g., 2 μm or less). The "width of the top portion" has the same meaning as a distance between the distal edges 32 of the adjacent two first recesses 30.

Herebelow, there is described a relationship between an angle α formed by the line L1, which passes through the connection portion 41 and the distal edge 32 of the wall surface 31 of the first recess 30, with respect to the normal direction N of the deposition mask 20 (herebelow also referred to a "inclination angle α of the wall surface 31"), and a width β of the top portion. As apparent from FIG. 8A, the greater the width β of the top portion becomes, the greater the inclination angle α of the wall surface 31 becomes. As a result, a large part of the deposition material, coming along a direction that is largely inclined as compared with the inclination angle α of the wall surface 31, is blocked by the wall surface 31 near the top portion. Namely, shadow is likely to occur. For example, in the deposition mask 20 for a display device having a pixel density of 441 ppi, when a distance between the two through-holes 25 that are adjacent in the direction along the VI-VI line of FIG. 3 on the second surface 20b is 39.1 μm, a distance between the two through-holes 25 that are adjacent in the direction along the IV-IV line of FIG. 3 on the second surface 20b is 27.6 μm, a dimension of the through-hole 25 in the direction along the VI-VI line of FIG. 3 on the second surface 20b is 30.0 μm, and a distance $r_1$ from the second surface 20b up to the connection portion 41 is 3 μm, and the width β of the top portion is 2.2 μm, the inclination angle α of the wall surface 31 is 40°. When a minimum angle at which the deposition material comes is 40° or less, shadow is likely to occur. In this case, a value of the width β which can restrain occurrence of shadow may be 2 μm or less, for example.

Figure 8B:
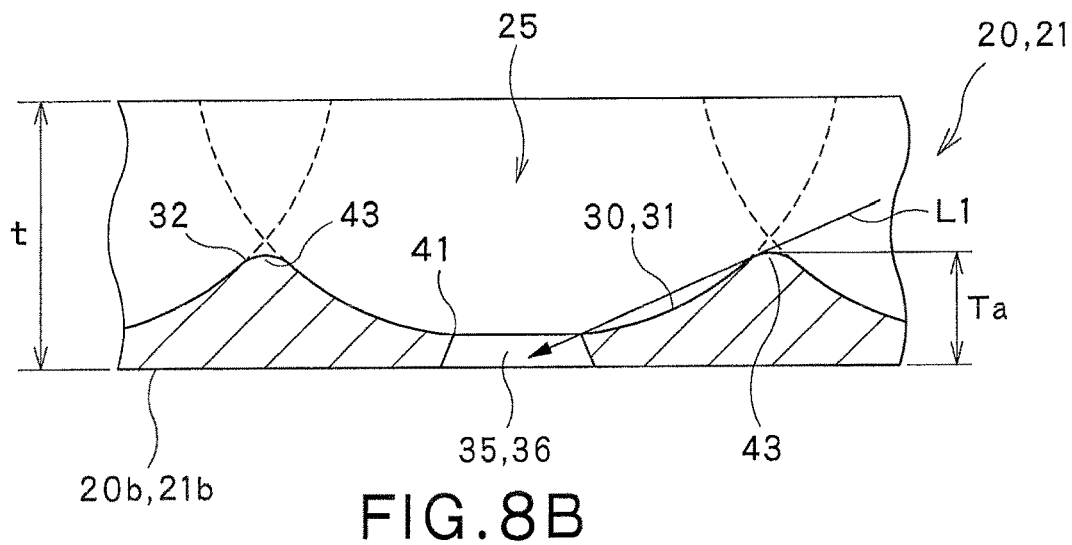
FIG. 8B is a sectional view showing an example of a through-hole that is formed when a plate thickness of a metal plate is larger than a target specification value.

On the other hand, when the plate thickness t of the metal plate 21 is larger than a target specification value, in order to connect the first recess 30, which is to be formed on the side of the first surface 21a of the metal plate 21, to the second recess 35, which is formed on the side of the second surface 21b of the metal plate 21, an etching period of time is required to be longer than a general one. In this case, as shown in FIG. 8B, an etching process for forming the first recess 30 on the side of the first surface 21a of the metal plate 21 proceeds more widely than general. As a result, a maximum thickness Ta along the normal direction of the elongated metal plate 64 in an area constituting the effective area 22 becomes smaller than a design value. Namely, an overall thickness of the effective area 22 excessively reduces, whereby a lot of small deformations such as recesses may be generated in the effective area.

Meanwhile, when an etching period of time is reduced in order to restrain generation of small deformations, the wall surface 31 of the first recess 30 merges with the wall surface 36 of the second recess 35 at a position closer to the first surface 21a. As apparent from FIGS. 18 to 21 described later, a change rate of a cross-sectional area of the second recess 35 with respect to a position in the thickness direction of the metal plate 21 becomes larger as it is located closer to the first surface 21a. Thus, the fact that the wall surface 31 of the first recess 30 merges with the wall surface 36 of the second recess 35 at a position closer to the first surface 21a means that a dimension of the through-portion 42 formed at the merged position is likely to vary. Thus, the reduction in etching period of time leads to a variation in dimension of the through-portions 42.

Under such circumstances, in order to manufacture the deposition mask 20 in which a variation in dimension of the through-holes is restrained, it is important to select a metal plate having a small thickness variation.

Next, an operation and an effect of this embodiment as structured above are described. Here, a method of manufacturing a metal plate for use in manufacturing a deposition mask firstly. Then, a method of manufacturing a deposition mask by using the obtained metal plate is described. Thereafter, a method of depositing a deposition material onto a substrate by using the obtained deposition mask.

(Method of Manufacturing Metal Plate)

Figure 9A:
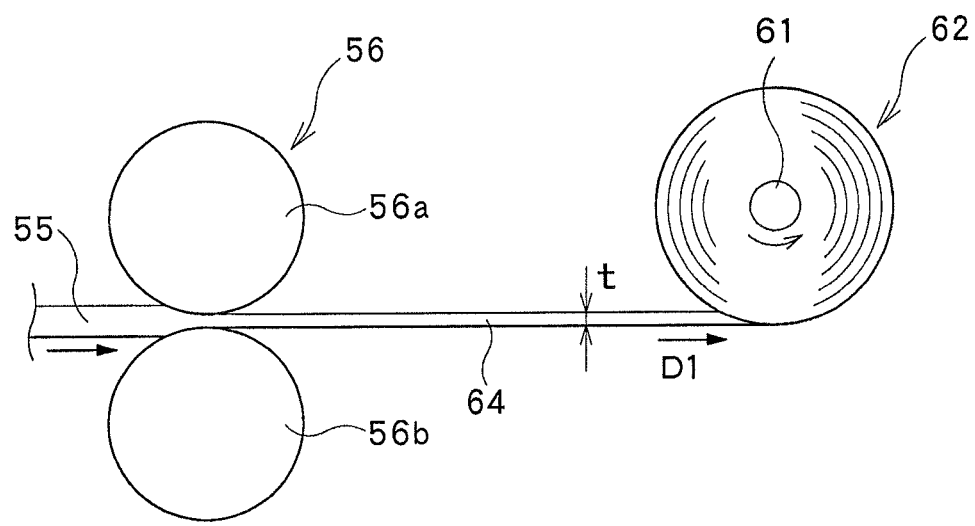
FIG. 9(a) is a view showing a step in which a metal plate having a designed thickness is obtained by rolling a base metal.
Figure 9B:
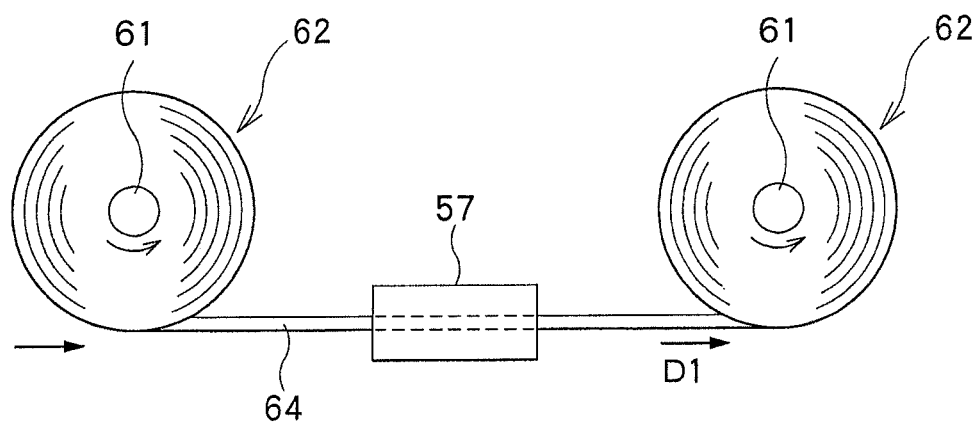
FIG. 9(b) is a view showing a step in which the metal plate obtained by rolling is annealed.

A method of manufacturing a metal plate is firstly described with reference to FIG. 9(a). FIG. 9(a) is a view showing a step of rolling a base metal to obtain a metal plate having a desired thickness. FIG. 9(b) is a view showing a step of annealing the metal plate obtained by the rolling step.

<Rolling Step>

As shown in FIG. 9(a), a base metal 55 formed of an invar material is prepared, and the base metal 55 is transported toward a rolling apparatus 56 including a pair of reduction rolls 56a and 56b along a transport direction shown by the arrow D1. In the description below, the transport direction of the base metal 55 and the metal plate during the rolling step is also referred to as rolling direction. The rolling direction is identical to a longitudinal direction of an elongated metal plate obtained by the rolling step.

The base metal 55 having reached between the pair of reduction rolls 56a and 56b is rolled by the pair of reduction rolls 56a and 56b. Thus, a thickness of the base metal 55 is reduced and is elongated along the transport direction. As a result, an elongated metal plate 64 having a thickness t can be obtained. As shown in FIG. 9(a), a winding body 62 may be formed by winding up the elongated metal plate 64 around a core 61. Although a value of the thickness $t_0$ is not particularly limited, the value is 80 μm or less or 40 μm or less, for example.

FIG. 9(a) merely shows the rolling step schematically, and a concrete structure and procedure for performing the rolling step are not specifically limited. For example, the rolling step may include a hot rolling step in which the base metal is processed at a temperature not less than a recrystallization temperature of the invar material constituting the base metal 55, and a cold rolling step in which the base metal is processed at a temperature not more than the recrystallization temperature of the invar material.

<Slitting Step>

After that, there may be performed a slitting step for slitting both ends of the elongated metal plate 64, which is obtained by the rolling step, in the width direction thereof, over a range of 3-5 mm. The slitting step is performed to remove a crack that may be generated on both ends of the elongated metal plate 64 because of the rolling step. Due to the slitting step, it can be prevented that a breakage phenomenon of the elongated metal plate 64, which is so-called plate incision, occurs from the crack as a starting point.

<Annealing Step>

After that, in order to remove a remaining stress accumulated by the rolling process in the elongated metal plate 64, as shown in FIG. 9(b), the elongated metal plate 64 is annealed by using an annealing apparatus 57. As shown in FIG. 9(b), the annealing step may be performed while the elongated metal plate 64 is being pulled in the transport direction (longitudinal direction). Namely, the annealing step may be performed as a continuous annealing process while the elongated metal plate is being transported, instead of a batch-type annealing process. A duration of the annealing step is suitably set depending on a thickness of the elongated metal plate 64 and a reduction ratio thereof. For example, the annealing step is performed for 40-100 seconds within a temperature range of 400-600° C. The above "40-100 seconds" mean that it takes 40-100 seconds for the elongated metal plate 64 to pass through a space, which is heated at a temperature within the above temperature range, in the annealing apparatus 57.

Due to the annealing step, it is possible to obtain the elongated metal plate 64 of a thickness t, from which the remaining strain is removed to a certain extent. The thickness t is generally equal to a maximum thickness Tb in the peripheral area 23 of the deposition mask 20.

The elongated metal plate 64 having the thickness t may be made by repeating the above rolling step, the slitting step and the annealing step a plurality of times. FIG. 9(b) shows the example in which the annealing step is performed while the elongated metal plate 64 is being pulled in the longitudinal direction. However, not limited thereto, the annealing step may be performed to the elongated metal plate 64 that is wound around the core 61. Namely, the batch-type annealing process may be performed. When the annealing step is performed while the elongated metal plate 64 is wound around the core 61, the elongated metal plate 64 may have a warping tendency corresponding to a winding diameter of the winding body 62. Thus, depending on a winding diameter of the winding body 62 and/or a material forming the base metal 55, it is advantageous to perform the annealing step while the elongated metal plate 64 is being pulled in the longitudinal direction.

<Cutting Step>

After that, there is performed a cutting step in which both ends of the elongated metal plate 64 in the width direction thereof are cut off over a predetermined range, so as to adjust the width of the elongated metal plate 64 into a desired width. In this manner, the elongated metal plate 64 having a desired thickness and a desired width can be obtained.

<Inspection Step>

Figure 10:
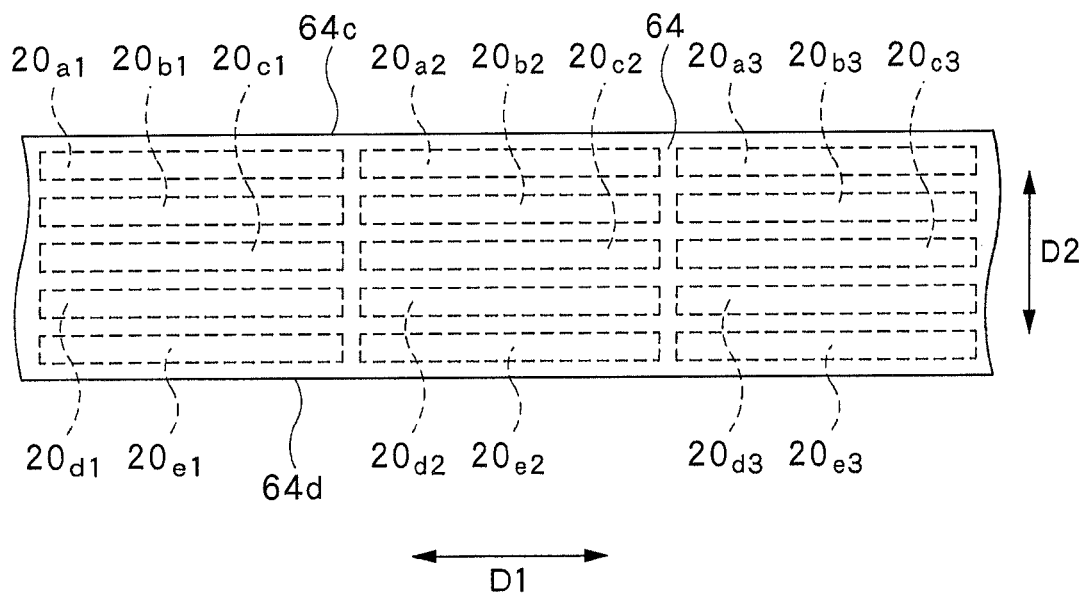
FIG. 10 is a view showing that a plurality of deposition masks is assigned to an elongated metal plate.

After that, there is performed an inspection step in which a thickness of the thus obtained elongated metal plate 64 is inspected. FIG. 10 is a plan view of the elongated metal plate 64 obtained by the steps shown in FIGS. 9(a) and 9(b). In FIG. 10, a number of deposition masks 20, which are cut out from the elongated metal plate 64 in a subsequent step, are shown by the dotted lines. As shown in FIG. 10, a plurality of the deposition masks 20 extending in a direction in parallel with a longitudinal direction D1 of the elongated metal plate 64 are assigned to the elongated metal plate 64 both in the longitudinal direction D1 of the elongated metal plate 64 and in a width direction D1 thereof. Thus, when the plate thickness of the elongated metal plate 64 varies depending on a position, thicknesses of the deposition masks 20 and shapes of the through-holes 25 individually differ from one another. Thus, a variation in plate thickness of the elongated metal plate 64 is preferably small both in the longitudinal direction D1 and the width direction D2.

FIG. 10 shows an example in which five deposition masks 20 are assigned along the width direction D2 of the elongated metal plate 64. From a first side part 64c of the elongated metal plate 64 toward a second side part 64d thereof, the five deposition masks 20 are indicated by the symbols $20_{ak}$, $20_{bk}$, $20_{ck}$, $20_{dk}$ and $20_{ek}$ (k is a given natural number) in this order. In FIG. 11B, plate thicknesses of the elongated metal plate 64, which are located at positions correspondingly to the deposition masks $20_{ak}$, $20_{bk}$, $20_{ck}$, $20_{dk}$ and $20_{ek}$ are indicated by the symbols $t_a$, $t_b$, $t_c$, $t_d$ and $t_e$. The plate thickness $t_c$ of a part of the elongated metal plate 64, to which the deposition mask $20_{ck}$, which is centrally positioned in the five deposition masks 20 arranged in the width direction D2, is assigned, corresponds to a plate thickness of the elongated metal plate 64 at a central portion in the width direction D2.

In the inspection step, there is firstly performed a first inspection step in which a plate thickness of the elongated metal plate 64 is measured along the longitudinal direction D1 at many points. The first inspection step may be performed during the rolling step, or may be performed after the rolling step. When the first inspection step is performed after the rolling step, the first inspection step may be performed by a measuring device provided on the same production line as that of the rolling step, or may be performed by a measuring device provided on a different line from that of the rolling step.

Although a measuring method is not specifically limited, it is possible to employ a method in which the elongated metal plate 64 is irradiated with an X-ray, and a fluorescent X-ray emitted from the elongated metal plate 64 is measured. This method takes advantage of the fact that an intensity of a fluorescent X-ray to be measured depends on an amount of an element constituting the elongated metal plate 64, and thus on a plate thickness of the elongated metal plate 64. Such a measuring method using an X-ray is utilized when a film thickness of a plating film is measured.

Figure 11A:
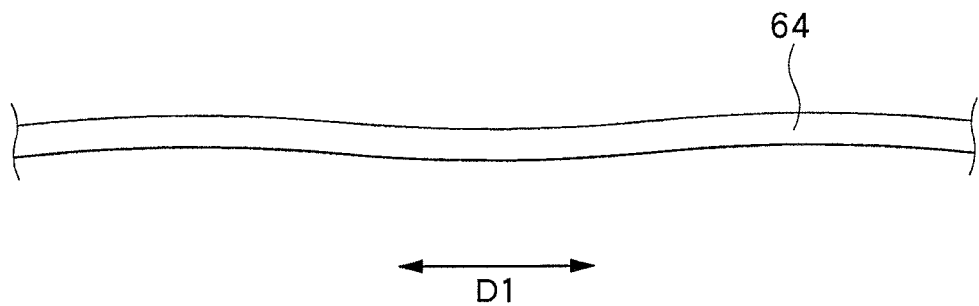
FIG. 11A is a sectional view showing an example in which a plate thickness of a metal plate varies in a rolling direction (longitudinal direction).
Figure 11B:
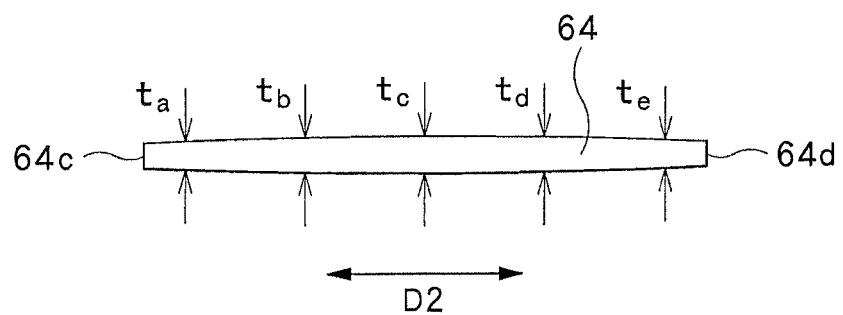
FIG. 11B is a sectional view showing an example in which a plate thickness of a metal plate varies in a width direction.

Although a measurement point is not specifically limited, a plate thickness of the elongated metal plate 64 at the central portion in the width direction D2, i.e., the plate thickness $t_c$ shown in FIG. 11 is measured along the longitudinal direction at many points, for example. Thus, an average value and a standard deviation of plate thicknesses of the elongated metal plate 64 in the longitudinal direction D1 can be calculated. An interval between the measurement points of the elongated metal plate 64 in the longitudinal direction D1 is within a range of 50-500 μm, for example.

As described below, selection of an elongated metal plate 64 based on a variation in plate thickness of the elongated metal plate 64 is effective when an average value of plate thicknesses of the elongated metal plate 64 in the longitudinal direction D1 is within a ±3% range around a predetermined value. Namely, in a case where an average value of plate thicknesses of the elongated metal plate 64 in the longitudinal direction D1 deviates from the ±3% range around a predetermined value, it may be impossible to manufacture a deposition mask 20 of a high quality, even if the elongated metal plate 64 satisfies the below-described conditions (1) and (2). Thus, when the first inspection step is performed during the rolling step, as described above, a feedback control may be performed during the rolling step such that an average value of plate thicknesses of the elongated metal plate 64 in the longitudinal direction D1 is included within a ±3% range around a predetermined value. The "predetermined value" is a so-called "design value" or "specification value", which is a reference value when the elongated metal plate 64 and the metal plate 21 are delivered to a client.

As described in the below examples, a predetermined value (design value, specification value) of a plate thickness of the elongated metal plate may be 20 μm, 25 μm, 40 μm and so on. When these predetermined values are employed, selection of an elongated metal plate 64 based on a variation in plate thickness of the elongated metal plate 64 according to this embodiment is effective respectively when an average value of plate thicknesses of the elongated metal plate 64 in the longitudinal direction D1 is within a ±3% range around 20 μm, a ±3% range around 25 and a ±3% range around 40 μm.

A value called design value or specification value of a plate thickness of the elongated metal plate 64 is not a technical matter but a matter based on a transaction contract. Thus, such a value cannot be calculated merely by observing the elongated metal plate 64 itself. On the other hand, a selection effectiveness of an elongated metal plate 64 based on the below-described conditions (1) and (2) according to this embodiment does not depend on a design value or a specification value itself of a plate thickness of the elongated metal plate 64. This is because the selection of an elongated metal plate 64 according to this embodiment specifies a variation in plate thickness in one elongated metal plate 64, in order for obtaining through-holes each 25 having a suitable shape and a dimension, when the through-holes 25 are formed under a certain etching condition. When the through-holes 25 are formed by etching, it is possible to cope with a given plate thickness by changing an etching condition. Thus, even when a design value or a specification value of a plate thickness of the elongated metal plate 64 is unknown, the effectiveness of the selection of an elongated metal plate 64 according to this embodiment can be judged. For example, in a plurality of elongated metal plates 64 shipped from a metal plate manufacturer and a plurality of elongated metal plates 64 owned by a deposition mask manufacturer, when an average value variation in plate thickness of the elongated metal plates 64 in the longitudinal direction D1 is within a ±3% range, it can be said that the selection according to this embodiment can be effectively applied.

Next, there is performed a second inspection step in which the plate thickness of the elongated metal plate 64 is measured along the width direction D2 at many points. A method of measuring the plate thickness in the second inspection step is not specifically limited. Similarly to the first inspection step, it is possible to employ a method in which the elongated metal plate 64 is irradiated with an X-ray and a fluorescent X-ray emitted from the elongated metal plate 64 is measured. Alternatively, a contact-type measuring method may be employed. As a measuring device for performing a contact-type measuring method, MT1271 (Length Gauges) manufactured by Heidenhain Co. can be used.

A measurement point is also not specifically limited. In a predetermined position, a plate thickness of the elongated metal plate 64 is measured along the width direction D2 of the elongated metal plate 64 at many points. Thus, an average value and a standard deviation of plate thicknesses of the elongated metal plate 64 in the width direction D2 can be calculated. An interval between the measurement points of the elongated metal plate 64 in the width direction D2 is within a range of 5-50 μm, for example.

The length of the elongated metal plate 64 in the width direction D2 is significantly smaller than the length thereof in the longitudinal direction D1. Thus, as compared with the measurement in the longitudinal direction D1, it is difficult to increase the number of measurement points in the measurement in the width direction D2. As a result, an accuracy of a calculated standard deviation is considered to lower. In consideration of this point, a standard deviation of plate thicknesses of the elongated metal plate 64 in the width direction D2 may be a standard deviation that is calculated based on plate thicknesses of the elongated metal plate 64, which are measured at intersections between imaginary lines the number of which is m (m is a natural number of 2 or more), each extending on the elongated metal plate 64 in the longitudinal direction D1, and an imaginary line(s) the number of which is n (n is a natural number of 1 or more), each extending on the elongated metal plate 64 in the width direction D2. For example, the number m may be 9, while the number n may be 3. Thus, the number of measurement points can be sufficiently increased, whereby a standard deviation can be precisely calculated. The imaginary lines the number of which is m, each extending on the elongated metal plate 64 along the longitudinal direction D1, and the imaginary lines the number of which is n, each extending on the elongated metal plate 64 along the width direction D2, are drawn in a predetermined area of the elongated metal plate 64. For example, they are drawn in a predetermined area defined by an area of 500 mm in the longitudinal direction D1 and by an area of 500 mm in the width direction D2.

The aforementioned second inspection step in which the plate thickness of the elongated metal plate 64 in the width direction D2 may be performed during the rolling step, or may be performed after the rolling step. When the second inspection step is performed after the rolling step, the elongated plate metal 64, which is cut over a predetermined length, may be subjected to the second inspection step.

After a plate thickness of the elongated metal plate 64 has been measured at respective positions, the selection based on a variation in plate thickness is performed to the elongated metal plates 64 whose average value of the plate thicknesses in the longitudinal direction D1 is within a ±3% range around a predetermined value. Herein, the selection of an elongated metal plate 64 is performed such that only an elongated metal plate 64 which satisfies all the below conditions (1) and (2) is used in a below-described step of manufacturing the deposition masks 20.

(1) When an average value of plate thicknesses of the elongated metal plate 64 in the longitudinal direction (rolling direction) D1 is represented as A, and a value obtained by multiplying a standard value of the plate thicknesses of the elongated metal plate 64 in the longitudinal direction D1 by 3 is represented as B, (B/A)×100(%) is 5% or less; and (2) When a value obtained by multiplying a standard deviation of plate thicknesses of the elongated metal plate 64 in the width direction by 3 is represented as C, and a value of a plate thickness of the elongated metal plate 64 at the central portion in the width direction D2, which is obtained when the plate thicknesses of the elongated metal plate 64 are measured along the width direction D2 in order to calculate a standard deviation of the plate thicknesses of the elongated metal plate 64 in the width direction D2, is represented as X, (C/X)×100(%) is 3% or less.

The aforementioned conditions (1) and (2) are respectively described below.

The aforementioned condition (1) is a condition for restraining that the dimension of a through-hole 25 of the plurality of deposition masks 20 assigned along the longitudinal direction D1 of the elongated metal plate 64 varies depending on an assigned position. The aforementioned condition (2) is a condition for restraining that the dimension of a through-hole 25 of the plurality of deposition masks 20 assigned along the width direction D2 of the elongated metal plate 64 varies depending on an assigned position.

Generally, in the longitudinal direction D1 of the elongated metal plate 64, it is difficult to estimate a variation tendency (degree, cycle, etc.) of the plate thickness of the elongated metal plate 64. On the other hand, in the width direction D2 of the elongated metal plate 64, a variation tendency of the plate thickness of the elongated metal plate 64 is considered to be more or less uniform. For example, FIG. 11B shows that the plate thickness $t_c$ at the central portion in the width direction D2 is larger than the plate thickness $t_0$ near the first side part 64c and the plate thickness $t_0$ near the second side part 64d. When the plate thickness varies in the width direction D2, it can be restrained that the through-holes 25 formed in positions of different plate thicknesses differ in dimension and shape, by setting an etching condition in consideration of the variation. For example, in the example shown in FIG. 11B, by making smaller a pressure of an etchant, which is injected from a predetermined spray toward the elongated metal plate 64 for forming the first recess 30 of the through-hole 25 near the first side part 64c or near the second side part 64d, than a pressure of an etchant which is to be injected toward the central portion in the width direction D2, the difference in dimension and shape of the through-holes 25 can be reduced. The aforementioned condition (2) may be determined taking such an etching condition adjustment into consideration. The etching condition that can be adjusted depending on a variation may include an oscillating position of a spray, an oscillating angle thereof and an oscillating speed, in addition to the above etchant pressure (spray pressure).

(Method of Manufacturing Deposition Mask)

Next, a method of manufacturing the deposition mask 20 by using the elongated metal plate 64 selected as described above is described with reference to FIGS. 12 to 21. In the below-described method of manufacturing the deposition mask 20, as shown in FIG. 12, the elongated metal plate 64 is supplied, the through-holes 25 are formed in the elongated metal plate 64, and the elongated metal plate 64 are severed so that the deposition masks 20 each of which is formed of the sheet-like metal plate 21 are obtained.

To be more specific, the method of manufacturing a deposition mask 20 includes a step of supplying an elongated metal plate 64 that extends like a strip, a step of etching the elongated metal plate 64 using the photolithographic technique to form a first recess 30 in the elongated metal plate 64 from the side of a first surface 64a, and a step of etching the elongated metal plate 64 using the photolithographic technique to form a second recess 35 in the elongated metal plate 64 from the side of a second surface 64b. When the first recess 30 and the second recess 35, which are formed in the elongated metal plate 64, communicate with each other, the through-hole 25 is made in the elongated metal plate 64. In the example shown in FIGS. 13 to 21, the step of forming the second recess 35 is performed before the step of forming the first recess. In addition, between the step of forming the second recess 35 and the step of forming the first recess 30, there is further provided a step of sealing the thus made second recess 35. Details of the respective steps are described below.

Figure 12:
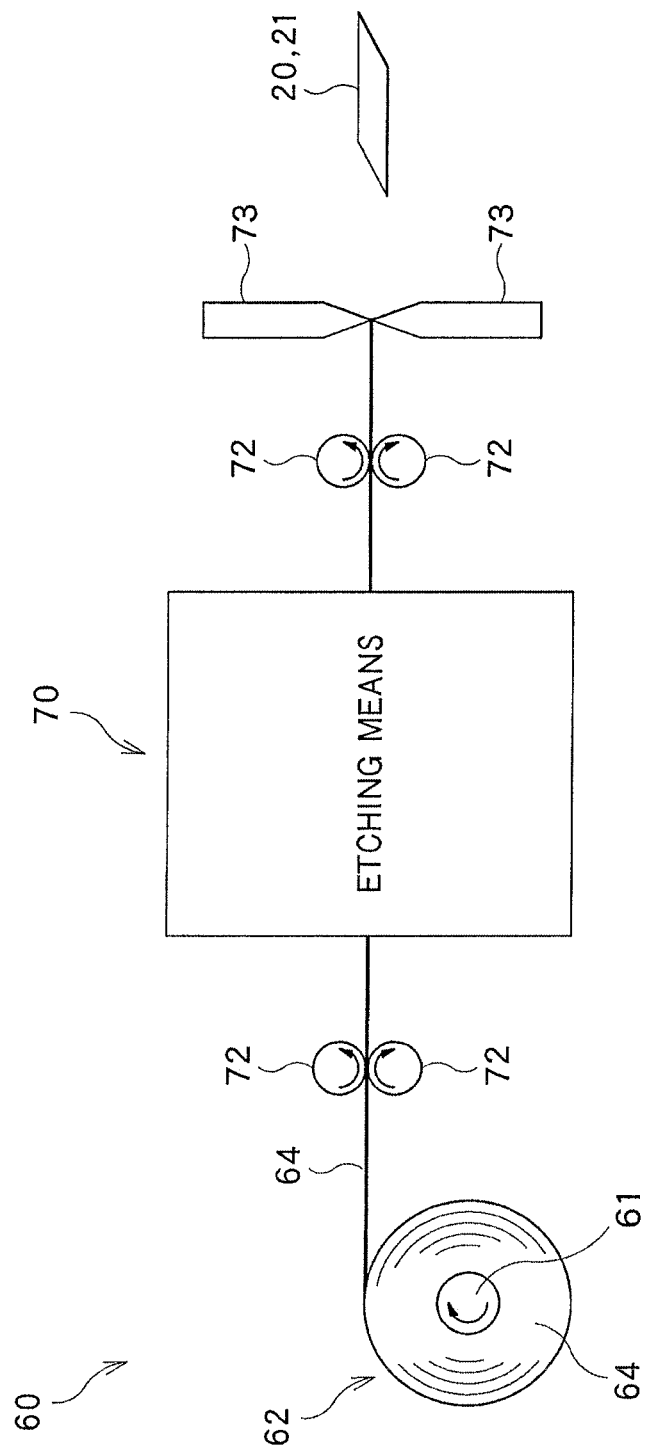
FIG. 12 is a schematic view for generally explaining an example of a method of manufacturing the deposition mask shown in FIG. 1.

FIG. 12 shows a manufacturing apparatus 60 for making the deposition masks 20. As shown in FIG. 12, the winding body 62 having the core 61 around which the elongated metal plate 64 is wound is firstly prepared. By rotating the core 61 to unwind the winding body 62, the elongated metal plate 64 extending like a strip is supplied as shown in FIG. 12. After the through-holes 25 are formed in the elongated metal plate 64, the elongated metal plate 64 provides the sheet-like metal plates 21 and further the deposition masks 20.

The supplied elongated metal plate 64 is transported by the transport rollers 72 to an etching apparatus (etching means) 70. The respective processes shown in FIGS. 13 to 21 are performed by means of the etching means 70. In this embodiment, a plurality of the deposition masks 20 is assigned in the width direction of the elongated metal plate 64. Namely, the deposition masks 20 are made from an area occupying a predetermined position of the elongated metal plate 64 in the longitudinal direction. In this case, it is preferable that the deposition masks 20 are assigned to the elongated metal plate 64 such that the longitudinal direction of each deposition mask 20 corresponds to the rolling direction D1 of the elongated metal plate 64.

Figure 13:
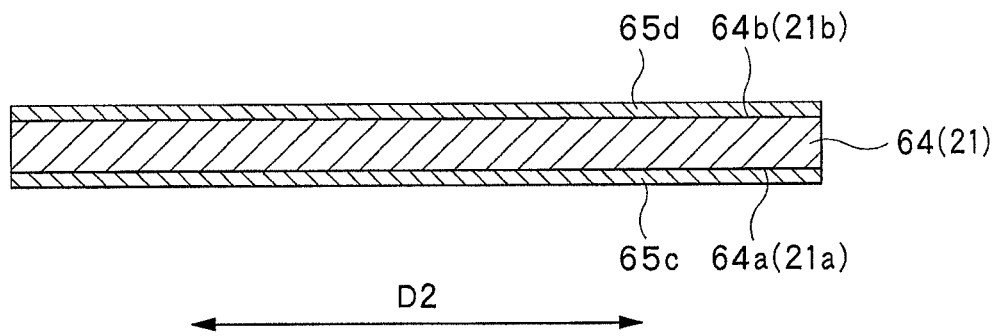
FIG. 13 is a view for explaining an example of the method of manufacturing the deposition mask, which is a sectional view showing a step in which a resist film is formed on a metal plate.
Figure 14:
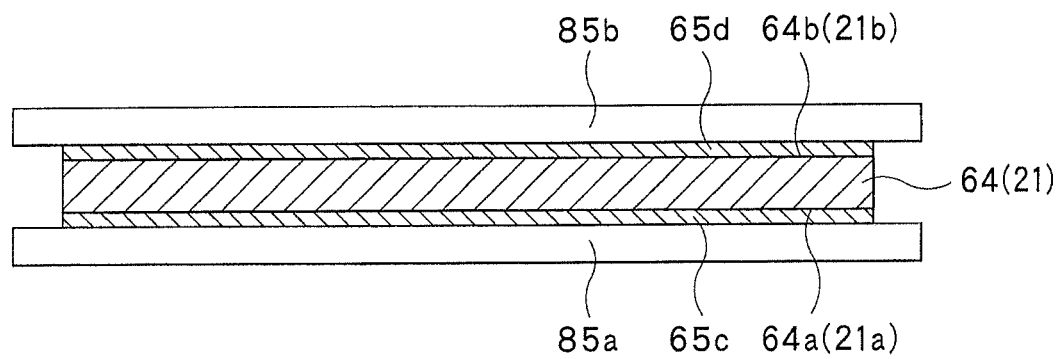
FIG. 14 is a view for explaining an example of the method of manufacturing the deposition mask, which is a sectional view showing a step in which an exposure mask is brought into tight contact with the resist film.
Figure 15:
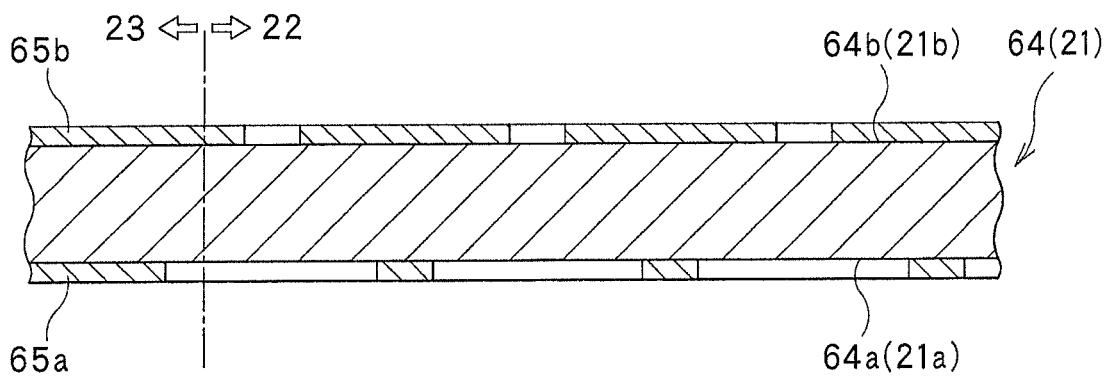
FIG. 15 is a view for explaining an example of the method of manufacturing the deposition mask, showing an elongated metal plate in a section along a normal direction.

As shown in FIG. 13, a negative-type photosensitive resist material is firstly applied to the first surface 64a (lower surface in the sheet plane of FIG. 11) and the second surface 64b of the elongated metal plate 64, so that resist films 65c and 65d are formed on the elongated metal plate 64.

Then, exposure masks 85a and 85b which do not allow light to transmit through areas to be removed of the resist films 65c and 65d are prepared. As shown in FIG. 12, the masks 85a and 85d are located on the resist films 65c and 65d. For example, glass dry plates which do not allow light to transmit through the areas to be removed from the resist films 65c and 65d are used as the exposure masks 85a and 85d. Thereafter, the exposure masks 85a and 85b are sufficiently brought into tight contact with the resist films 65c and 65d by vacuum bonding.

A positive-type photosensitive resist material may be used. In this case, there is used an exposure mask which allows light to transmit through an area to be removed of the resist film.

After that, the resist films 65c and 65d are exposed through the exposure masks 85a and 85b. Further, the resist films 65c and 65d are developed (developing step) in order to form an image on the exposed resist films 65c and 65d. Thus, as shown in FIG. 13, a resist pattern (also referred to simply as resist) 65a can be formed on the first surface 64a of the elongated metal plate 64, while a resist pattern (also referred to simply as resist) 65b can be formed on the second surface 64b of the elongated metal plate 64. The developing step may include a resist heating step for increasing a hardness of the resist films 65c and 65d.

Figure 16:
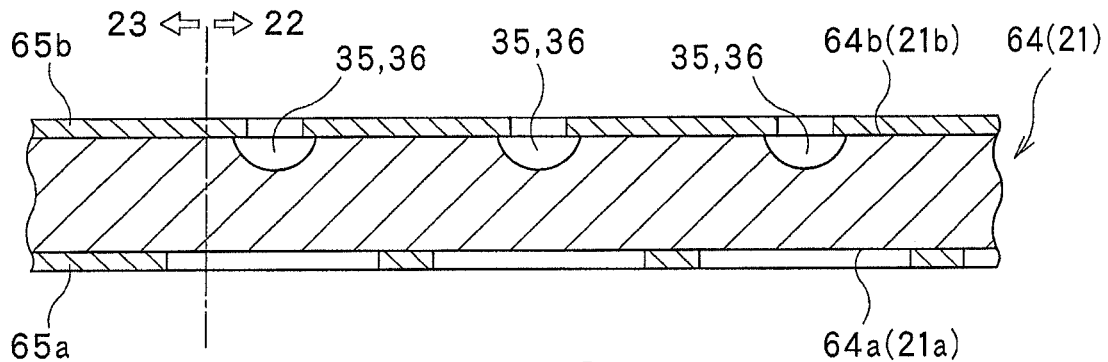
FIG. 16 is a view for explaining an example of the method of manufacturing the deposition mask, showing the elongated metal plate in a section along the normal direction.

Then, as shown in FIG. 16, by using an etchant (e.g., ferric chloride solution), the elongated metal plate 64 is etched from the side of the second surface 64b, with the resist pattern 65d formed on the elongated metal plate 64 serving as a mask. For example, the etchant is ejected from a nozzle, which is disposed on the side facing the second surface 64b of the transported elongated metal plate 64, toward the second surface 64b of the elongated metal plate 64 through the resist pattern 65b. As a result, as shown in FIG. 16, areas of the elongated metal plate 64, which are not covered with the resist pattern 65b, are eroded by the etchant. Thus, a lot of second recesses 35 are formed in the elongated metal plate 64 from the side of the second surface 64b.

Figure 17:
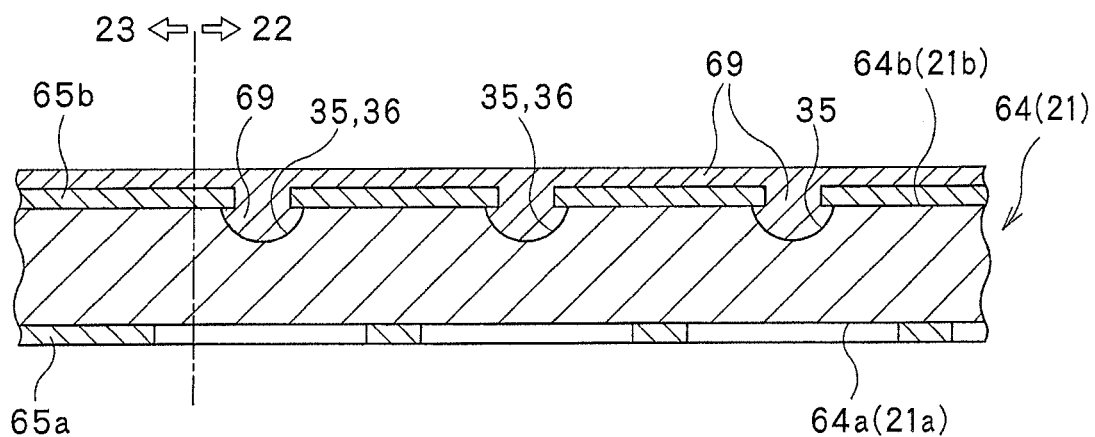
FIG. 17 is a view for explaining an example of the method of manufacturing the deposition mask, showing the elongated metal plate in a section along the normal direction.

After that, as shown in FIG. 17, the formed second recesses 35 are coated with a resin 69 resistant to the etching liquid. Namely, the second recesses 35 are sealed by the resin 69 resistant to the etching liquid. In the example shown in FIG. 17, a film of the resin 69 is formed to cover not only the formed second recesses 35 but also the second surface 64b (resist pattern 65b).

Figure 18:
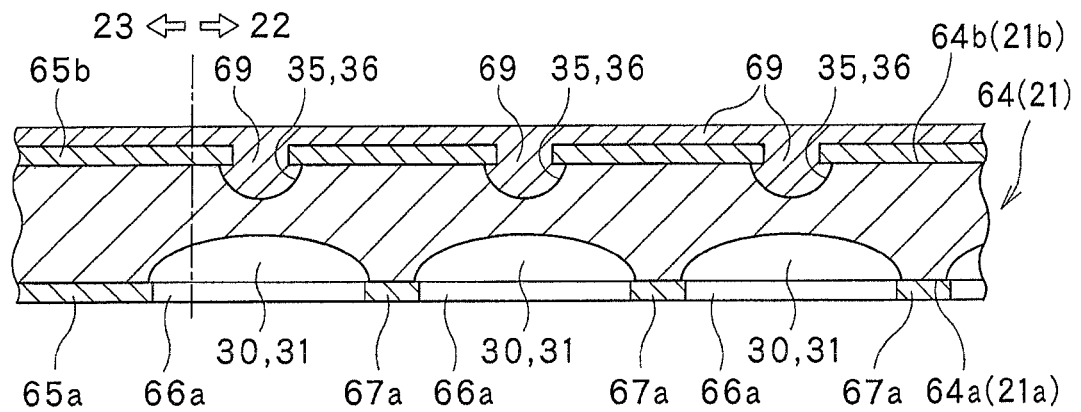
FIG. 18 is a view for explaining an example of the method of manufacturing the deposition mask, showing the elongated metal plate in a section along the normal direction.

Then, as shown in FIG. 18, the elongated metal plate 64 is subjected to the second etching process. In the second etching process, the elongated metal plate 64 is etched only from the side of the first surface 64a, so that the first recess 30 is gradually formed from the side of the first surface 64a. This is because the elongated metal plate 64 is coated with the resin 69 resistant to the etching liquid, on the side of the second surface 64b. Thus, there is no possibility that the shapes of the second recesses 35, which have been formed to have a desired shape by the first etching process, are impaired.

Figure 19:
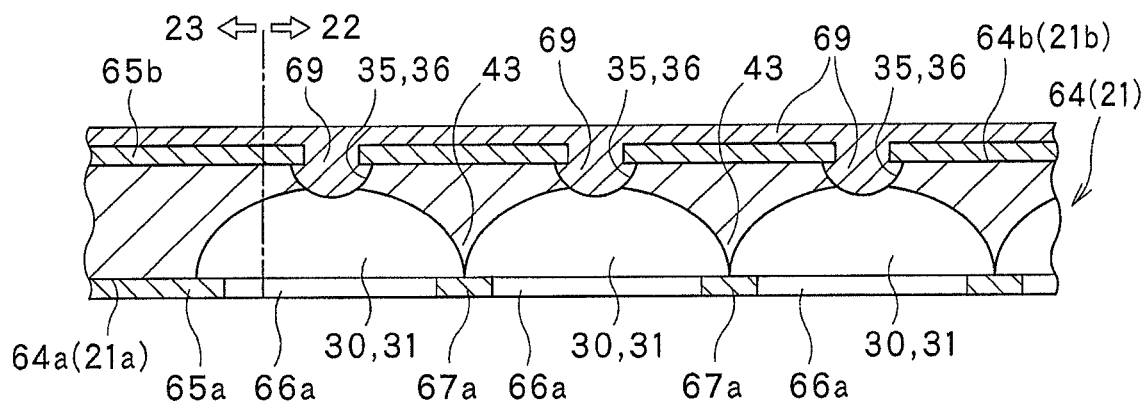
FIG. 19 is a view for explaining an example of the method of manufacturing the deposition mask, showing the elongated metal plate in a section along the normal direction.

The erosion by the etching process takes place in a portion of the elongated metal plate 64, which is in contact with the etching liquid. Thus, the erosion develops not only in the normal direction (thickness direction) of the elongated metal plate 64 but also in a direction along the plate plane of the elongated metal plate 64. Thus, as shown in FIG. 19, with the development of etching in the normal direction of the elongated metal plate 64, not only the first recess 30 becomes continuous with the second recess 35, but also two first recesses 30, which are formed at positions facing two adjacent holes 66a of the resist pattern 65a, are merged with each other on a reverse side of a bridge portion 67a positioned between the two holes 66a.

Figure 20:
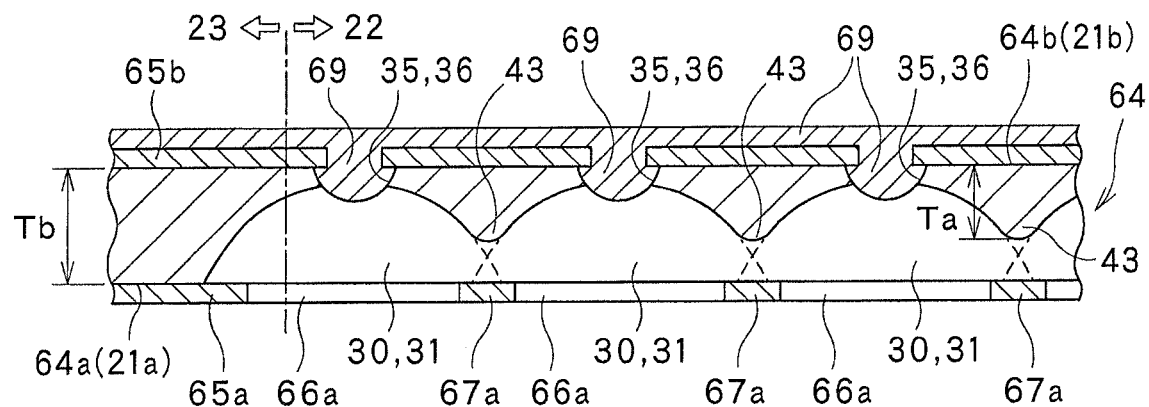
FIG. 20 is a view for explaining an example of the method of manufacturing the deposition mask, showing the elongated metal plate in a section along the normal direction.

As shown in FIG. 20, the etching from the side of the first surface 64a of the elongated metal plate 64 further develops. As shown in FIG. 20, a merged portion 43 where the two adjacent first recesses 30 are merged with each other is separated from the resist pattern 65a, and the erosion by the etching process develops also in the normal direction (thickness direction) of the metal plate 64 at the merged portion 43 below the resist pattern 65a. Thus, the merged portion 43, which is sharpened toward the one side along the normal direction of the deposition mask, is etched from the one side along the normal direction of the deposition mask, so that the merged portion 43 is chamfered as shown in FIG. 20. Thus, the inclination angle $\theta 1$, which is defined by the wall surface 31 of the first recess 30 with respect to the normal direction of the deposition mask, can be increased.

In this manner, the erosion of the first surface 64a of the elongated metal plate 64 by the etching process develops in the whole area forming the effective area 22 of the elongated metal plate 64. Thus, a maximum thickness Ta along the normal direction of the elongated metal plate 64, in the area forming the effective area 22, becomes smaller than a maximum thickness Tb of the elongated metal plate 64 before being etched.

When the etching process from the side of the first surface 64a of the elongated metal plate 64 develops by a preset amount, the second etching process to the elongated metal plate 64 is ended. At this time, the first recess 30 extends in the thickness direction of the elongated metal plate 64 up to a position where it reaches the second recess 35, whereby the through-hole 25 is formed in the elongated metal plate 64 by means of the first recess 30 and the second recess 35 that are in communication with each other.

In the second etching step for forming the first recess 30 in the first surface 64a of the elongated metal plate 64, the etching condition may be differed depending on a position of the elongated metal plate 64 in the width direction D2. For example, a position of the nozzle for injecting the etchant (a distance from a distal end up to the first surface 64a of the elongated metal plate 64) and/or a pressure of the etchant to be injected may be differed depending on a position of the elongated metal plate 64 in the width direction D2. Thus, even when the plate thickness of the elongated metal plate 64 varies in the width direction D2, it can be restrained that the through-holes 25 formed in positions of different plate thickness differ in dimension and shape.

Figure 21:
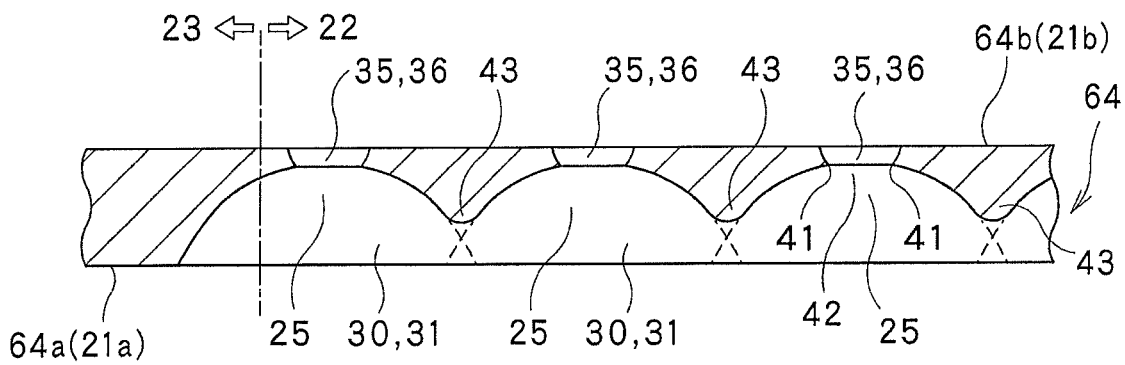
FIG. 21 is a view for explaining an example of the method of manufacturing the deposition mask, showing the elongated metal plate in a section along the normal direction.

After that, as shown in FIG. 21, the resin 69 is removed from the elongated metal plate 64. For example, the resin 69 can be removed by using an alkali-based peeling liquid. When the alkali-based peeling liquid is used, as shown in FIG. 21, the resist patterns 65a and 65b are removed simultaneously with the removal of the resin 69. However, after the removal of the resin 69, the resist patterns 65a and 65b may be removed separately from the resin 69.

The elongated metal plate 64 having a lot of through-holes 25 formed therein is transported to a cutting apparatus (cutting means) 73 by the transport rollers 72, 72 which are rotated while sandwiching therebetween the elongated metal plate 64. The above-described supply core 61 is rotated through a tension (tensile stress) that is applied by the rotation of the transport rollers 72, 72 to the elongated metal plate 64, so that the elongated metal plate 64 is supplied from the winding body 62.

Thereafter, the elongated metal plate 64 in which a lot of recesses 30, 35 are formed is cut by the cutting apparatus (cutting means) 73 to have a predetermined length and a predetermined width, whereby the sheet-like metal plates 21 having a lot of through-holes 25 formed therein can be obtained.

In this manner, the deposition mask 20 formed of the metal plate 21 with a lot of through-holes 25 formed therein can be obtained. According to this embodiment, the first surface 21a of the metal plate 21 is etched over the whole effective area 22. Thus, the thickness of the effective area 22 of the deposition mask 20 can be reduced, and the outline of the portion 43, where the distal edges 32 of the wall surfaces 31 of the two first recesses 30 formed on the side of the first surface 21a are merged with each other, can have a chamfered shape. As a result, the aforementioned angle $\theta 1$ can be increased, to thereby improve the utilization efficiency of the deposition material and the positional precision of deposition.

In addition, according to this embodiment, due to the aforementioned conditions (1) and (2), in the step of manufacturing the deposition masks 20, there is used the elongated metal plate 64 whose variation in plate thickness is a predetermined value or less both in the longitudinal direction D1 and the width direction D2. Thus, it can be restrained that the dimension of the through-hole 25 of the deposition mask 20 varies depending on a position of the elongated metal plate 64 to which the deposition mask is assigned. Thus, the high-quality deposition masks 20 can be stably manufactured.

(Deposition Method)

Next, a method of depositing the deposition material onto the glass substrate 92 by using the obtained deposition mask 20 is described. As shown in FIG. 2, the deposition mask 20 is firstly brought into tight contact with the substrate 92. At this time, the second surface 20b of the deposition mask 20 may be brought into right contact with the surface of the substrate 92. In addition, as shown in FIG. 1, the deposition masks 20 are attached to the frame 15 in a taut state, so that the surface of each deposition mask 20 is in parallel with the surface of the glass substrate 92. Thereafter, by heating the deposition material 98 in the crucible 94, the deposition material 98 is evaporated or sublimated. The evaporated or sublimated deposition material 98 adheres to the glass substrate 92 through the through-holes 25 in the deposition masks 20. As a result, a layer of the deposition material 98 is formed on the surface of the glass substrate 92 in a desired pattern corresponding to the positions of the through-holes 25 of the deposition masks 20.

According to this embodiment, due to the aforementioned conditions (1) and (2), a variation in dimension of the through-holes 25 of the deposition mask 20 is restrained. Thus, when pixels of an organic EL display device is formed by a deposition process, a dimensional precision of the pixels of the organic EL display device can be improved. Thus, a highly fine organic EL display device can be manufactured.

In this embodiment, the first surface 21a of the metal plate 21 is etched over the whole effective area 22. However, not limited thereto, the first surface 21a of the metal plate 21 may be etched only over a part of the effective area 22.

Figure 22:
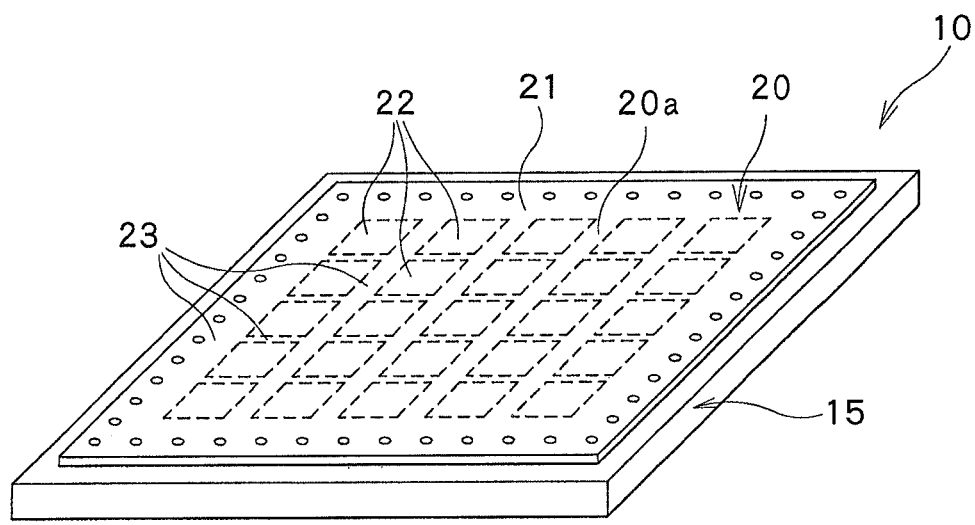
FIG. 22 is a view showing a modification example of the deposition mask apparatus including a deposition mask.

In addition, in this embodiment, a plurality of the deposition masks 20 is assigned in the width direction of the elongated metal plate 64. In addition, in the deposition step, the plurality of deposition masks 20 is mounted on the frame 15. However, not limited thereto, as shown in FIG. 22, there may be used deposition masks 20 having a plurality of the effective areas 22 arranged like a grid along both the width direction and the longitudinal direction of the metal plate 21. Also in this case, by using the elongated metal plate 64 that satisfies the aforementioned conditions (1) and (2), it can be restrained that the dimension of the through-hole 25 of the deposition mask 20 varies depending on a position on the elongated metal plate 64.

In the above description, the inspection step of inspecting the elongated metal plate 64 based on the aforementioned conditions (1) and (2) is performed for the selection of an elongated metal plate 64. However, the method of utilizing the conditions (1) and (2) is not limited to the above embodiment.

For example, the aforementioned conditions (1) and (2) may be utilized for optimizing a condition for manufacturing the elongated metal plate 64, such as a rolling condition and an annealing condition. Specifically, the conditions (1) and (2) may be used for the following operation. Namely, elongated metal plates 64 are manufactured under various rolling conditions and various annealing conditions, and plate thicknesses of the obtained elongated metal plates 64 are measured. Then, by comparing the measurement results with the conditions (1) and (2), a suitable rolling condition and a suitable annealing condition that satisfy the conditions (1) and (2) are determined. In this case, it is not necessary that all the elongated metal plates 64 obtained in the actual manufacturing step are subjected to the selection based on the conditions (1) and (2). For example, only some of the elongated metal plates 64 may be subjected to a sampling inspection related to the conditions (1) and (2). Alternatively, once a manufacturing condition such as a rolling condition and an annealing condition has been determined, the inspection related to the conditions (1) and (2) may not be performed at all. In addition, when the elongated metal plate 64 is manufactured by utilizing a plating process, the conditions (1) and (2) may be utilized for determining a suitable plating condition.

Figure 37:
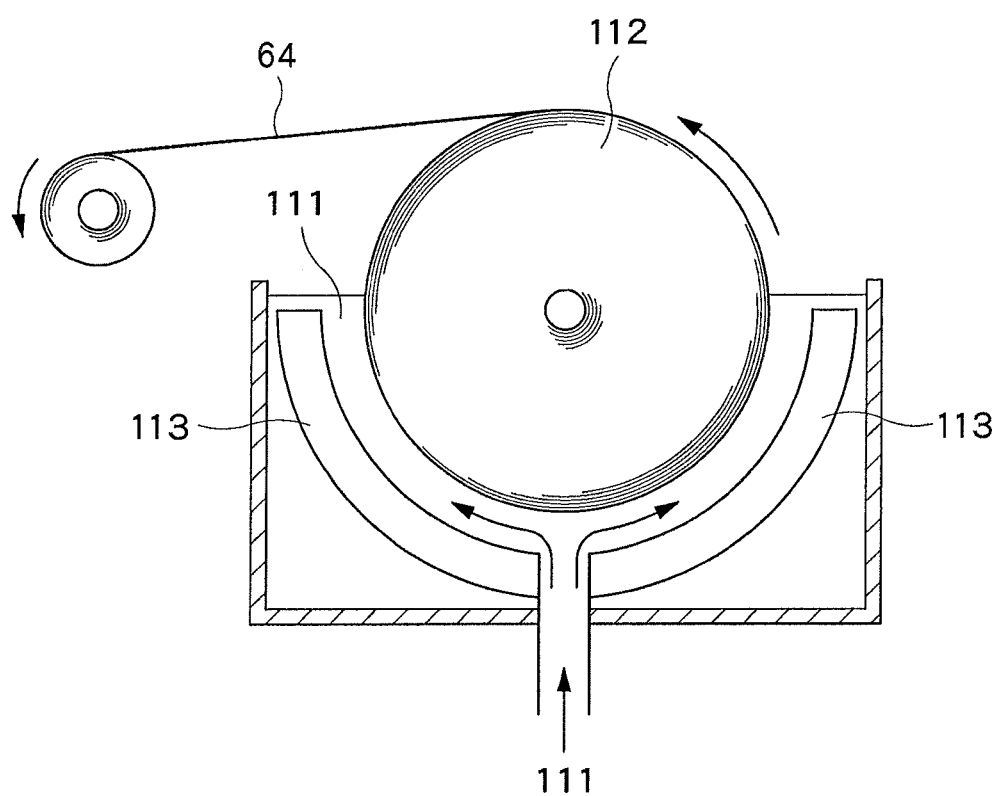
FIG. 37 is a view showing a film forming apparatus for manufacturing a metal plate by a plating process.

In addition, in the above embodiment, a metal plate having a desired thickness is obtained by rolling a base metal. However, the way of obtaining a metal plate is not limited to rolling method. A metal plate having a desired thickness may be manufactured by a film forming step utilizing a plating process. In the film forming step, as shown in FIG. 37, for example, while a drum 112 made of stainless, which is partially immersed in a plating liquid 11 to function as a first electrode, is rotated oppositely to a second electrode 113, a plating film is formed on a surface of the drum 112. By peeling the plating film, the elongated metal plate 64 can be manufactured in a roller-to-roller manner. When a metal plate is manufactured of an iron alloy containing nickel, a mixture solution of a solution containing a nickel compound and a solution of an iron compound may be used as a plating liquid. For example a mixture solution of a solution containing nickel sulfamate and a solution containing iron sulfamate may be used, for example. An additive such as malonic acid or saccharin may be contained in the plating liquid.

The above annealing step may be performed to the metal plate obtained by utilizing a plating process. In addition, after the annealing step, there may be performed the aforementioned cutting step for cutting off both ends of the metal plate, so as to adjust the width of the metal plate into a desired width.

Also when a metal plate is manufactured by utilizing a plating process, similarly to the aforementioned embodiment, the deposition mask 20 having a plurality of the through-holes 25 formed therein can be obtained by subsequently performing a step of forming the resist patterns 65a and 65b and a step of etching the first surface and the second surface of the metal plate.

Also when a metal plate is manufactured by utilizing a plating process, similarly to the case in which a metal plate is manufactured by rolling a base metal, a plate thickness t of the metal plate is not uniform, and more or less varies. For example, the thickness of the metal plate may vary depending on a position, because of a variation in shape and position of an electrode for depositing a plating film (such as the above drum) and of flowage of plating liquid. Thus, in accordance with the variation in plate thickness of the metal plate, the shape of the through-hole 25 to be formed is considered to vary. Thus, also when a metal plate is manufactured by utilizing a plating process, selection of metal plate and manufacturing conditions can be optimized by utilizing the aforementioned conditions (1) and (2).

Similarly to the case in which a metal plate is manufactured by rolling a base metal, when a metal plate is manufactured by utilizing a plating process, the aforementioned conditions (1) and (2) are effective when an average value of the plate thicknesses of the elongated metal plate 64 in the longitudinal direction D1 is within a ±3% range around a predetermined value. Thus, also when a plating step in which a metal plate is manufactured by utilizing a plating process, a feedback control may be performed such that an average value of the plate thicknesses of the elongated metal plate 64 in the longitudinal direction is included within a ±3% range around a predetermined value, as described later.

An amount of a metal deposited by an electrolytic plating process is determined depending on a current density of a current flowing through an electrode, a plating liquid concentration, and a plating period of time. Thus, by maintaining constant a current density and a plating liquid concentration, for example, a variation in amount of metal to be deposited per unit time can be restrained, so that an average value of the plate thicknesses of the elongated metal plate 64 in the longitudinal direction D1 can be within a ±3% range around a predetermined value. As a method of maintaining constant a plating liquid concentration, it is possible to employ a feedback control in which a plating liquid concentration is measured, and new plating liquid is added based on a measurement result. It goes without saying that a feedback control based on another measurement result can be suitably employed.

EXAMPLES

Next, the present invention is described in more detail based on examples, and the present invention is not limited to the below description of the examples unless the present invention departs from its spirit.

Example 1

($11^{th}$ Winding Body and $11^{th}$ Mask)

There was conducted a test for confirming that the aforementioned condition (1) is effective. To be specific, a base metal made of an iron alloy containing nickel was prepared. Then, by performing the above-described rolling step, the slitting step, the annealing step and the cutting step were performed to the base metal, a winding body ($11^{th}$ winding body) formed of a wound elongated metal plate was manufactured. A target specification value of a plate thickness of the elongated metal plate was 20 μm.

To be specific, there were performed the first rolling step in which the first hot rolling step and the first cold rolling step were performed in this order, then the first slitting step in which both ends of the elongated metal plate were cut over a range not less than 3 mm and not more than 5 mm, and the first annealing step in which the elongated metal plate was continuously annealed at a temperature range between 400-600° C. for 40-100 seconds. Further, the elongated metal plate having been subjected to the first annealing step was subjected to the second rolling step including the second cold rolling step, then the second slitting step in which both ends of the elongated metal plate were cut over a range not less than 3 mm and not more than 5 mm, and the second annealing step in which the elongated metal plate was continuously annealed at a temperature range between 400-600° C. for 40-100 seconds. Thus, the elongated metal plate having a length of about 400 m and a width of about 600 mm was obtained. After that, there was performed a cutting step in which both ends of the elongated metal plate in the width direction were cut off over a predetermined range, whereby the width of the elongated metal plate was finally adjusted to a predetermined width, specifically, a width of 500 mm.

In the above cold rolling step, a pressure adjustment using a backup roller was performed. To be specific, a shape and a pressure of a backup roller of a rolling machine were adjusted such that the elongated metal plate had a symmetric shape in the right and left direction. The cold rolling step was performed while cooling the elongated metal plate using rolling oil such as coal oil. After the cold rolling step, there was performed a cleaning step in which the elongated metal plate was cleaned with a hydrocarbon-based cleaning liquid. After the cleaning step, the above-described slitting step was performed.

Thereafter, the plate thickness of the elongated metal plate at the central portion in the width direction was measured along the longitudinal direction at many points. An interval between the measurement points of the elongated metal plate 64 in the longitudinal direction D1 was within a range between 50-500 mm. As a measuring apparatus, there was used a wavelength-dispersive type XRF apparatus which was configured to in-line measure the plate thickness of the elongated metal plate in a production line where the rolling step was performed. An average value (represented sometimes as a symbol A herebelow) of the plate thicknesses of the elongated metal plate in the longitudinal direction was 20.0 μm and a value (represented sometimes as a symbol 36 or B) obtained by multiplying a standard deviation of the plate thicknesses of the elongated metal plate in the longitudinal direction by 3 was 0.2 μm.

Next, a deposition mask 20 (referred to as 11$^{th}$ mask herebelow) having a number of through-holes formed therein was manufactured by using the elongated metal plate of the above 11$^{th}$ winding body. To be specific, five 11$^{th}$ masks were assigned along the width direction D2 of the elongated metal plate and a number of (at least ten) 11$^{th}$ masks were assigned along the longitudinal direction D1 of the elongated metal plate, whereby at least fifty 11$^{th}$ masks were manufactured. A target specification value of a dimension of the through-hole in each 11$^{th}$ mask was 30 μm×30 μm.

Figure 23:
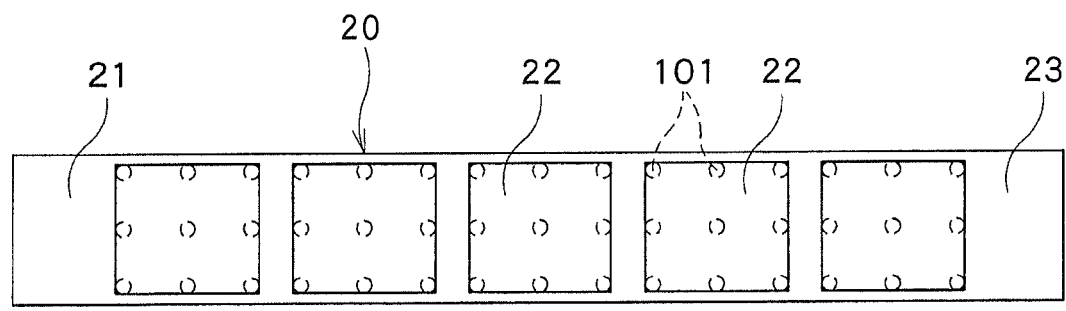
FIG. 23 is a view showing measurement points at which dimensions of through-holes formed in the deposition mask are measured.

Next, dimensions of the through-holes in ten 11$^{th}$ masks, which were assigned to the central portion in the width direction D2 of the elongated metal plate, out of a lot of manufactured 11$^{th}$ masks, was measured. The number of measurement points at which the dimension of the through-hole in each 11$^{th}$ mask 20 was 45. To be specific, as shown in FIG. 23, in each of the five effective areas arranged in the longitudinal direction of the 11$^{th}$ mask (deposition mask 20), the dimension of the through-hole 25 was measured at 9 points. As shown in FIG. 23, for example, the nine measurement points 101 were uniformly distributed in the central portion and the end portion of the effective area 22.

In the method of measuring the dimension of the through-hole, the 11$^{th}$ mask and a substrate were firstly prepared, and light was emitted from a first surface side to the 11$^{th}$ mask. At this time, a light irradiation area, which was irradiated with light having passed through the through-hole of the 11$^{th}$ mask, was formed on the substrate. A dimension of the light irradiation area was measured as the dimension of the through-hole.

Dimensions of the through-holes in the ten 11$^{th}$ masks were measured at 450 points in total, and a variation in dimension of the through-holes (a value obtained by multiplying a standard deviation of the dimensions by 3) was calculated. The variation in dimension of the through-holes was 1.5 μm.

(12$^{th}$ to 17$^{th}$ Winding Bodies and 12$^{th}$ to 17$^{th}$ Masks)

Similarly to the case of the 11$^{th}$ winding body, 12$^{th}$ to 17$^{th}$ winding bodies were manufactured using a base metal made of an iron alloy containing nickel. A target specification value of elongated metal plate of the 12$^{th}$ to 17$^{th}$ winding bodies was 20 μm. Similarly to the case of the 11$^{th}$ winding body, a plate thickness of the elongated metal plate at the central portion in the width direction was measured along the longitudinal direction at many points. Further, similarly to the case of the 11$^{th}$ winding body, deposition masks (referred to as 12$^{th}$ to 17$^{th}$ mask herebelow) having a lot of through-holes formed therein were manufactured by using the elongated metal plates of the 12$^{th}$ to 17$^{th}$ winding bodies. In addition, similarly to the case of the 11$^{th}$ mask, the dimensions of the through-holes were measured. FIG. 24(a) shows an average value A and a variation B in plate thickness of the elongated metal plates of the 12$^{th}$ to 17$^{th}$ winding bodies in the longitudinal direction, in addition to an average value A and a variation B in plate thickness of the elongated metal plate of the 11$^{th}$ winding body in the longitudinal direction. In addition, FIG. 25(a) shows a variation in dimension of through-holes in the 12$^{th}$ to 17$^{th}$ masks, in addition to a variation in dimension of the through-holes in the 11$^{th}$ mask.

As shown in FIGS. 24(a), the 11$^{th}$ to 15$^{th}$ winding bodies satisfied the aforementioned condition (1). Namely, a percentage of a value obtained by dividing the variation (A) in plate thickness in the longitudinal direction by the average value A of the plate thicknesses in the longitudinal direction was 5% or less. On the other hand, the 16$^{th}$ and the 17$^{th}$ winding bodies did not satisfy the aforementioned condition (1). In addition, as shown in FIG. 25(a), in the 11$^{th}$ to the 15$^{th}$ masks obtained from the elongated metal plates of the 11$^{th}$ to 15$^{th}$ winding bodies, a variation in dimension of the through-holes was restrained to 2.0 μm or less. On the other hand, in the 16$^{th}$ and the 17$^{th}$ masks obtained from the elongated metal plates of the 16$^{th}$ and the 17$^{th}$ elongated metal plates, a variation in dimension of the through-holes was over 2.0 μm.

In order to manufacture an organic EL display device having a pixel density of 450 ppi or more, a variation in dimension of the through-holes in the deposition mask 20 is preferably 2.0 μm or less. As can be understood from FIGS. 24(a) and 25(a), in this embodiment, as long as the aforementioned condition (1) was satisfied, it was possible to manufacture a deposition mask having through-holes whose variation in dimension in the longitudinal direction is restrained in an allowable range. Namely, it can be considered that the aforementioned condition (1) is an important judging method of selecting an elongated metal plate.

Example 2

Similarly to the case of Example 1, $21^{st}$ to $27^{th}$ winding bodies were manufactured, except that a target specification value of a plate thickness of an elongated metal plate was 25 µm. In addition, similarly to the case of Example 1, $21^{st}$ to $27^{th}$ masks were manufactured by using the elongated metal plates of the $21^{st}$ to the $27^{th}$ winding bodies, except that a target specification value of a dimension of a through-hole was 40×40 µm. In addition, similarly to the case of Example 1, a plate thickness of the elongated metal plates of the $21^{st}$ to the $27^{th}$ winding bodies at the central portion in the width direction was measured along the longitudinal direction at many points. In addition, similarly to the case of Example 1, dimensions of the through-holes in the $21^{st}$ to the $27^{th}$ mask were measured. FIG. 24(b) shows an average value A and a variation B in plate thickness in the longitudinal direction of the elongated metal plates of the $21^{st}$ to the $27^{th}$ elongated metal plates. In addition, FIG. 25(b) shows a variation in dimension of the through-holes in the $21^{st}$ to the $27^{th}$ masks.

As shown in FIG. 24(b), the $21^{st}$ to the $25^{th}$ winding bodies satisfied the aforementioned condition (1). On the other hand, the $26^{th}$ and the $27^{th}$ winding bodies did not satisfy the aforementioned condition (1). In addition, as shown in FIG. 25(b), in the $21^{st}$ to the $25^{th}$ masks obtained from the elongated metal plates of the $21^{st}$ to the $25^{th}$ winding bodies, a variation in dimension of the through-holes was restrained to 2.0 µm or less. On the other hand, in the $26^{th}$ and the $27^{th}$ masks obtained from the elongated metal plates of the $26^{th}$ and the $27^{th}$ elongated metal plates, a variation in dimension of the through-holes was over 2.0 µm. Namely, also when the target specification value of the plate thickness of the elongated metal plate is 25 µm, it can be said that the aforementioned condition (1) is an important judging method of selecting an elongated metal plate.

Example 3

Similarly to the case of Example 1, $31^{st}$ to $37^{th}$ winding bodies were manufactured, except that a target specification value of a plate thickness of an elongated metal plate was 40 µm. In addition, similarly to the case of Example 1, $31^{st}$ to $37^{th}$ masks were manufactured by using the elongated metal plates of the $31^{st}$ to the $37^{th}$ winding bodies, except that a target specification value of a dimension of a through-hole was 60×60 µm. In addition, similarly to the case of Example 1, a plate thickness of the elongated metal plates of the $31^{st}$ to the $37^{th}$ winding bodies at the central portion in the width direction was measured along the longitudinal direction at many points. In addition, similarly to the case of Example 1, dimensions of the through-holes in the $31^{st}$ to the $37^{th}$ mask were measured. FIG. 24(c) shows an average value A and a variation B in plate thickness in the longitudinal direction of the elongated metal plates of the $31^{st}$ to the $37^{th}$ elongated metal plates. In addition, FIG. 25(c) shows a variation in dimension of the through-holes in the $31^{st}$ to the $37^{th}$ masks.

As shown in FIGS. 24(c), the $31^{st}$ to the $35^{th}$ winding bodies satisfied the aforementioned condition (1). On the other hand, the $36^{th}$ and the $37^{th}$ winding bodies did not satisfy the aforementioned condition (1). In addition, as shown in FIG. 25(c), in the $31^{st}$ to the $35^{th}$ masks obtained from the elongated metal plates of the $31^{st}$ to the $35^{th}$ winding bodies, a variation in dimension of the through-holes was restrained to 2.0 µm or less. On the other hand, in the $36^{th}$ and the $37^{th}$ masks obtained from the elongated metal plates of the $36^{th}$ and the $37^{th}$ elongated metal plates, a variation in dimension of the through-holes was over 2.0 µm. Namely, also when the target specification value of the plate thickness of the elongated metal plate is 40 µm, it can be said that the aforementioned condition (1) is an important judging method of selecting an elongated metal plate.

Example 4

There was conducted a test to know a range in which the aforementioned condition (1) is effective. The range means a deviation degree of an average plate thickness of an elongated metal plate in the longitudinal direction D1 from a target specification value. To be specific, as shown in FIG. 26(a), there were prepared $41^{st}$ to $47^{th}$ winding bodies each having an average plate thickness in the order of 20 µm as a target specification value. At this time, as shown in FIG. 26(a), there were selected winding bodies whose variation in plate thickness of an elongated metal plate in the longitudinal direction D1 was close to an upper limit of the aforementioned condition (1), specifically, a percentage of a value obtained by dividing a variation B in plate thickness by an average value of the plate thicknesses A (plate-thickness variation B/plate-thickness average value A×100 (%)) was about 5%. FIG. 26(a) shows an average plate thickness A of the elongated metal plates of the $41^{st}$ to the $47^{th}$ winding bodies in the longitudinal direction D1, a variation B in plate thickness of the elongated metal plates of the $41^{st}$ to the $47^{th}$ winding bodies in the longitudinal direction D1, and (B/A)×100(%). In addition, FIG. 26(a) shows a value of $\{(A-20)/20\} \times 100(\%)$ which shows a deviation of the average plate thickness of an elongated metal plate in the longitudinal direction D1 from the target specification value.

In addition, similarly to the case of Example 1, $41^{st}$ to $47^{th}$ masks were manufactured by using the elongated metal plates of the $41^{st}$ to $47^{th}$ winding bodies. Further, dimensions of through-holes in the $41^{st}$ to the $47^{th}$ masks were measured. FIG. 27(a) shows a variation in dimension of the through-holes in the $41^{st}$ to the $47^{th}$ masks. As described above with reference to FIG. 8A, when the plate thickness of an elongated metal plate is smaller than a target specification value, the portion 43 having a steep shape, i.e., the top portion 43a possibly remains between the distal edges 32 of the wall surfaces 31 of the first recesses 30 of the adjacent two through-holes 25. FIG. 27(a) also shows a maximum value of a width of the top portion 43a, when such a top portion 43a was observed. In order to manufacture an organic EL display device having a pixel density of 450 ppi or more, it is preferable that no top portion 43a of the deposition mask 20 exits, or otherwise it is preferable that the width of the top portion 43a is 2.0 µm or less.

As shown in FIG. 27(a), in the $42^{nd}$ to the $46^{th}$ masks, the variation in dimension of the through-holes was restrained to 2.0 µm or less, and the width of the top portion was restrained to 2.0 µm or less. As shown in FIG. 26(a), in the $42^{nd}$ to the $46^{th}$ winding bodies used for manufacturing the $42^{nd}$ to the $46^{th}$ masks, the deviation of the average plate thickness of the elongated metal plate in the longitudinal direction D1 from the target specification value was within a range between −3%-+3%.

On the other hand, as shown in FIG. 27(a), in the $41^{st}$ mask, the width of the top portion was over 2.0 µm. In addition, in the 41$^{st}$ winding body used for manufacturing the 41$^{st}$ mask, the deviation of the average plate thickness of the elongated metal plate in the longitudinal direction D1 from the target specification value was out of the range between −3%−+3%.

As shown in FIG. 27(a), in the 47$^{th}$ mask, the variation in dimension of the through-holes was over 2.0 μm. In the 47$^{th}$ winding body used for manufacturing the 47$^{th}$ mask, the deviation of the average plate thickness of the elongated metal plate in the longitudinal direction D1 from the target specification value was out of the range between −3%−+3%.

From these results, it can be said that, in order that the aforementioned condition (1) effectively functions, the deviation of the average plate thickness of the elongated metal plate in the longitudinal direction D1 from the target specification value needs to be within the range between −3%−+3%.

Example 5

Similarly to the case of Example 4, 51$^{st}$ to 57$^{th}$ winding bodies were prepared, except that a target specification value of a plate thickness of an elongated metal plate was 25 μm. In addition, similarly to the case of Example 4, 51$^{st}$ to 57$^{th}$ masks were manufactured by using the elongated metal plates of the 51$^{st}$ to the 57$^{th}$ winding bodies, except that a target specification value of a dimension of a through-hole was 40 μm×40 μm. In addition, similarly to the case of Example 4, a plate thickness of the elongated metal plates of the 51$^{st}$ to the 57$^{th}$ winding bodies at the central portion in the width direction was measured along the longitudinal direction at many points. In addition, similarly to the case of Example 4, the dimensions of the through-holes in the 51$^{st}$ to the 57$^{th}$ masks and the widths of the top portions thereof were measured. FIG. 26(b) shows an average value A and a variation B in plate thickness in the longitudinal direction of the elongated metal plates of the 51$^{st}$ to the 57$^{th}$ winding bodies. FIG. 26(b) also shows a value of $\{(A-25)/25\} \times 100$ (%) which shows a deviation of the average plate thickness of the elongated metal plate in the longitudinal direction D1 from the target specification value. In addition, FIG. 27(b) shows a variation in dimension of the through-holes in the 51$^{st}$ to the 57$^{th}$ masks, and a maximum dimension of the top portion.

As shown in FIG. 27(b), in the 52$^{nd}$ to 55$^{th}$ masks, the variation in dimension of the through-holes was restrained to 2.0 μm, and the width of the top portion was restrained to 2.0 μm. In addition, as shown in FIG. 26(b), in the 52$^{nd}$ to 55$^{th}$ winding bodies used for manufacturing the 52$^{nd}$ to 55$^{th}$ masks, the deviation of the average plate thickness of the elongated metal plate in the longitudinal direction D1 from the target specification value was within a range between −3%−+3%.

On the other hand, as shown in FIG. 27(b), in the 51$^{st}$ mask, the width of the top portion was over 2.0 μm. In addition, in the 51$^{st}$ winding body used for manufacturing the 51$^{st}$ mask, the deviation of the average plate thickness of the elongated metal plate in the longitudinal direction D1 from the target specification value was out of a range between −3%−+3%.

As shown in FIG. 27(b), in the 56$^{th}$ and the 57$^{th}$ mask, the variation in dimension of the through-holes was over 2.0 μm. In addition, in the 56$^{th}$ and the 57$^{th}$ winding bodies used for manufacturing the 56$^{th}$ and the 57$^{th}$ masks, the deviation of the average plate thickness of the elongated metal plate in the longitudinal direction D1 from the target specification value was out of a range between −3%−+3%.

From these results, also when the target specification value of the plate thickness of the elongated metal plate is 25 μm, in order that the aforementioned condition (1) effectively functions, it can be said that the deviation of the average plate thickness of the elongated metal plate in the longitudinal direction D1 from the target specification value needs to be within a range between −3%−+3%.

Example 6

Similarly to the case of the above Example 4, 61$^{st}$ to 67$^{th}$ winding bodies were prepared, except that a target specification value of a plate thickness of an elongated metal plate was 40 μm. In addition, similarly to the case of the above Example 4, 61$^{st}$ to 67$^{th}$ masks were manufactured by using the elongated metal plates of the 61$^{st}$ to the 67$^{th}$ winding bodies, except that a target specification value of a dimension of a through-hole was 60 μm×60 μm. In addition, similarly to the case of Example 4, a plate thickness of the elongated metal plates of the 61$^{st}$ to the 67$^{th}$ winding bodies at the central portion in the width direction were measured along the longitudinal direction at many points. In addition, similarly to the case of Example 4, the dimensions of the through-holes in the 61$^{st}$ to the 67$^{th}$ masks and the widths of the top portions thereof were measured. FIG. 26(c) shows an average value A and a variation B in plate thickness in the longitudinal direction of the elongated metal plates of the 61$^{st}$ to the 67$^{th}$ winding bodies. FIG. 26(c) also shows a value of $\{(A-40)/40\} \times 100$(%) which shows a deviation of the average plate thickness of the elongated metal plate in the longitudinal direction D1 from the target specification value. In addition, FIG. 27(c) shows a variation in dimension of the through-holes in the 61$^{st}$ to the 67$^{th}$ masks, and a maximum dimension of the top portion.

As shown in FIGS. 27(c), in the 62$^{nd}$ to the 65$^{th}$ masks, the variation in dimension of the through-holes was restrained to 2.0 μm, and the width of the top portion was restrained to 2.0 μM. As shown in FIG. 26(c), in the 62$^{nd}$ to the 65$^{th}$ winding bodies used for manufacturing the 62$^{nd}$ to the 65$^{th}$ masks, the deviation of the average plate thickness of the elongated metal plate in the longitudinal direction D1 from the target specification value was within a range between −3%−+3%.

On the other hand, as shown in FIG. 27(c), in the 61$^{st}$ mask, the width of the top portion was over 2.0 μM. In the 61$^{st}$ winding body used for manufacturing the 61$^{st}$ mask, the deviation of the average plate thickness of the elongated metal plate in the longitudinal direction D1 from the target specification value was out of a range between −3%−+3%.

In addition, as shown in FIG. 27(c), in the 66$^{th}$ and the 67$^{th}$ masks, the deviation in dimension of the through-holes was over 2.0 μm. In addition, in the 66$^{th}$ and the 67$^{th}$ winding bodies used for manufacturing the 66$^{th}$ and the 67$^{th}$ masks, the deviation of the average plate thickness of the elongated metal plate in the longitudinal direction D1 from the target specification value was out of a range between −3%−+3%.

From these results, also when the target specification value of the plate thickness of the elongated metal plate is 40 μm, in order that the aforementioned condition (1) effectively functions, it can be said that the deviation of the average plate thickness of the elongated metal plate in the longitudinal direction D1 from the target specification value needs to be within a range between −3%−+3%.

Example 7

There was conducted a test for confirming that the aforementioned condition (2) is effective. To be specific, as shown in FIG. 29(a), there were prepared $71^{st}$ to $79^{th}$ winding bodies each having an average thickness which deviated from 20 μm as a target specification value by about 3%. At this time, as shown in FIG. 29(a), there were selected winding bodies whose variation in thickness of an elongated metal plate in the longitudinal direction D1 was close to the upper limit of the aforementioned condition (1), specifically, a percentage of a value obtained by dividing the variation B in plate thickness by the average value of the plate thicknesses A (plate-thickness variation B/plate-thickness average value A×100(%)) was about 5%.

Figure 28:
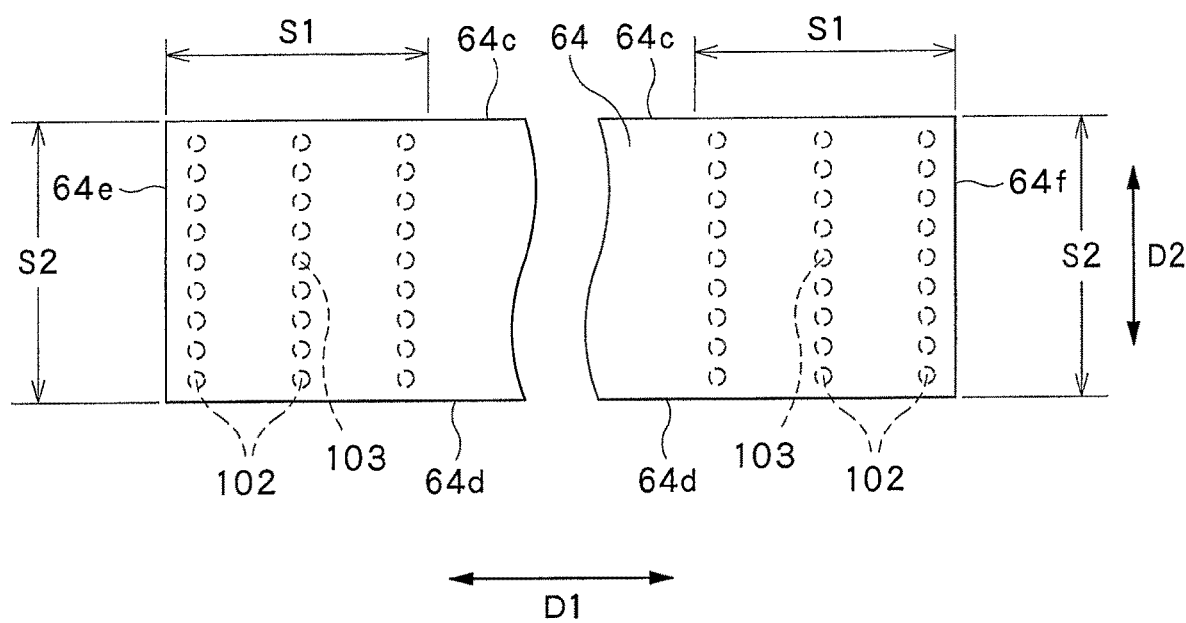
FIG. 28 is a view showing measurement points at which plate thicknesses of an elongated metal plate are measured.

A plate thickness of the elongated metal plates of the $71^{st}$ to the $79^{th}$ winding bodies was measured along the width direction at a plurality of points. To be specific, as shown in FIG. 28, the plate thickness was measured at measurement points 102 the number of which was 27, in a predetermined area near a first end portion 64e in the longitudinal direction D1 of the elongated metal plate 64. These measurement points 102 are located in a predetermined area that is defined near the first end portion 64e, for example, by a range of a distance S1 in the longitudinal direction D1 and by a range of a distance S2 in the width direction D2. Herein, the distance S1 and the distance S2 were set to be 500 mm. The measurement points 102 were determined as intersections between nine imaginary lines extending on the elongated metal plate 64 along the longitudinal direction D1 and three imaginary lines extending on the elongated metal plate 64 along the width direction D2. In FIG. 28, a measurement point of the plurality of measurement points 102, which is located at the central portion of the elongated metal plate 64 in the width direction D2, is shown by a symbol 103. The measurement point 103 is a point that is located at the central portion of the range of the distance S2 in the width direction D2. The measurement point 103 is also a point that is located at the central portion of the range of the distance S1 in the longitudinal direction D1.

In this embodiment, as shown in FIG. 28, a plate thickness of the elongated metal plate 64 was measured not only at the twenty seven measurement points 102 in the predetermined area near the first end portion 64e, but also at the similar twenty seven measurement points 102 in a predetermined area near a second end portion 64f in the longitudinal direction D1 of the elongated metal plate 64. Then, a variation in plate thickness in the predetermined area near the first end portion 64e (value obtained by multiplying a standard deviation by 3), and a variation in plate thickness in the predetermined area near the second end portion 64f (value obtained by multiplying a standard deviation by 3) were respectively calculated. A greater one of the calculated deviations in plate thickness is shown in FIG. 29(a) as "deviation C in plate thickness in width direction D2". In addition, FIG. 29(a) shows, as "plate thickness X at central portion in the width direction D2", a value of the plate thickness of the elongated metal plate 64 at the central measurement point 103 in the width direction D2, which was obtained when the plate thickness of the elongated metal plate 64 was measured at the twenty seven measurement points 102 along the width direction D2, in order to calculate a standard deviation of the plate thicknesses of the elongated metal plate 64 in the width direction D2.

In addition, similarly to the case of Example 1, deposition masks (referred to as $71^{st}$ to $79^{th}$ masks herebelow) having a number of through-holes formed therein were manufactured by using the elongated metal plates of the $71^{st}$ to the $79^{th}$ winding bodies. At this time, in order that a deviation in dimension of the through-holes in the deposition mask, which is caused by a deviation in plate thickness of the elongated metal plate in the width direction, could be restrained as much as possible, positions of a plurality of nozzles for injecting etchant, which were arranged along the width direction of the elongated metal plate, were suitably adjusted. In addition, dimensions of the through-holes in the $71^{St}$ to the $79^{th}$ masks were measured. In this example, 10 sets of five masks assigned along the width direction were taken out along the longitudinal direction from the elongated metal plate of a number of manufactured deposition masks, and dimensions of the through-holes were measured. Namely, the through-hole dimension measurement was performed with the use of 50 masks for each of the $71^{st}$ to the $79^{th}$ masks. As described above, since the number of measurement points at which dimensions of the through-holes are measured in one mask is 45, the number of N at which the dimensions of the through-holes in the respective $71^{st}$ to the $79^{th}$ masks are measured is 2250. FIG. 30(a) shows calculation results of a deviation in dimension of the through-holes in the $71^{st}$ to $79^{th}$ masks.

As shown in FIG. 29(a), the $71^{st}$, the $72^{nd}$, the $74^{th}$, the $75^{th}$, the $77^{th}$ and the $78^{th}$ winding bodies satisfied the aforementioned condition (2). Namely, a percentage of a value obtained by dividing the deviation C in plate thickness in the width direction D2 by the plate thickness X at the central portion of the width direction D2 was 3% or less. On the other hand, the $73^{rd}$, the $76^{th}$ and the $79^{th}$ winding bodies did not satisfy the aforementioned condition (2). As shown in FIG. 30(a), in the $71^{st}$, the $72^{nd}$, the $74^{th}$, the $75^{th}$, the $77^{th}$ and the $78^{th}$ mask obtained from the elongated metal plates of the $71^{st}$, the $72^{nd}$, the $74^{th}$, the $75^{th}$, the $77^{th}$ and the $78^{th}$ winding bodies, the deviation in dimension of the through-holes was restrained to 2.0 μm or less. On the other hand, in the $73^{rd}$, the $76^{th}$ and the $79^{th}$ masks obtained from the elongated metal plates of the $73^{rd}$, the $76^{th}$ and the $79^{th}$ winding bodies, the deviation in dimension of the through-holes was over 2.0 μm.

In this example, by using the elongated metal plate that satisfied the aforementioned condition (2), it was possible to manufacture a deposition mask having through-holes whose deviation in dimension of the through-holes in the width direction was within the allowable range. Namely, it can be considered that the aforementioned condition (2) is an important judging method of selecting an elongated metal plate.

Example 8

Similarly to the case of above Example 7, $81^{st}$ to $89^{th}$ winding bodies were manufactured, except that a target specification value of a plate thickness of an elongated metal plate was 25 μm. In addition, similarly to the case of above Example 7, $81^{st}$ to $89^{th}$ masks were manufactured by using the elongated metal plates of the $81^{st}$ to the $89^{th}$ winding bodies, except that a target specification value of a dimension of a through-hole was 40 μm×40 μm. In addition, similarly to the case of Example 7, a plate thickness of the elongated metal plates of the $81^{st}$ to $89^{th}$ winding bodies was measured along the width direction at many points. In addition, similarly to the case of Example 7, dimensions of the through-holes in the $81^{st}$ to the $89^{th}$ masks were measured. FIG. 29(b) shows a deviation C in plate thickness of the elongated metal plates of the $81^{st}$ to the $89^{th}$ winding bodies in the width direction, and a plate thickness X at the central portion in the width direction, in addition to an average value A of the plate thicknesses in the longitudinal direction and a deviation B. FIG. 30(b) shows a deviation in dimension of the through-holes in the $81^{st}$ to the $89^{th}$ masks.

As shown in FIG. 29(b), the $81^{st}$, the $82^{nd}$, the $84^{th}$, the $85^{th}$, the $87^{th}$ and the $88^{th}$ winding bodies satisfied the aforementioned condition (2). On the other hand, the $83^{rd}$, the 86th and the $89^{th}$ winding bodies did not satisfy the aforementioned condition (2). As shown in FIG. 30(b), in the $81^{st}$, the $82^{nd}$, the $84^{th}$, the $85^{th}$, the $87^{th}$ and the $88^{th}$ masks obtained from the elongated metal plates of the $81^{st}$, the $82^{nd}$, the $84^{th}$, the $85^{th}$, the $87^{th}$ and the $88^{th}$ winding bodies, the deviation in dimension of the through-holes was restrained to 2.0 µm or less. On the other hand, in the $83^{rd}$, the $86^{th}$ and the $89^{th}$ masks obtained from the elongated metal plates of the $83^{rd}$, the $86^{th}$ and the $89^{th}$ winding bodies, the deviation in dimension of the through-holes was over 2.0 µm. Thus, also when the target specification value of the plate thickness of the elongated metal plate is 25 µm, it can be said that the aforementioned condition (2) is an important judging method of selecting an elongated metal plate.

Example 9

Similarly to the case of the above Example 7, $91^{st}$ to $99^{th}$ winding bodies were manufactured, except that a target specification value of a plate thickness of an elongated metal plate was 40 µm. In addition, similarly to the case of the above Example 7, $91^{st}$ to $99^{th}$ masks were manufactured by using the elongated metal plates of the $91^{st}$ to the $99^{th}$ winding bodies, except that a target specification value of a dimension of a through-hole was 60 µm×60 µm. In addition, similarly to the case of Example 7, dimensions of through-holes in the $91^{st}$ to the $99^{th}$ masks were measured. FIG. 29(c) shows a deviation C in plate thickness of the elongated metal plates of the $91^{st}$ to the $99^{th}$ winding bodies in the width direction and a plate thickness X at the central portion in the width direction, in addition to an average value A and a deviation B in plate thickness in the longitudinal direction. FIG. 30(c) shows a deviation in dimension of the through-holes in the $91^{st}$ to the $99^{th}$ masks.

As shown in FIG. 29(c), the $91^{st}$, the $92^{nd}$, the $94^{th}$, the $95^{th}$, the $67^{th}$ and the $68^{th}$ winding bodies satisfied the aforementioned condition (2). On the other hand, the $93^{rd}$, the $66^{th}$ and the $99^{th}$ winding bodies did not satisfy the aforementioned condition (2). As shown in FIG. 30(c), in the $91^{st}$, the $92^{nd}$, the $94^{th}$, the $95^{th}$, the $97^{th}$ and the $98^{th}$ masks obtained from the elongated metal plates of the $91^{st}$, the $92^{nd}$, the $94^{th}$, the $95^{th}$, the $97^{th}$ and the $98^{th}$ winding bodies, the deviation in dimension of the through-holes was restrained to 2.0 µm or less. On the other hand, in the $93^{rd}$, the $96^{th}$ and the $99^{th}$ masks obtained from the $93^{rd}$, the $96^{th}$ and the $99^{th}$ winding bodies, the deviation in plate thickness of the through-holes was over 2.0 µm. Namely, also when the target specification value of the plate thickness of the elongated metal plate is 40 µm, it can be said that the aforementioned condition (2) is an important judging method of selecting an elongated metal plate.

In the above Examples 1 to 9, the tests for confirming the efficiencies of the aforementioned conditions (1) and (2) were conducted to a metal plate manufactured by rolling a base metal. In the below Examples 11 to 18, tests for confirming the efficiencies of the aforementioned conditions (1) and (2) were conducted to a metal plate manufactured by utilizing a plating process. Except a metal plate manufactured by utilizing a plating process, a target specification value of a plate thickness of the metal plate and a dimension of a through-hole, measurement items and evaluation items in the below-described Examples 10 to 18 are the same as those of the above-described Examples 1 to 9. In the below-described Examples 10 to 18, detailed description of the same part as that of the above-described Examples 1 to 9 is suitably omitted.

Example 10

Similarly to the case of Example 1, there was conducted a test for confirming that the aforementioned condition (1) is effective. Firstly, an elongated metal plate made of an iron alloy containing nickel was manufactured by a plating process, by using, as a plating liquid, a mixed solution of a solution containing nickel sulfamate and a solution containing iron sulfamate. Then, there was performed the cutting step in which both ends of the elongated metal plate in the width direction were cut off over a predetermined range, whereby the width of the elongated metal plate was finally adjusted to a desired width, specifically, to a width of 500 mm. Thereafter, the elongated metal plate was wound, and $101^{st}$ to $107^{th}$ winding bodies were manufactured, similarly to the case of the above Example 1. A target specification value of a plate thickness of the elongated metal plate was 13 µm.

Then, similarly to the case of the above Example 1, a plate thickness of the elongated metal plate at the central portion in the width direction was measured along the longitudinal direction at many points. FIG. 31(a) shows an average value A and a variation B in plate thickness in the longitudinal direction of the plate thicknesses of the elongated meal plates of the $101^{st}$ to the $107^{th}$ winding bodies.

Similarly to the case of the above Example 1, $101^{st}$ to $107^{th}$ masks were manufactured by using the elongated metal plates of the $101^{st}$ to the $107^{th}$ winding bodies, except that a through-hole had a circular shape and that a target specification value of a dimension of the through-hole was 20 µm in diameter. FIG. 32(a) shows a deviation in dimension of the through-holes in the $101^{st}$ to the $107^{th}$ masks.

As shown in FIG. 31(a), the $101^{st}$ to the $105^{th}$ winding bodies satisfied the aforementioned condition (1). Namely, a percentage of a value obtained by dividing the deviation A in plate thickness in the longitudinal direction by the average value A of plate thicknesses in the longitudinal direction was 5% or less. On the other hand, the $106^{th}$ and the $107^{th}$ winding bodies did not satisfy the aforementioned condition (1). In addition, as shown in FIG. 32(a), in the $101^{st}$ to the $105^{th}$ masks obtained from the elongated metal plates of the $101^{st}$ to the $105^{th}$ winding bodies, the deviation in dimension of the through-holes was restrained to 1.5 µm or less. On the other hand, in the $106^{th}$ and the $107^{th}$ masks obtained from the $106^{th}$ and the $107^{th}$ winding bodies, the deviation in dimension of the through-holes was over 1.5 µm. From these results, when a metal plate in which a target specification value of a plate thickness is 13 µm is manufactured by utilizing a plating process, it is considered that the aforementioned condition (1) is an important judging method of selecting an elongated metal plate. In order to manufacture an organic EL display device having a pixel density of 800 ppi or more, it is preferable that a deviation in dimension of through-holes in the deposition mask 20 is 1.5 µm or less.

Example 11

Similarly to the case of the above Example 10, $111^{th}$ to $117^{th}$ winding bodies were manufactured, except that a target specification value of a plate thickness of an elongated metal plate was 20 µm. In addition, $111^{th}$ to $117^{th}$ masks were manufactured by using the elongated metal plates of the $111^{th}$ and the $117^{th}$ winding bodies, except that a target specification value of a dimension of a through-hole was 30 µm in diameter. In addition, similarly to the case of Example 10, a plate thickness of the elongated metal plates of the $111^{th}$ and the $117^{th}$ winding bodies at the central portion in the width direction was measured along the longitudinal direction at many points. Similarly to the case of Example 10, dimensions of through-holes in the $111^{th}$ to the $117^{th}$ masks were measured. FIG. 31(b) shows an average value A and a deviation B in plate thickness of the longitudinal direction of the elongated metal plates of the $111^{th}$ and the $117^{th}$ winding bodies. FIG. 32(b) shows a deviation in dimension of the through-holes in the $111^{th}$ and the $117^{th}$ mask.

As shown in FIG. 31(b), the $111^{th}$ and the $115^{th}$ winding bodies satisfied the aforementioned condition (1). On the other hand, the $116^{th}$ and the $117^{th}$ winding bodies did not satisfy the aforementioned condition (1). As shown in FIG. 32(b), in the $111^{th}$ and the $115^{th}$ masks obtained from the elongated metal plates of the $111^{th}$ and the $115^{th}$ winding bodies, the deviation in dimension of the through-holes was restrained to 2.0 µm. On the other hand, in the $116^{th}$ and the $117^{th}$ mask obtained from the elongated metal plates of the $116^{th}$ and the $117^{th}$ winding bodies, the deviation in dimension of the through-holes was over 2.0 µm. Namely, also when an elongated metal plate in which a target specification value of a plate thickness is 20 µm, it can be said that the aforementioned condition (1) is an important judging method for selecting an elongated metal plate.

Example 12

Similarly to the case of the above Example 10, $121^{st}$ to $127^{th}$ winding bodies were manufactured, except that a target specification value of a plate thickness of an elongated metal plate was 25 µm. In addition, similarly to the case of the above Example 10, $121^{st}$ to $127^{th}$ masks were manufactured by using the elongated metal plates of the $121^{st}$ to the $127^{th}$ winding bodies, except that a target specification value of a dimension of a through-hole was 40 µm in diameter. Similarly to the case of Example 10, a plate thickness of the elongated metal plates of the $121^{st}$ to the $127^{th}$ winding bodies at the central portion in the width direction was measured along the longitudinal direction at many points. Similarly to the case of Example 10, dimensions of through-holes in the $121^{st}$ to the $127^{th}$ masks were measured. FIG. 31(c) shows an average value A and a deviation B in plate thickness in the longitudinal direction of the elongated metal plates of the $121^{st}$ to the $127^{th}$ winding bodies. FIG. 32(c) shows a deviation in dimension of the through-holes in the $121^{St}$ to the $127^{th}$ masks.

As shown in FIG. 31(c), the $121^{st}$ to the $125^{th}$ winding bodies satisfied the aforementioned condition (1). On the other hand, the $126^{th}$ and the $127^{th}$ winding bodies did not satisfy the aforementioned condition (1). As shown in FIG. 32(c), in the $121^{st}$ to the $125^{th}$ masks obtained from the elongated metal plates of the $121^{st}$ to the $125^{th}$, the deviation in dimension of the through-holes was restrained to 2.0 µm or less. On the other hand, in the $126^{th}$ and the $127^{th}$ masks obtained from the elongated metal plates of the $126^{th}$ and the $127^{th}$ winding bodies, the deviation in dimension of the through-holes was over 2.0 µm. Namely, also when an elongated metal plate in which a target specification value of a plate thickness is 25 µm, it can be said that the aforementioned condition (1) is an important judging method for selecting an elongated metal plate.

Example 13

Similarly to the case of the above Example 4, there was conducted a test to a metal plate manufactured by a plating process, to know a range in which the aforementioned condition (1) is effective. The range means a deviation degree of an average plate thickness of an elongated metal plate in the longitudinal direction D1 from a target specification value. To be specific, as shown in FIG. 33(a), similarly to the case of Example 10, there were prepared $131^{st}$ to $137^{th}$ winding bodies each having an average thickness in the order of 13 µm as a target specification value. The $131^{st}$ to the $137^{th}$ winding bodies were manufactured by a plating process. FIG. 33(a) shows an average plate thickness A of an elongated metal plate in the longitudinal direction D1, a variation B in plate thickness of an elongated metal plate in the longitudinal direction D1, and (B/A)×100(%). FIG. 33(a) also shows a value of {(A−13)/13}×100(%) which shows a deviation of the average plate thickness of an elongated metal plate in the longitudinal direction D1 from the target specification value.

Similarly to the case of the above Example 4, $131^{st}$ to $137^{th}$ masks were manufactured by using the elongated metal plates of the $131^{st}$ to the $137^{th}$ winding bodies, except that a through-hole had a circular shape and that a target specification value of a dimension of the through-hole was 20 µm in diameter. Further, similarly to the case of Example 4, dimensions of through-holes in the $131^{st}$ to the $137^{th}$ masks were measured. Similarly to the case of Example 4, FIG. 34(a) also shows a maximum value of a width of the top portion 43a, when such a top portion 43a was observed.

As shown in FIG. 34(a), in the $133^{rd}$ to the $135^{th}$ masks, the deviation in dimension of the through-holes was restrained to 1.5 µm or less, and the width of the top portion was restrained to 2.0 µm or less. In addition, as shown in FIG. 33(a), in the $133^{rd}$ to the $135^{th}$ winding bodies used for manufacturing the $133^{rd}$ to the $135^{th}$ masks, the deviation of the average plate thickness of the elongated metal plate in the longitudinal direction D1 from the target specification value was within a range between −3%-+3%.

On the other hand, as shown in FIG. 34(a), in the $131^{st}$ and the $132^{nd}$ masks, the width of the top portion was over 2.0 µm. In addition, in the $131^{st}$ and the $132^{nd}$ winding bodies used for manufacturing the $131^{st}$ and the $132^{nd}$ masks, the deviation of the average plate thickness of the elongated metal plate in the longitudinal direction D1 from the target specification value was out of the range between −3%-+3%.

As shown in FIG. 34(a), in the $136^{th}$ and the $137^{th}$ masks, the deviation in dimension of through-holes was over 1.5 µm. In addition, in the $136^{th}$ and the $137^{th}$ winding bodies used for manufacturing the $136^{th}$ and the $137^{th}$ masks, the deviation of the average plate thickness of the elongated metal plate in the longitudinal direction D1 from the target specification value was out of the range between −3%-+3%.

From these results, also when an elongated metal plate in which a target specification value of a plate thickness is 13 µm is manufactured by utilizing a plating process, it can be said that, in order that the aforementioned condition (1) effectively functions, the deviation of the average plate thickness of the elongated metal plate in the longitudinal direction D1 from the target specification value needs to be within the range between −3%-+3%.

Example 14

Similarly to the case of the above Example 13, $141^{st}$ to $147^{th}$ winding bodies were prepared, except that a target specification value of a plate thickness of an elongated metal plate was 20 µm. In addition, similarly to the case of the above Example 13, $141^{st}$ to $147^{th}$ masks were manufactured by using the elongated metal plates of the $141^{st}$ to the $147^{th}$ winding bodies, except that a target specification value of a dimension of a through-hole was 30 μm in diameter. Similarly to the case of Example 13, a plate thickness of the elongated metal plates of the $141^{st}$ to the $147^{th}$ winding bodies at the central portion in the width direction was measured along the longitudinal direction at many points. Similarly to the case of Example 13, a dimension of a through-hole and a width of a top portion of the $141^{st}$ to the $147^{th}$ masks were measured. FIG. 33(b) shows an average value A and a deviation B in plate thickness in the longitudinal direction of the elongated metal plates of the $141^{st}$ to the $147^{th}$ winding bodies. FIG. 33(b) also shows a value of $\{(A-20)/20\} \times 100(\%)$ which shows a deviation of the average plate thickness of an elongated metal plate in the longitudinal direction D1 from the target specification value. FIG. 34(b) shows a deviation in dimension of through-holes in the $141^{st}$ to the $147^{th}$ masks, and a maximum dimension of a top portion thereof.

As shown in FIG. 34(b), in the $142^{nd}$ to the $146^{th}$ masks, the deviation in dimension of the through-holes was restrained to 2.0 μm or less, and the width of the top portion was restrained to 2.0 μm or less. In addition, as shown in FIG. 33(b), in the $142^{nd}$ to the $146^{th}$ winding bodies used for manufacturing the $142^{nd}$ to the $146^{th}$ masks, the deviation of the average plate thickness of the elongated metal plate in the longitudinal direction D1 from the target specification value was within a range between −3%-+3%.

On the other hand, as shown in FIG. 34(b), in the $141^{st}$ mask, the width of the top portion was over 2.0 μm. In addition, in the $141^{st}$ winding body used for manufacturing the $141^{st}$ mask, the deviation of the average plate thickness of the elongated metal plate in the longitudinal direction D1 from the target specification value was out of the range between −3%-+3%.

As shown in FIG. 34(b), in the $147^{th}$ mask, the deviation in dimension of through-holes was over 2.0 μm. In addition, in the $147^{th}$ winding body used for manufacturing the $147^{th}$ mask, the deviation of the average plate thickness of the elongated metal plate in the longitudinal direction D1 from the target specification value was out of the range between −3%-+3%.

From these results, also when an elongated metal plate in which a target specification value of a plate thickness is 20 μm is manufactured by utilizing a plating process, it can be said that, in order that the aforementioned condition (1) effectively functions, the deviation of the average plate thickness of the elongated metal plate in the longitudinal direction D1 from the target specification value needs to be within the range between −3%-+3%.

Example 15

Similarly to the case of the above Example 13, $151^{st}$ to $157^{th}$ winding bodies were prepared, except that a target specification value of a plate thickness of an elongated metal plate was 25 μm. In addition, similarly to the case of the above Example 13, $151^{st}$ to $157^{th}$ masks were manufactured by using the elongated metal plates of the $151^{st}$ to the $157^{th}$ winding bodies, except that a target specification value of a dimension of a through-hole was 40 μm in diameter. Similarly to the case of Example 13, a plate thickness of the elongated metal plates of the $151^{st}$ to the $157^{th}$ winding bodies at the central portion in the width direction was measured along the longitudinal direction at many points. Similarly to the case of Example 13, a dimension of a through-hole and a width of a top portion of the $151^{st}$ to the $157^{th}$ masks were measured. FIG. 33(c) shows an average value A and a deviation B in plate thickness in the longitudinal direction of the elongated metal plates of the $151^{st}$ to the $157^{th}$ winding bodies. FIG. 33(c) also shows a value of $\{(A-25)/25\} \times 100(\%)$ which shows a deviation of the average plate thickness of an elongated metal plate in the longitudinal direction D1 from the target specification value. In addition, FIG. 34(c) shows a deviation in dimension of through-holes in the $151^{st}$ to the $157^{th}$ masks, and a maximum dimension of a top portion thereof thereof.

As shown in FIG. 34(c), in the $153^{rd}$ to the $156^{th}$ masks, the deviation in dimension of the through-holes was restrained to 2.0 μm or less, and the width of the top portion was restrained to 2.0 μm or less. In addition, as shown in FIG. 33(c), in the $153^{rd}$ to the $156^{th}$ winding bodies used for manufacturing the $153^{rd}$ to the $156^{th}$ masks, the deviation of the average plate thickness of the elongated metal plate in the longitudinal direction D1 from the target specification value was within a range between −3%-+3%.

On the other hand, as shown in FIG. 34(c), in the $151^{st}$ and the $152^{nd}$ masks, the width of the top portion was over 2.0 μm. In the $151^{st}$ and the $152^{nd}$ winding bodies used for manufacturing the $151^{st}$ and the $152^{nd}$ masks, the deviation of the average plate thickness of the elongated metal plate in the longitudinal direction D1 from the target specification value was out of the range between −3%-+3%.

As shown in FIG. 34(c), in the $157^{th}$ mask, the deviation in dimension of through-holes was over 2.0 μm. In addition, in the $157^{th}$ winding body used for manufacturing the $157^{th}$ mask, the deviation of the average plate thickness of the elongated metal plate in the longitudinal direction D1 from the target specification value was out of the range between −3%-+3%.

From these results, also when an elongated metal plate in which a target specification value of a plate thickness is 25 μm is manufactured by utilizing a plating process, it can be said that, in order that the aforementioned condition (1) effectively functions, the deviation of the average plate thickness of the elongated metal plate in the longitudinal direction D1 from the target specification value needs to be within the range between −3%-+3%.

Example 16

Similarly to the case of the above Example 7, there was conducted a test for confirming that the aforementioned condition (2) is effective, to a metal plate manufactured by a plating process. To be specific, as shown in FIG. 35(a), similarly to the case of Example 10, there were prepared $161^{st}$ to $169^{th}$ winding bodies each having an average plate thickness which deviated from 13 μm as a target specification value by about 3%. The $161^{st}$ to the $169^{th}$ winding bodies were manufactured by a plating process.

Similarly to the case of the above Example 7, a plate thickness of the elongated metal plates of the $161^{st}$ to the $169^{th}$ winding bodies was measured along the width direction at a plurality of points. FIG. 35(a) shows a "deviation C in plate thickness in width direction D2" and a "plate thickness X at central portion in width direction D2".

In addition, similarly to the case of Example 10, deposition masks (referred to as $161^{st}$ to the $169^{th}$ masks herebelow) having a number of circular through-holes formed therein were manufactured by using the elongated metal plates of the $161^{st}$ to the $169^{th}$ winding bodies, such that a target specification value of a through-hole was 20 μm in diameter. At this time, similarly to the case of the above example 7, in order that a deviation in dimension of the through-holes in the deposition mask, which is caused by a deviation in plate thickness of the elongated metal plate in the width direction, could be restrained as much as possible, positions of a plurality of nozzles for injecting etchant, which were arranged along the width direction of the elongated metal plate, were suitably adjusted. In addition, similarly to the case of the above Example 7, dimensions of the through-holes in the $161^{st}$ to the $169^{th}$ masks were measured. FIG. 36(a) shows calculation results of a deviation in dimension of the through-holes in the $161^{st}$ to the $169^{th}$ masks.

As shown in FIG. 35(a), the $161^{st}$, the $162^{nd}$, the $164^{th}$, the 165th, $167^{th}$ and the $168^{th}$ winding bodies satisfied the aforementioned condition (2). Namely, a percentage of a value obtained by dividing the deviation C in plate thickness in the width direction D2 by the plate thickness X at the central portion of the width direction D2 was 3% or less. On the other hand, the $163^{rd}$, the $166^{th}$ and the $169^{th}$ winding bodies did not satisfy the aforementioned condition (2). As shown in FIG. 36(a), in the $161^{st}$, the $162^{nd}$, the $164^{th}$, the $165^{th}$, $167^{th}$ and the $168^{th}$ masks obtained from the elongated metal plates of the $161^{st}$, the $162^{nd}$, the $164^{th}$, the $165^{th}$, $167^{th}$ and the $168^{th}$ winding bodies, the deviation in dimension of the through-holes was restrained to 1.5 µm or less. On the other hand, in the $163^{rd}$, the $166^{th}$ and the $169^{th}$ masks obtained from the $163^{rd}$, the $166^{th}$ and the $169^{th}$ winding bodies, the deviation in dimension of the through-holes was over 1.5 µm.

In this example, by using an elongated metal plate satisfying the aforementioned condition (2), it was possible to manufacture a deposition mask having through-holes whose deviation in dimension of the through-holes in the width direction was within an allowable range. Namely, also when an elongated metal plate in which a target specification value is 13 µm is manufactured by utilizing a plating process, it is considered that the aforementioned condition (2) is an important judging method of selecting an elongated metal plate.

Example 17

Similarly to the case of the above Example 16, $171^{st}$ to $179^{th}$ winding bodies were manufactured, except that a target specification value of a plate thickness of an elongated metal plate was 20 µm. In addition, similarly to the case of the above Example 16, $171^{st}$ to $179^{th}$ masks were manufactured by using the elongated metal plates of the $171^{st}$ to the $179^{th}$ winding bodies were manufactured, except that a target specification value of a dimension of a through-hole was 30 µm in diameter. Similarly to the case of Example 16, a plate thickness of the elongated metal plates of the $171^{st}$ to the $179^{th}$ winding bodies was measured along the width direction at many points. In addition, similarly to the case of Example 16, dimension of through-holes in the $171^{st}$ to the $179^{th}$ masks were measured. FIG. 35(b) shows a variation C in plate thickness in the width direction of the elongated metal plates of the $171^{st}$ to the $179^{th}$ winding bodies and a plate thickness X at the central portion in the width direction thereof, in addition to an average value A and a deviation B in plate thickness in the longitudinal direction. FIG. 36(b) shows a deviation in dimension of the through-holes in the $171^{st}$ to the $179^{th}$ masks.

As shown in FIG. 35(b), the $171^{st}$, the $172^{nd}$, the $174^{th}$, the $175^{th}$, $177^{th}$ and the $178^{th}$ winding bodies satisfied the aforementioned condition (2). On the other hand, the $173^{rd}$, $176^{th}$ and $179^{th}$ winding bodies did not satisfy the aforementioned condition (2). As shown in FIG. 36(b), in the $171^{st}$, the $172^{nd}$, the $174^{th}$, the $175^{th}$, $177^{th}$ and the $178^{th}$ masks obtained from the elongated metal plates of the $171^{st}$, the $172^{nd}$, the $174^{th}$, the $175^{th}$, $177^{th}$ and the $178^{th}$ winding bodies, the deviation in dimension of the through-holes was restrained to 2.0 µm or less. On the other hand, in the $173^{rd}$, $176^{th}$ and $179^{th}$ masks obtained from the elongated metal plates of the $173^{rd}$, $176^{th}$ and $179^{th}$ winding bodies, the deviation in dimension of the through-holes was over 2.0 µm. Namely, also when an elongated metal plate in which a target specification value of a plate thickness is 20 µm, it can be said that the aforementioned condition (2) is an important judging method for selecting an elongated metal plate.

Example 18

Similarly to the case of the above Example 16, $181^{st}$ to $189^{th}$ winding bodies were manufactured, except that a target specification value of a plate thickness of an elongated metal plate was 25 µm. In addition, similarly to the case of the above Example 16, $181^{st}$ to $189^{th}$ masks were manufactured by using the elongated metal plates of the $181^{st}$ to $189^{th}$ winding bodies, except that a target specification value of a dimension of a through-hole was 40 µm in diameter. Similarly to the case of Example 16, a plate thickness of the elongated metal plates of the $181^{st}$ to $189^{th}$ winding bodies was measured along the width direction at many points. In addition, similarly to the case of Example 7, dimensions of through-holes in the $181^{st}$ to $189^{th}$ masks were measured. FIG. 35(c) shows a variation C in plate thickness in width direction of the elongated metal plates of the $181^{st}$ to $189^{th}$ winding bodies and a plate thickness X at the central portion in the width direction thereof, in addition to an average value A and a variation B in plate thickness in the longitudinal direction.

As shown in FIG. 35(c), the $181^{st}$, the $182^{nd}$, the $184^{th}$, the $185^{th}$, the $187^{th}$ and the $188^{th}$ winding bodies satisfied the aforementioned condition (2). On the other hand, the $183^{rd}$, the $186^{th}$ and the $189^{th}$ winding bodies did not satisfy the aforementioned condition (2). As shown in FIG. 36(c), in the $181^{st}$, the $182^{nd}$, the $184^{th}$, the $185^{th}$, the $187^{th}$ and the $188^{th}$ masks obtained from elongated metal plates of the $181^{st}$, the $182^{nd}$, the 184th, the $185^{th}$, the $187^{th}$ and the $188^{th}$, the deviation in dimension of the through-holes was restrained to 2.0 µm or less. On the other hand, in the $183^{rd}$, the $186^{th}$ and the $189^{th}$ mask obtained from the elongated metal plates of the $183^{rd}$, the 186th and the $189^{th}$ winding bodies, the deviation in dimension of the through-holes was over 2.0 µm. Namely, also when an elongated metal plate in which a target specification value of a plate thickness is 25 µm, it can be said that the aforementioned condition (2) is an important judging method for selecting an elongated metal plate.

REFERENCE SIGNS LIST

20 Deposition mask
21 Metal plate
21a First surface of metal plate
21b Second surface of metal plate
22 Effective area
23 Peripheral area
25 Through-hole
30 First recess
31 Wall surface
32 Distal edge of wall surface
35 Second recess
36 Wall surface
43a Top portion
55 Base metal 56 Rolling apparatus
57 Annealing apparatus
61 Core
62 Winding body
64 Elongated metal plate
65a, 65b Resist pattern
65c, 65d Resist film

The invention claimed is:

1. A method of inspecting an elongated metal plate used for manufacturing a deposition mask having a plurality of through-holes formed in the metal plate, the method comprising:
    a first inspection step of measuring a plate thickness of the metal plate along the longitudinal direction of the metal plate at plural points;
    a second inspection step of measuring the plate thickness of the metal plate along the width direction of the metal plate at plural points; and
    a selection step of selecting the metal plate which satisfies conditions (1) and (2) below
        (1) when an average value of the plate thicknesses of the metal plate in the longitudinal direction is represented as A, and a value obtained by multiplying a standard deviation of the plate thicknesses of the metal plate in the longitudinal direction by 3 is represented as B, (B/A)×100(%) is 5% or less, and
        (2) when a value obtained by multiplying a standard deviation of the plate thicknesses of the metal plate in the width direction by 3 is represented as C, and a value of the plate thickness of the metal plate in a central portion in the width direction, which is obtained when the plate thickness of the metal plate is measured along the width direction in order to calculate the standard deviation of the plate thicknesses of the metal plates in the width direction is represented as X, (C/X)×100(%) is 3% or less.

2. The method of inspecting the metal plate according to claim 1, wherein the first inspection step is performed during a rolling step of rolling a base metal to obtain the metal plate.

3. The method of inspecting the metal plate according to claim 1, wherein the first inspection step is performed during a rolling step of rolling a base metal to obtain the metal plate.

4. The method of inspecting the metal plate according to claim 1, wherein in the first inspection step, an interval between the measurement points of the metal plate in the longitudinal direction is within a range of 50-500 µm.

5. The method of inspecting the metal plate according to claim 1, wherein the standard deviation of the plate thicknesses in the width direction of the metal plate is calculated based on the plate thicknesses of the metal plate,
    wherein the plate thicknesses is measured at intersections between m imaginary lines (m is a natural number of 2 or more) extending on the metal plate in the longitudinal direction and n imaginary line(s) (n is a natural number of 1 or more) extending on the elongated metal plate in the width direction, and
    wherein m>n.

* * * * *